(12) United States Patent
Shimizu et al.

(10) Patent No.: US 6,555,868 B2
(45) Date of Patent: Apr. 29, 2003

(54) SEMICONDUCTOR DEVICE AND METHOD OF MANUFACTURING THE SAME

(75) Inventors: Satoshi Shimizu, Hyogo (JP); Takahiro Onakado, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/761,178

(22) Filed: Jan. 18, 2001

(65) Prior Publication Data
US 2002/0009846 A1 Jan. 24, 2002

(30) Foreign Application Priority Data
Jul. 12, 2000 (JP) ............................ 2000-211288

(51) Int. Cl.⁷ ........................................ H01L 29/788
(52) U.S. Cl. ...................................... 257/315; 438/275
(58) Field of Search .............................. 257/315, 316, 257/321, 326; 438/587, 593, 595, 257

(56) References Cited

U.S. PATENT DOCUMENTS 5,661,057 A * 8/1997 Fujiwara ..................... 438/257
6,204,126 B1 * 3/2001 Hsieh et al. ................ 438/267
6,265,292 B1 * 7/2001 Parat et al. ................. 438/524

FOREIGN PATENT DOCUMENTS

| JP | 8-153860 | 6/1996 |
|----|----------|--------|
| JP | 9-82924  | 3/1997 |

* cited by examiner

Primary Examiner—David Nelms
Assistant Examiner—Quoc Hoang
(74) Attorney, Agent, or Firm—McDermott, Will & Emery

(57) ABSTRACT

A major object is to provide an improved semiconductor device capable of preventing occurrence of a crystal defect in a substrate.

A source region is arranged at a surface of a semiconductor substrate and between first and second layered gates. A sidewall spacer is arranged on sidewalls, neighboring to a drain region, of the first and second layered gates. A sidewall spacer is not arranged on sidewalls, neighboring to a source region, of the first and second layered gates.

8 Claims, 47 Drawing Sheets

SEMICONDUCTOR DEVICE AND METHOD OF MANUFACTURING THE SAME

BACKGROUND OF THE INVENTION

1. Field of the Invention

The present invention generally relates to a semiconductor device, and particularly relates to a semiconductor device which is improved for increasing performance and reliability. The invention also relates to a method of manufacturing such a semiconductor device.

2. Description of the Background Art

In recent years, a flash memory which is a kind of nonvolatile semiconductor memory device has been expected as a useful memory device for the next generation because it can be manufactured at a lower cost than a Dynamic Random Access Memory (DRAM), and therefore.

FIG. 59 is a cross section of a memory cell portion of a flash memory in the prior art.

The structure in FIG. 59 is provided at a surface of a semiconductor substrate 1 with a source region 2 connected to a source line and a drain region 3 connected to a corresponding bit line. A floating gate electrode 5 is arranged on semiconductor substrate 1 with a tunnel oxide film 4 therebetween. A control gate electrode 7 which is connected to a corresponding word line is arranged on floating gate electrode 5, and a control gate and floating gate interlayer insulating film 6, which is generally formed of an oxide film, a nitride film and an oxide film (ONO film), is interposed between control gate electrode 7 and floating gate electrode 5.

An FN (Fowler-Nordheim) current phenomenon, a Channel Hot Electron (CHE) phenomenon or the like is caused in tunnel oxide film 4, which is located immediately under floating gate electrode 5, for injecting electrons into floating gate electrode 5 or removing electrons therefrom so that erasing or writing is performed. Depending on the state of electrons in floating gate electrode 5, the binary state of the threshold is determined, and the "0" or "1" is read out depending on this state.

In the nonvolatile semiconductor memories of the floating gate type such as a flash memory described above and an EEPROM, NOR-type array structures are used most generally. In the NOR-type array, contacts are formed in a drain diffusion layer of memory cells in each row, and bit lines formed of metal interconnections or polycide interconnections are arranged in the row direction. Thus, the NOR-type array structure has the gate interconnections of the memory cells in the respective columns and the bit line are, which are arranged in a matrix form.

FIG. 60 is a circuit diagram showing the NOR-type array. FIG. 61 shows a layout of the NOR-type array.

FIG. 62 is a cross section taken along line A—A in FIG. 61. FIGS. 62 and 63 are cross sections taken along lines B—B and C—C in FIG. 61, respectively. In these figures, "8" indicates a bit line contact, "9" indicates an active region, "10" indicates an isolating oxide film, and "11" indicates an oxide film.

Referring to these figures, all source regions 2 of memory cells in each block, which is formed of memory cells of, e.g., 512 Kbits, are connected. For connecting all source regions 2 in this manner, a self-align source structure may be used very effectively for miniaturizing the memory cells.

For connection of source region 2 of each memory cell, the self-align source structure does not employ such a manner that a contact is extended to a diffusion layer of each memory cell, and the contacts thus formed are connected by metal interconnections. In the self-align source structure, as shown in FIG. 65, control gate electrodes 7 of the memory cells are first formed, and resists 12 having openings which expose only source regions 2 are formed. Ends of resists are located on control gate electrodes 7. Referring to FIGS. 65 and 64, etching is effected on a structure masked with resists 12 and control gate electrodes 7 so that an isolating oxide film which is present in source regions 2 is removed. Further, ion implantation of arsenic or the like is effected on source regions 2. Thereby, source regions 2 are connected together in the column direction by the diffusion layer. These are formed in a self-aligned fashion. In FIG. 64, dotted lines represent portions of the isolating oxide film which are removed by the etching.

All the source regions of the memory cells may be formed of the active regions, and may be connected by metal interconnections. This structure requires an alignment margin so that a gate distance in the source region must be large. In the self-align source technique, however, all the source regions of the memory cells are formed of the active regions, and are connected by the diffusion layers so that the distance between the gates located on the opposite sides of the source region in the memory cell can be determined in accordance with the minimum design rule. Thus, the miniaturization of the memory cells can be achieved.

In accordance with remarkable reduction in design rule in recent years, however, it is required in the flash memory employing the self-align source structure to reduce further the distance between the gates on the opposite sides of the source region of the memory cell, which can be formed in accordance with the minimum design rules.

For performing the write and erase operations in the flash memory, an FN tunnel current or a CHE tunnel current must be produced on the control gate electrode, source/drain and substrate. For this, a high voltage of 10 V or more is required. For handling such a high voltage, a peripheral transistor must have a higher breakdown voltage than a peripheral transistor used in a DRAM or an SRAM.

A high breakdown voltage of the transistor can be effectively achieved by optimizing a source/drain structure and employing a thick sidewall spacer.

Referring to FIG. 66, if a thick sidewall is used in a flash memory device having a miniaturized structure for achieving a peripheral circuit having a high breakdown voltage, the sidewall spacer fills a narrow space located on source region 2 and formed between neighboring gates in the memory cell. In this case, a stress is caused and applied to the substrate due to expansion and contraction of the sidewall insulating film filling the narrow space on source region 2 during later processing of oxidation and high-temperature annealing. As a result, crystal defects 13 occur in substrate 1. Consequently, leakage occurs between the source and drain of the memory cell, resulting in remarkable reduction in device performance. If crystal defects 13 extend to a position under tunnel oxide film 4, reliability such as endurance and retention remarkably lower.

FIG. 67 shows a flow from formation of the layered gate to formation of the sidewall spacer in a first prior art.

Referring to FIG. 68, first and second layered gates 20a and 20b are formed. Referring to FIG. 69, a resist pattern 28 having an opening exposing only the source portion of the cell is formed by photolithography. Using resist pattern 28 as a mask, etching is effected to remove the isolating oxide film, and ion implantation is performed for providing the diffusion layer interconnection in the etched portion. Thereby, the self-align sources is completed. Referring to FIG. 70, resist pattern 28 is removed. Referring to FIG. 71, an insulating film 14 for forming a sidewall spacer, which will be referred to as a "sidewall insulating film" hereinafter, is deposited. Referring to FIG. 72, sidewalls of floating gates 5 and control gates 7 are oxidized for the purpose of rounding the ends on both the source and drain sides of floating gates 5. Referring to FIG. 73, etch-back is effected on sidewall insulating film 14.

In the prior art shown in FIG. 72, sidewall insulating film 14, which is located on source region 2 and between the gates, expands and contracts to apply a stress to the substrate portion located under source region 2 when thermal processing for a high-temperature oxidization of the sidewall is performed in an oxygen atmosphere at 800–900° C. This stress causes crystal defects 13 shown in FIG. 66.

FIG. 74 is a flow showing a second prior art.

Referring to FIG. 75, processing is performed to form first and second layered gates 20a and 20b, and the self-align source step (photolithography +etching+ion implantation+ resist removal) is completed. Thereafter, oxidization is effected on sidewalls of floating gates 5 and control gates 7. Referring to FIG. 76, the sidewall insulating film is deposited, and is etched back.

According to this prior art, the crystal defect shown in FIG. 66 does not occur. As shown in FIG. 75, however, polycrystalline silicon of layered gates 20a and 20b are exposed when the sidewalls thereof are oxidized. Therefore, the polycrystalline silicon of layered gates 20a and 20b are oxidized to a larger extent than the first prior art so that the substantial gate length increases. Thereby, punch-through occurs in the memory cell. Further, the sidewalls of the floating gate and control gate are oxidized to extents which vary depending on differences in concentration of the polycrystalline silicon so that the coupling ratio of the memory cells lowers. This results in deterioration of write and erase speeds.

The foregoing problem relating to the crystal defect occurs not only in the manufacturing of flash memories but also in the manufacturing of ordinary MOS transistors. Referring to FIG. 77, a space between gates 15 and 16 is fully filled with a sidewall insulating film (CVD-SiO$_2$ (TEOS)) 17. In this structure, sidewall insulating film 17 expands and contracts during later thermal processing so that a stress is applied to substrate 1 and crystal defects 13 occur.

The invention has been made for overcoming the above problems, and it is an object of the invention to provide an improved semiconductor device, in which crystal defects do not occur, and reliability is increased.

Another object of the invention is to provide an improved flash memory having increased reliability.

Still another object of the invention is to provide an improved MOS transistor having increased reliability.

Yet another object of the invention is to provide a method of manufacturing such a semiconductor device.

SUMMARY OF THE INVENTION

A semiconductor device according to a first aspect of the invention includes first and second gates formed on a substrate and spaced from each other. A sidewall spacer having a configuration determined to prevent application of a stress to the substrate is arranged on sidewalls of the first and second gates.

The semiconductor device according to a second aspect of the invention includes first and second layered gates arranged on a semiconductor substrate, spaced from each other and each having a floating gate and a control gate layered together. A source region located between the first and second layered gates is arranged at a surface of the semiconductor substrate. A first drain region is formed at the surface of the semiconductor substrate, and is located in a position remote from the source region with the first layered gate therebetween. A second drain region is arranged at the surface of the semiconductor substrate, and is located in a position remote from the source region with the second layered gate therebetween. A sidewall spacer is arranged on sidewalls of the first and second layered gates neighboring to the drain region. No sidewall spacer is arranged on sidewalls of the first and second layered gates neighboring to the source region.

The semiconductor device according to a third aspect of the invention includes first and second layered gates arranged on a semiconductor substrate, spaced from each other and each having a floating gate and a control gate layered together. A source region located between the first and second layered gates is arranged at a surface of the semiconductor substrate. A first drain region is formed at the surface of the semiconductor substrate, and is located in a position remote from the source region with the first layered gate therebetween. A second drain region is arranged at the surface of the semiconductor substrate, and is located in a position remote from the source region with the second layered gate therebetween. A first sidewall spacer is arranged on the opposite sidewalls of the first layered gate. A second sidewall spacer is arranged on the opposite sidewalls of the second layered gate. A thermal oxide film is present immediately under the first and second sidewall spacers and at the surface of the source region and the surfaces of the first and second drain regions.

The semiconductor device according to a fourth aspect of the invention includes first, second and third gate electrodes successively aligned and formed parallel to each other on the semiconductor substrate. A distance between the first and second gate electrodes is smaller than a distance between the second and third gate electrodes. A sidewall spacer is arranged on a sidewall of the second gate electrode neighboring to the third gate electrode. The distance between the first and second gate electrodes is smaller than double the thickness of the sidewall spacer.

In the semiconductor device according to a fifth aspect of the invention, the sidewall spacer is formed of a nitride film, and contact holes connected to the first and second drain regions, respectively, are formed in a self-aligned fashion.

In the semiconductor device according to a sixth aspect of the invention, the sidewall spacer made of the nitride film is formed on a sidewall of each of the first and second gate electrodes with a buffer layer therebetween. The sidewall spacer made of the nitride film is arranged on the semiconductor substrate with a buffer layer therebetween.

The semiconductor device according to a seventh aspect of the invention includes a peripheral circuit portion having a gate electrode, and a cell portion. The cell portion has first and second layered gates spaced from each other, and each formed of a floating gate and a control gate layered together. A sidewall spacer is arranged on a sidewall of the gate electrode. A distance between the first and second layered gates is smaller than double the width of the sidewall spacer. No sidewall spacer is formed on sidewalls of the first and second layered gates.

The semiconductor device according to an eighth aspect of the invention includes a peripheral circuit portion having a gate electrode, and a cell portion. The cell portion has first and second layered gates spaced from each other, and each formed of a floating gate and a control gate layered together. A first sidewall spacer is arranged on a sidewall of the gate electrode. A distance between the first and second layered gates is smaller than double the width of the first sidewall spacer. A second sidewall spacer having a thickness smaller than half the distance between the first and second layered gates is formed on sidewalls of the first and second layered gates.

In a method of manufacturing a semiconductor device according to a ninth aspect of the invention, first and second gates spaced from each other are formed on a substrate. A sidewall spacer having a configuration determined to prevent application of a stress to the substrate is formed on sidewalls of the first and second gates.

In the method of manufacturing a semiconductor device according to a tenth aspect of the invention, first and second layered gates spaced from each other with a common source region therebetween and each having a floating gate and a control gate layered together are formed on the semiconductor substrate. A sidewall spacer formation insulating film covering the first and second layered gates is formed on the semiconductor substrate. Etch-back is effected on the sidewall formation insulating film to form a sidewall spacer on sidewalls of the first and second layered gates neighboring to the drain region. The sidewall spacer formation insulating film and an isolating oxide film located between the first and second layered gates and neighboring to the source are simultaneously removed by etching in a self-aligned manner. Sidewalls of the floating gate and the control gate are oxidized.

In the method of manufacturing a semiconductor device according to an eleventh aspect of the invention, first and second layered gates spaced from each other with a common source region therebetween and each formed of a floating gate and a control gate layered together are formed on a semiconductor substrate. Sidewalls of the floating gate and the control gate are oxidized. A sidewall spacer formation insulating film covering the first and second layered gates is formed on the semiconductor substrate. Etch-back is effected on the sidewall spacer formation insulating film to form a sidewall spacer on sidewalls, neighboring to the drain, of the first and second layered gates. The sidewall spacer formation insulating film and an isolating oxide film located between the first and second layered gates and neighboring to the source are simultaneously removed by etching in a self-aligned manner.

In the method of manufacturing a semiconductor device according to a twelfth aspect of the invention, first and second layered gates spaced from each other with a common source region therebetween and each formed of a floating gate and a control gate layered together are formed on a semiconductor substrate. A sidewall spacer formation insulating film covering the first and second layered gates is formed on the semiconductor substrate. Etch-back is effected on the sidewall spacer formation insulating film to form a sidewall spacer on sidewalls, neighboring to the source region and the drain region, of the first and second layered gates. Sidewalls of the floating gate and the control gate are oxidized, and at the same time a thermal oxide film is formed on surfaces of the source region and the drain region.

In the method of manufacturing a semiconductor device according to a thirteenth aspect of the invention, first, second and third gate electrodes successively aligned are formed parallel to each other on the semiconductor substrate. A sidewall spacer formation insulating film covering the first, second and third gate electrodes is formed on the semiconductor substrate. A resist pattern exposing a portion located between the first and second gate electrodes and covering the other portion is formed on the semiconductor substrate. Using the resist pattern as a mask, etch-back is effected on the sidewall spacer formation insulating film to form a first sidewall spacer on the sidewalls opposed to each other of the first and second gate electrodes. The resist pattern is removed. Etch-back is effected on the remaining sidewall spacer formation insulating film to form a second sidewall spacer on the sidewalls remote from each other of the first and second gate electrodes. A distance between the first and second gate electrodes is smaller than double the thickness of the second sidewall spacer.

In the method of manufacturing a semiconductor device according to a fourteenth aspect of the invention, first and second layered gates spaced from each other with a common source region therebetween and each formed of a floating gate and a control gate layered together are formed on a semiconductor substrate. A nitride film covering the first and second layered gates is formed on the semiconductor substrate. Etch-back is effected on the nitride film to form a sidewall spacer made of the nitride film on sidewalls remote from each other of the first and second gate electrodes. A resist pattern exposing a portion located between the first and second layered gates and covering the other portion is formed on the semiconductor substrate. Using the resist pattern as a mask, the nitride film and an isolating oxide film located between the first and second layered gates and neighboring to the source are removed by etching. Sidewalls of the floating gate and the control gate are oxidized.

In the method of manufacturing a semiconductor device according to a fifteenth aspect of the invention, first and second layered gates spaced from each other with a common source region therebetween and each formed of a floating gate and a control gate layered together are formed on a semiconductor substrate. Sidewalls of the floating gate and the control gate are oxidized. A nitride film covering the first and second layered gates is formed on the semiconductor substrate. Etch-back is effected on the nitride film to form sidewall spacers made of the nitride film on sidewalls remote from each other of the first and second gate electrodes. A resist pattern exposing a portion located between the first and second layered gates and covering the other portion is formed on the semiconductor substrate. Using the resist pattern as a mask, the nitride film and an isolating oxide film located between the first and second layered gates and neighboring to the source are removed by etching.

In the method of manufacturing a semiconductor device according to a sixteenth aspect of the invention, first and second layered gates spaced from each other with a common source region therebetween and each formed of a floating gate and a control gate layered together are formed on a semiconductor substrate. A plasma oxide film or a CVD film covering the first and second layered gates is formed. A nitride film covering the first and second layered gates is formed on the semiconductor substrate. Etch-back is effected on the nitride film to form sidewall spacers made of the nitride film on sidewalls remote from each other of the first and second gate electrodes. A resist pattern exposing a portion located between the first and second layered gates and covering the other portion is formed on the semiconductor substrate. Using the resist pattern as a mask, the nitride film and an isolating oxide film located between the first and second layered gates and neighboring to the source are removed by etching. Sidewalls of the floating gate and the control gate are oxidized.

In the method of manufacturing a semiconductor device according to a seventeenth aspect of the invention, first and second layered gates spaced from each other with a common source region therebetween and each formed of a floating gate and a control gate layered together are formed on a semiconductor substrate. Sidewalls of the floating gate and the control gate are oxidized. A plasma oxide film or a CVD film covering the first and second layered gates is formed. A nitride film covering the first and second layered gates is formed on the semiconductor substrate. Etch-back is effected on the nitride film to form sidewall spacers made of the nitride film on sidewalls remote from each other of the first and second gate electrodes. A resist pattern exposing a portion located between the first and second layered gates and covering the other portion is formed on the semiconductor substrate. Using the resist pattern as a mask, the nitride film and an isolating oxide film located between the first and second layered gates and neighboring to the source are removed by etching.

In the method of manufacturing a semiconductor device according to an eighteenth aspect of the invention, a gate is formed in a peripheral circuit portion on the semiconductor substrate. A sidewall spacer is formed on a sidewall of the gate. First and second layered gates spaced from each other with a common source region therebetween and each formed of a floating gate and a control gate layered together are formed in a cell portion on the semiconductor substrate.

In the method according to a nineteenth aspect of the invention, a second sidewall spacer having a thickness smaller than that of the sidewall spacer and equal to ½ or less of the distance between the first and second layered gates are formed on the opposite sidewalls of the first layered gate and the opposite sidewalls of the second layered gate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described below.

First Embodiment

Figure 1:
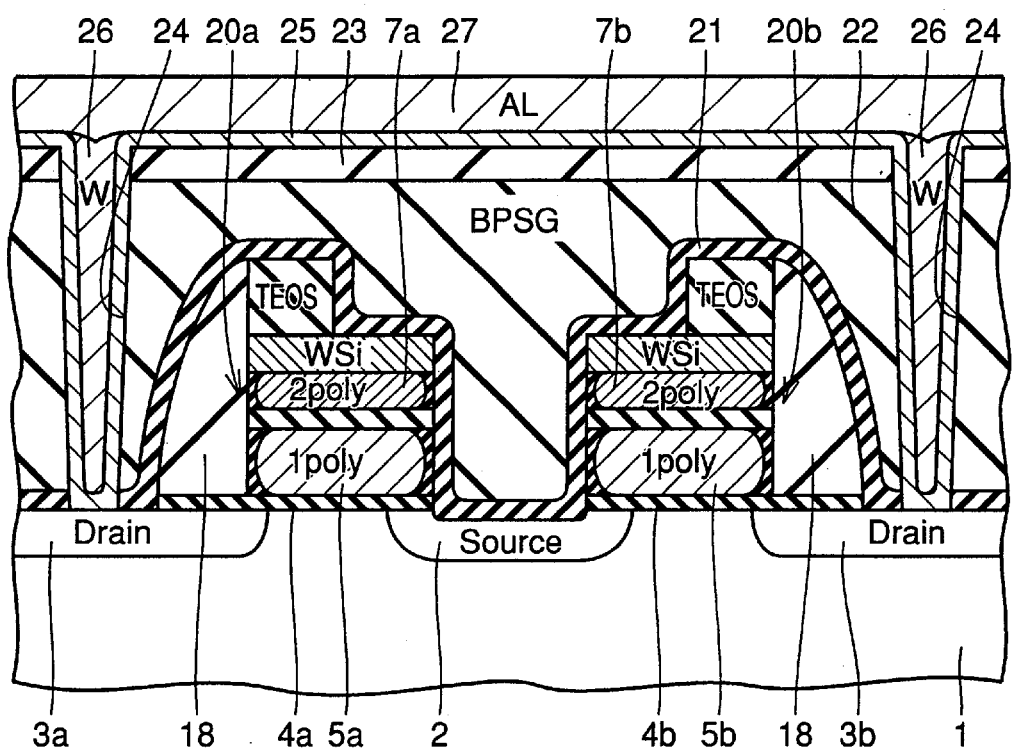
FIG. 1 is a cross section of a flash memory according to a first embodiment.

First and second layered gates 20a and 20b, which are formed of floating gate electrodes 5a and 5b as well as control gates 7a and 7b, are formed on a semiconductor substrate 1 with tunnel oxide films 4a and 4b therebetween, respectively, of the flash memory shown in FIG. 1. A WSi layer and a TEOS layer are arranged on each of first and second layered gates 20a and 20b. A source region 2 is formed at the surface of semiconductor substrate 1, and is located between first and second layered gates 20a and 20b.

A first drain region 3a is arranged at the surface of semiconductor substrate 1, and is located in a position remote from source region 2 with first layered gate 20a therebetween. A second drain region 3b is arranged at the surface of semiconductor substrate 1, and is located in a position remote from source region 2 with second layered gate 20b therebetween. Sidewall spacers 18 are arranged on sidewalls of first and second layered gates 20a and 20b neighboring to drain regions 3a and 3b, respectively. The sidewall spacer is not arranged on the sidewalls of first and second layered gates 20a and 20b neighboring to source region 2.

A CVD oxide film (CVD.SiO$_2$(TEOS)) 21 covering first and second layered gates 20a and 20b are arranged on semiconductor substrate 1. An interlayer insulating film 22 made of BPSG (Boron PhosphoSilicate Glass) and covering first and second layered gates 20a and 20b is arranged on semiconductor substrate 1. A CVD oxide film 23 is arranged over interlayer insulating film 22. Contact holes 24 each reaching first or second drain region 3a or 3b are formed in CVD oxide film (CVD.SIO$_2$(TEOS)) 23 and interlayer insulating film 22.

A TiN film 25 is formed in contact with the inner surfaces of contact holes 24 as well as first and second drain regions 3a and 3b. Each contact hole 24 is filled with a tungsten plug 26. An aluminum interconnection 27 connected to tungsten plugs 26 is arranged above semiconductor substrate 1.

In the NOR-type flash memory of the first embodiment described above, since the sidewall spacer is not arranged on the sidewalls of first and second layered gates 20a and 20b neighboring to source region 2, a stress is not applied to the semiconductor substrate even in an oxidizing step and a high-temperature thermal processing step so that a crystal defect does not occur in semiconductor substrate 1. This improves performance and reliability of the flash memory.

Description will now be given on a method of manufacturing the flash memory shown in FIG. 1.

Figure 2:
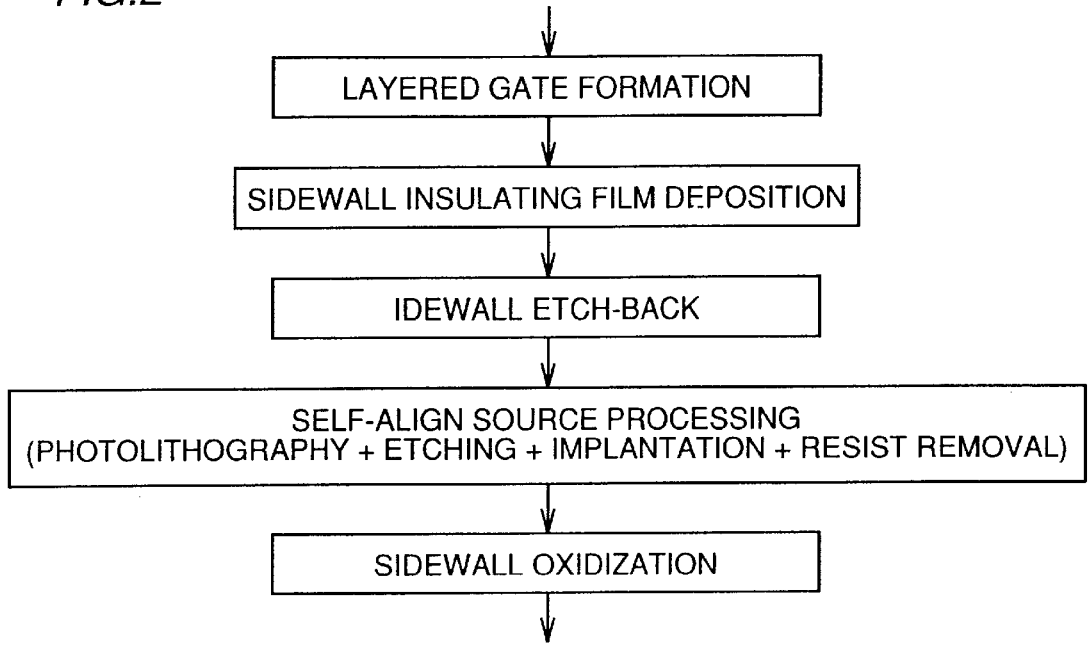
FIG. 2 shows a process flow for manufacturing the flash memory according to the first embodiment.

FIG. 2 shows a process flow in the method of manufacturing the flash memory shown in FIG. 1.

Figure 68:
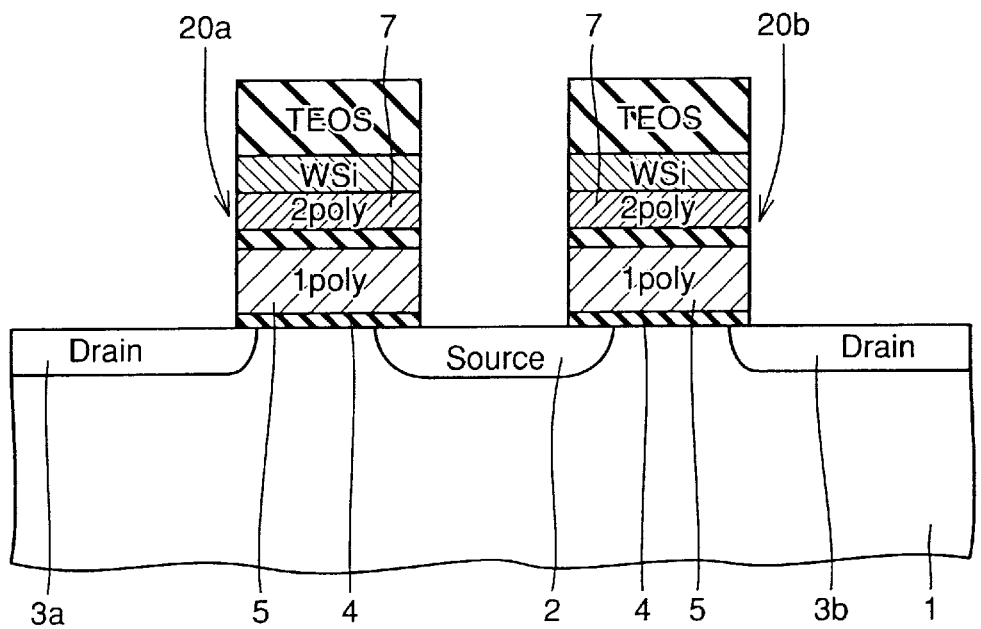
FIGS. 68–73 are cross sections of a semiconductor device in 1st to 6th steps in the method of manufacturing the NOR-type flash memory in the prior art, respectively.
Figure 69:
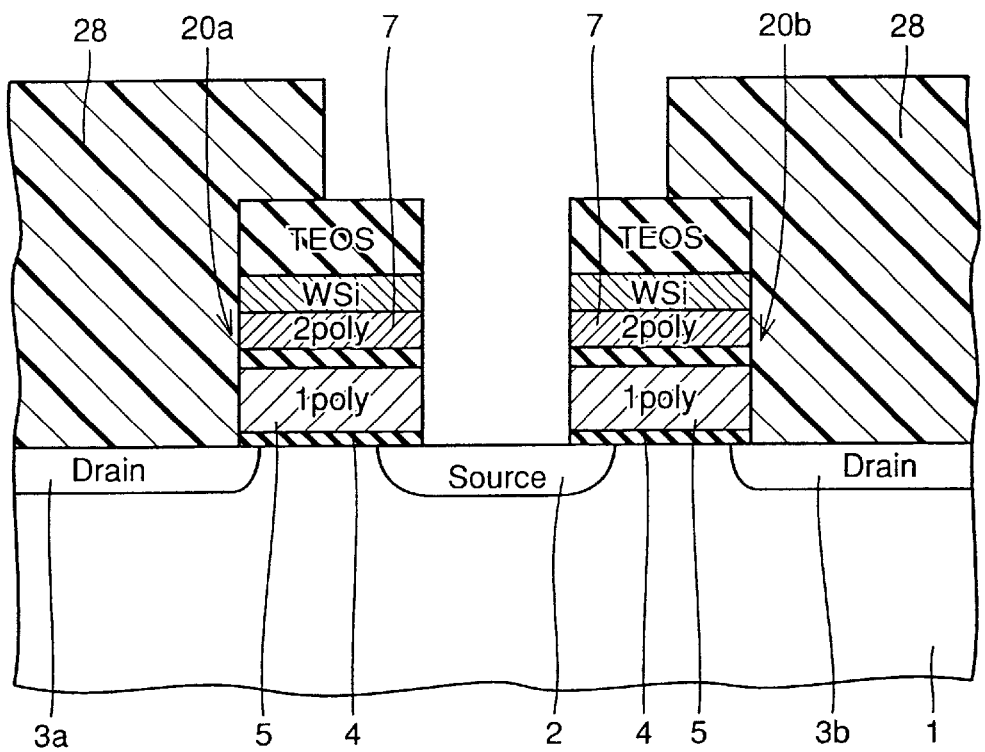
Figure 70:
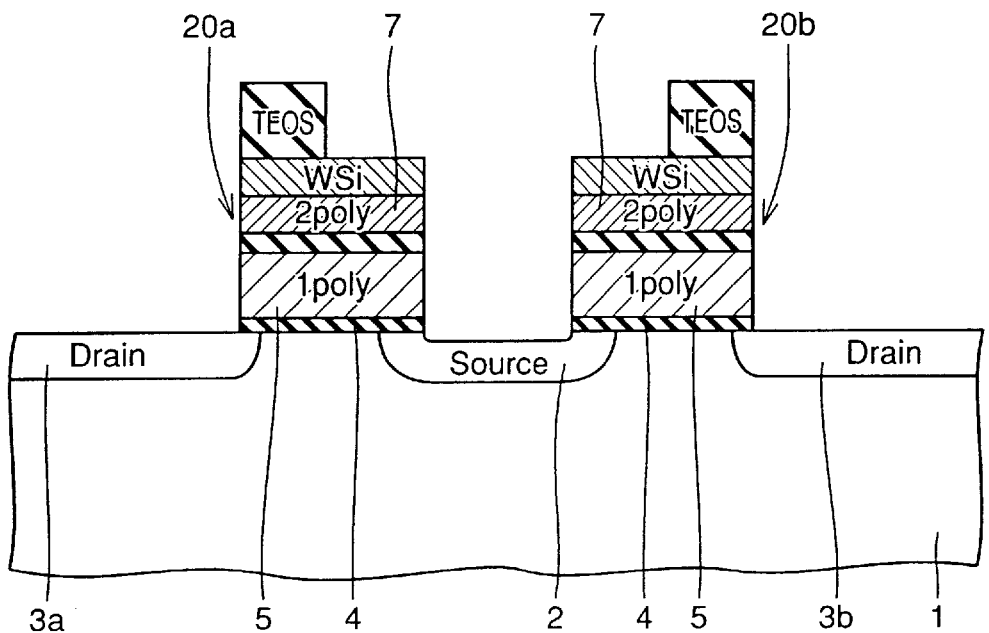

First, steps similar to the conventional steps for forming the structure in FIG. 68 are performed to form first and second layered gates 20a and 20b.

Figure 3:
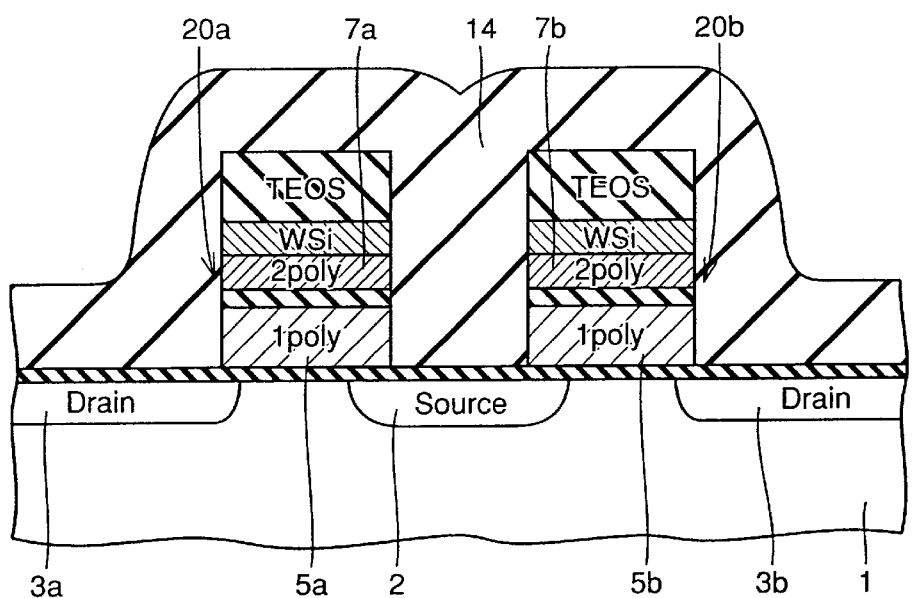
FIGS. 3–7 are cross sections of a semiconductor device in 1st to 5th steps in the method of manufacturing the flash memory according to the first embodiment, respectively.

Referring to FIG. 3, a sidewall insulating film (CVD-SiO$_2$) 14 covering first and second layered gates 20a and 20b is deposited on semiconductor substrate 1.

Figure 4:
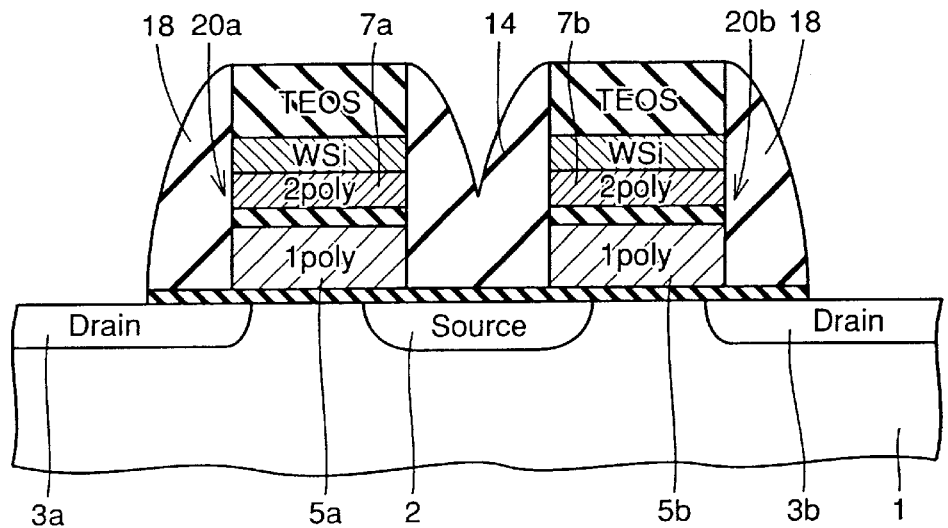

Referring to FIG. 4, etch-back is effected on sidewall insulating film 14 to form sidewall spacers 18 on sidewalls, which neighbor to drain regions 3a and 3b, respectively, of first and second layered gates 20a and 20b.

Figure 5:
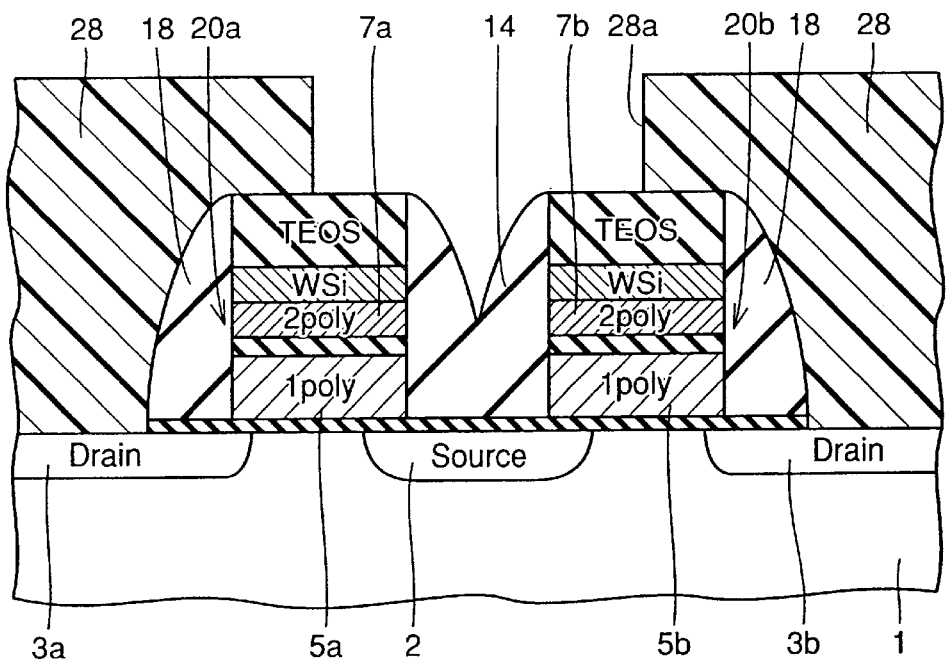
Figure 6:
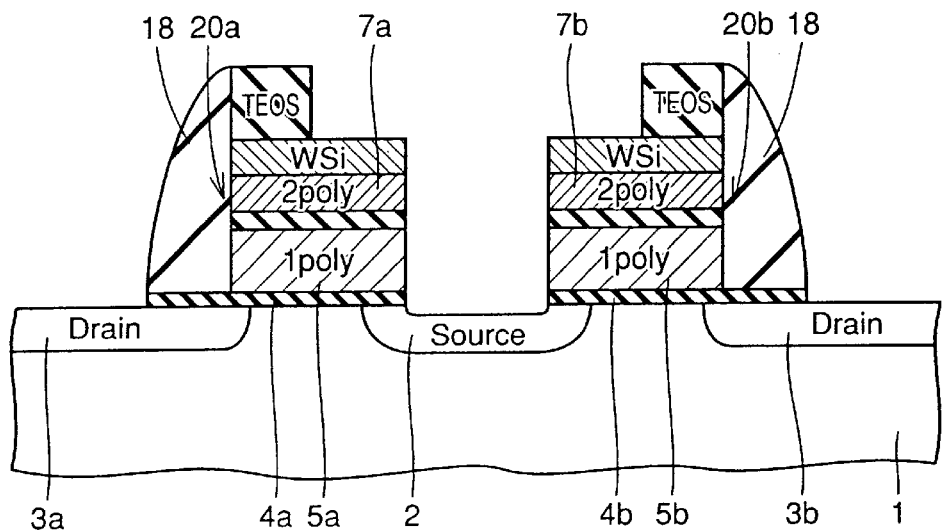
Figure 64:
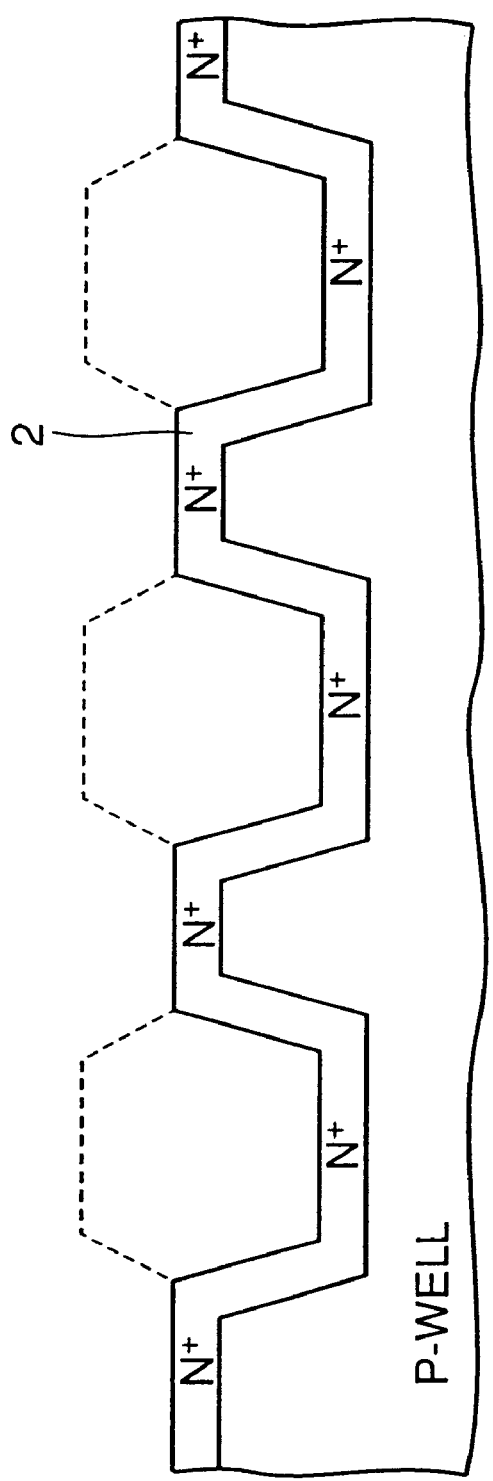
Figure 65:
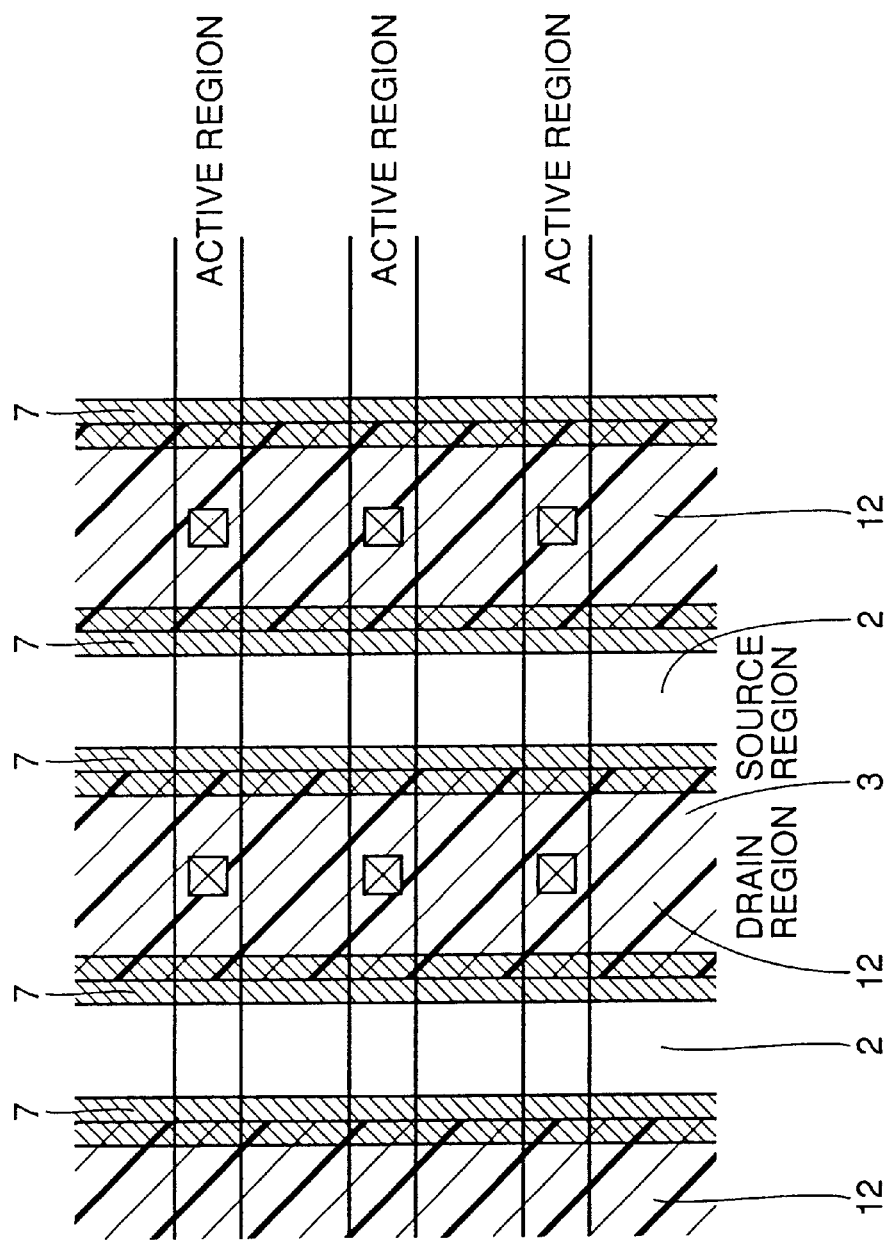
FIG. 65 shows a concept of a method of forming a self-align source.
Figure 66:
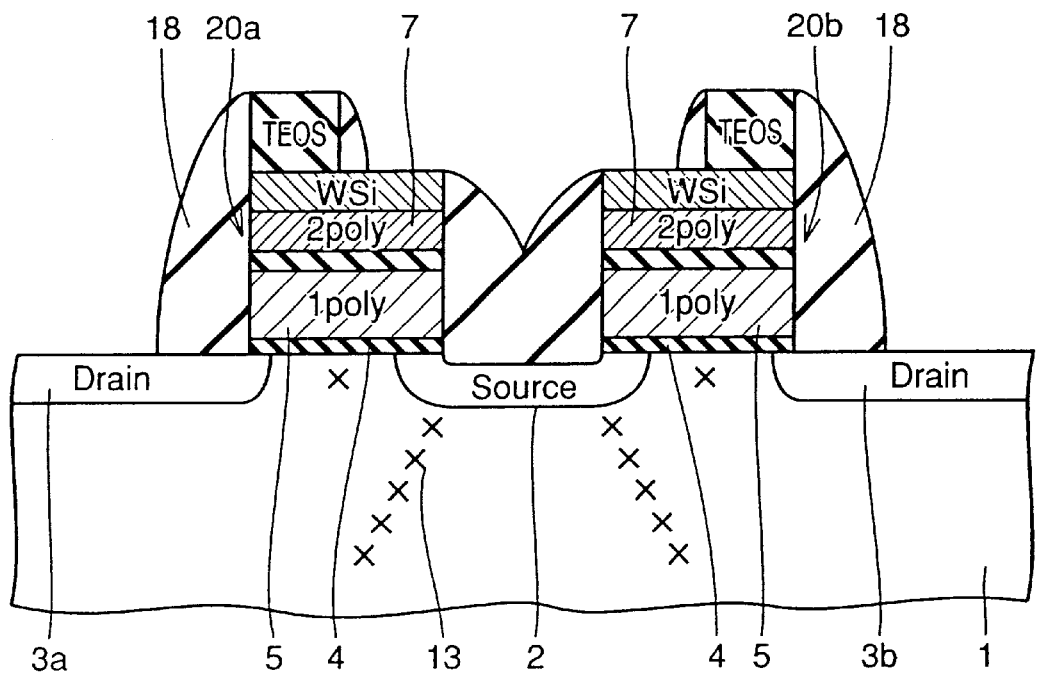
FIG. 66 shows a problem of the NOR-type flash memory in the prior art.
Figure 67:
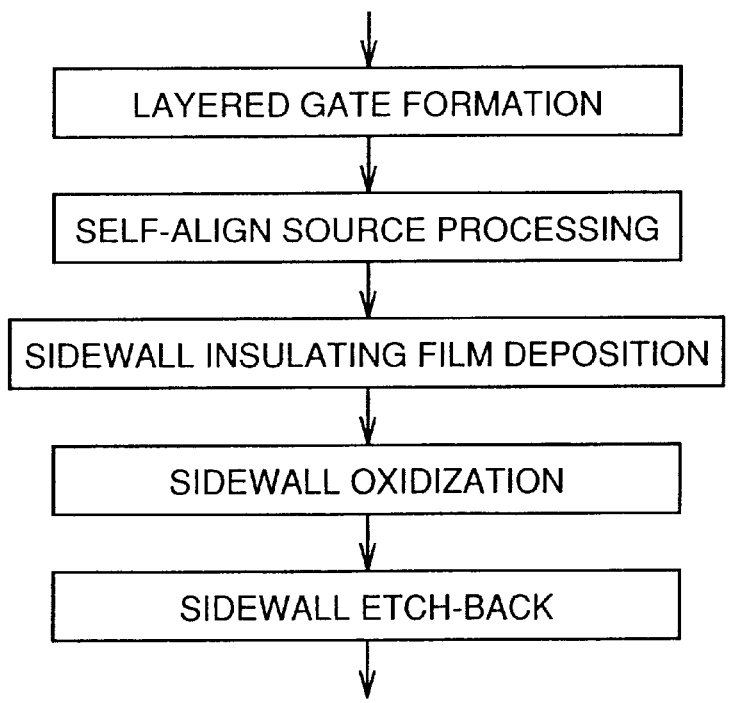
FIG. 67 shows a process flow in a method of manufacturing the NOR-type flash memory in the prior art.

Referring to FIG. 5, a photoresist film 28 which has an opening 28a for forming a self-align source is formed by photolithography. Referring to FIGS. 5 and 6, etching for the self-align source is effected on the structure masked with photoresist film 28 so that sidewall insulating film 14 and an isolation insulating film are removed from portions neighboring to source 2. Then, the self-align source step is completed. This self-align source step includes the photolithography, etching of the sidewall insulating film, dry etching of the isolating oxide film, ion implantation and removal of the resist pattern shown in FIGS. 2, 64 and 65.

Figure 7:
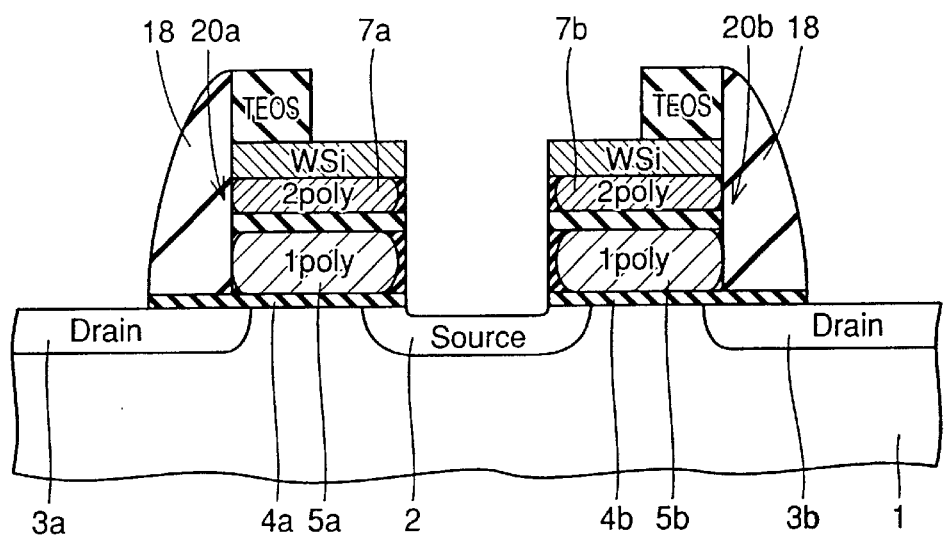

Referring to FIG. 7, sidewalls of each floating gate 5 and each control gate 7 are oxidized to round edges thereof. On the source side (i.e., on the side neighboring to source 2), the sidewalls of floating gate electrode 5 and control gate electrode 7 are exposed when the above oxidization is effected. On the drain side (i.e., on the side neighboring to drains 3a and 3b), the oxidization is effected on the sidewalls through sidewall spacers 18. Therefore, the sidewalls neighboring to source 2 are oxidized to a higher extent than the sidewalls neighboring to drains 3a and 3b. As a result, deterioration of efficiency of CHE writing does not occur. It is also possible to reduce influences (e.g. causing increase in VTH distribution width and lowering of reliability) which are applied to a device on the source end edge of the floating gate electrode in NOR erasing.

Referring to FIGS. 5, 6 and 7, since the sidewall oxidation is performed after removing sidewall insulating film 14 on the source side, a stress is not applied to semiconductor substrate 1, and a crystal defect does not occur in semiconductor substrate 1.

Second Embodiment.

A second embodiment is a modification of a method of manufacturing the NOR-type flash memory according to the first embodiment. The flash memory manufactured in the method according to the second embodiment has the same section as that shown in FIG. 1.

Figure 8:
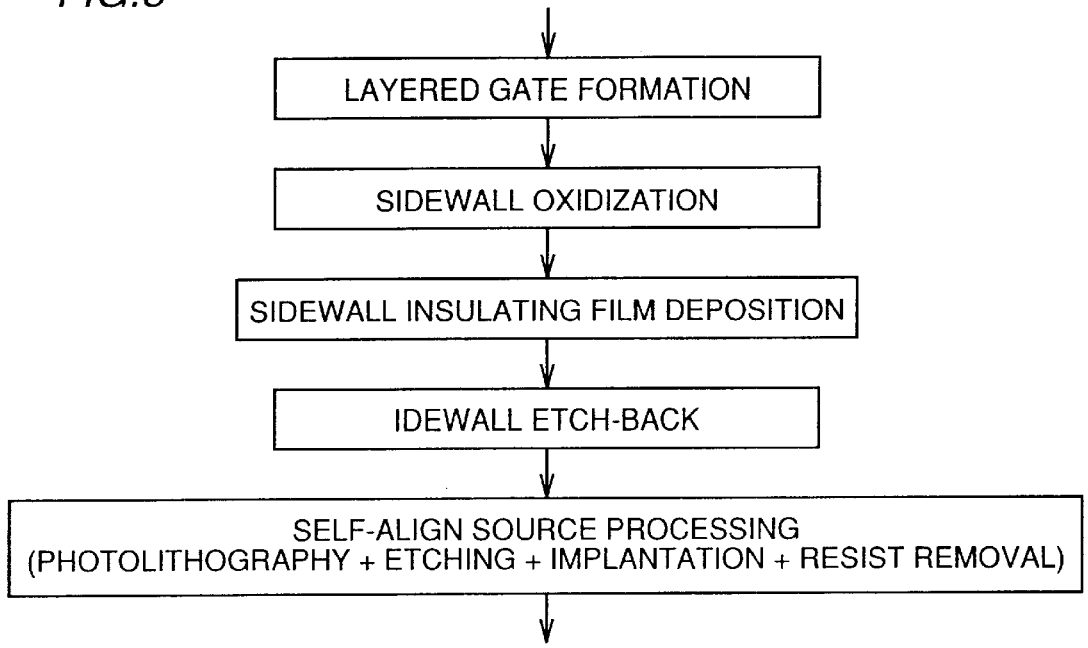
FIG. 8 shows a process flow of steps of manufacturing a flash memory according to a second embodiment.

A process flow according to the second embodiment is shown in FIG. 8.

First, steps similar to the conventional steps for forming the structure in FIG. 68 are performed to form first and second layered gates 20a and 20b.

Figure 9:
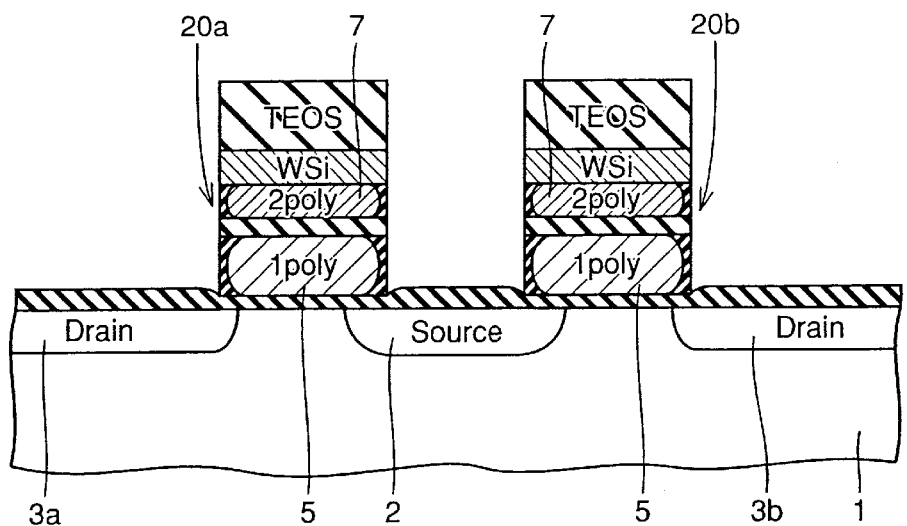
FIGS. 9–13 are cross sections of a semiconductor device in 1st to 5th steps in the method of manufacturing the flash memory according to the second embodiment, respectively.

Referring to FIG. 9, the sidewalls of floating gate electrode 5 and control gate electrode 7 are then oxidized.

Figure 10:
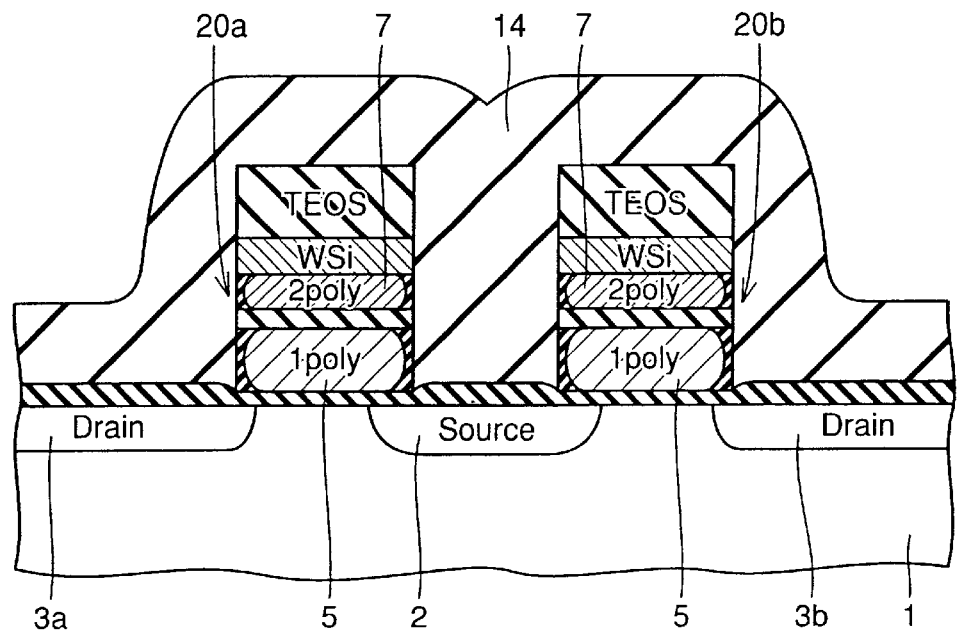

Referring to FIG. 10, sidewall insulating film 14 covering first and second layered gates 20a and 20b is deposited on semiconductor substrate 1.

Figure 11:
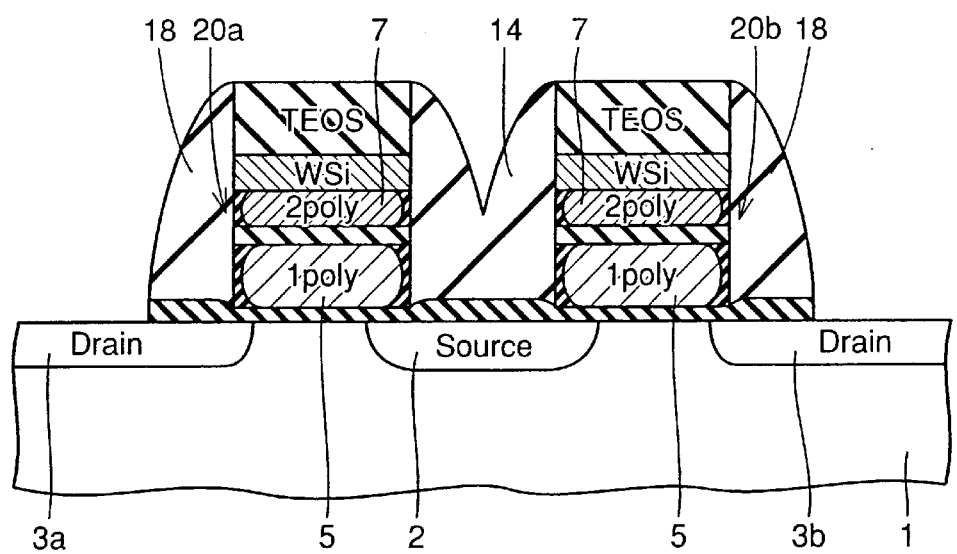

Referring to FIG. 11, etch-back is effected on sidewall insulating film 14 to form sidewall spacers 18 located on sidewalls of first and second layered gates 20a and 20b neighboring to drain regions 3a and 3b, respectively.

Figure 12:
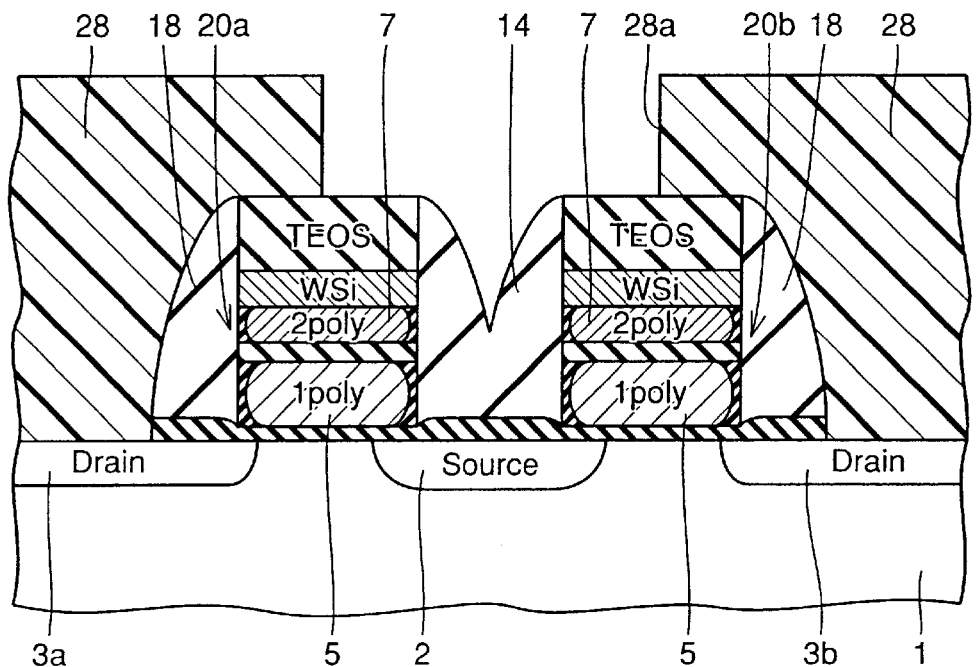

Referring to FIG. 12, photoresist film 28 which has opening 28a for forming the self-align source is formed by photolithography.

Figure 13:
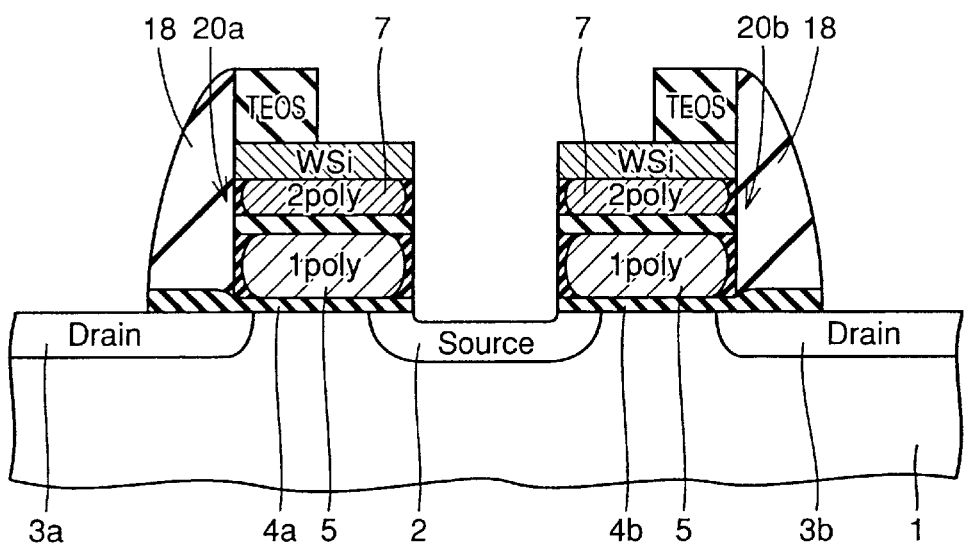

Referring to FIGS. 12 and 13, etching for the self-align source portion is effected on the structure masked with photoresist film 28 so that sidewall insulating film 14 and the isolation insulating film are removed from the source side, i.e., from the portion neighboring to source 2. Then, the self-align source step is completed.

According to the second embodiment, as shown in FIG. 9, floating gate electrode 5 and control gate electrode 7 are in the exposed state when sidewalls thereof are oxidized. Therefore, portions of these electrodes on the source side and the drain side are rounded to the same extent. Therefore, the flash memory, in which discharging is performed on the drain edges, can have high reliability.

Third Embodiment

Figure 14:
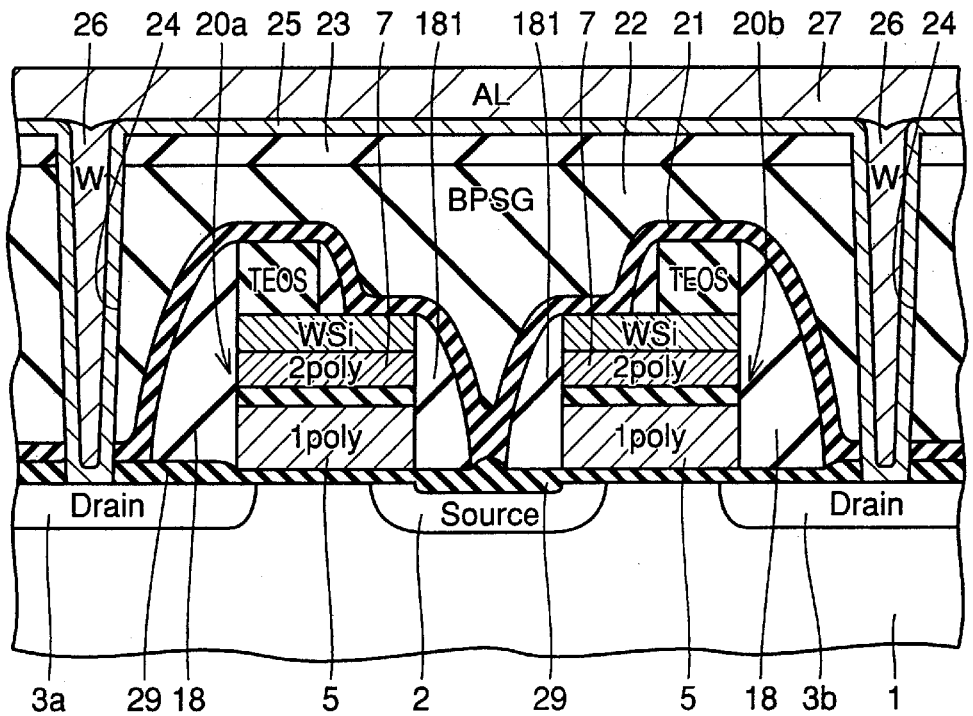
FIG. 14 is a cross section of a flash memory according to a third embodiment.

FIG. 14 is a cross section of an NOR-type flash memory according to a third embodiment. The flash memory shown in FIG. 14 is the same as that shown in FIG. 1 except for the following points. Therefore, the same or corresponding portions bear the same reference numbers, and description thereof is not repeated.

The flash memory in FIG. 14 differs from that in FIG. 1 in that sidewall spacers 181 are arranged additionally on sidewalls of first and second layered gates 20a and 20b neighboring to source region 2, respectively. Each sidewall spacer 18 neighboring to drain 3a or 3b is different in configuration from sidewall spacer 181 neighboring to source 2. A thermal oxide film 29 is present immediately under sidewall spacers 18. Thermal oxide film 29 is also present at the surface of source region 2. Thermal oxide film 29 immediately under sidewall spacers 18 extends over the entire surfaces of drain regions 3a and 3b.

Since thermal oxide film 29 is formed at the surface of source region 2, this structure can suppress occurrence of the crystal defect at the surface of semiconductor substrate 1 neighboring to source 2. Thermal oxide film 29 is formed not only immediately under sidewall spacers 18 but also over the large surfaces of drain regions 3a and 3b. Accordingly, it is possible to suppress occurrence of crystal defects, which may occur when damaged portions caused by high-concentration ion implantation at the surfaces of drain regions 3a and 3b (and the substrate changed into an amorphous structure by the high-concentration ion implantation) are recrystallized in later thermal processing. In this embodiment, therefore, occurrence of crystal defects can be suppressed not only on the side of source 2 but also on the sides of drains 3a and 3b.

Description will now be given on a method of manufacturing the flash memory shown in FIG. 14.

Figure 15:
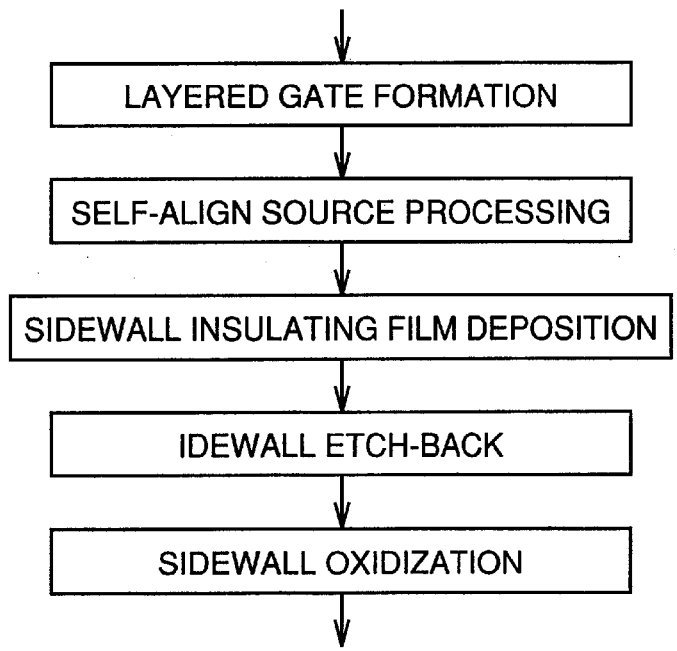
FIG. 15 shows a process flow of steps of manufacturing the flash memory according to the third embodiment.

FIG. 15 shows a process flow in the method of manufacturing the flash memory shown in FIG. 14.

Figure 71:
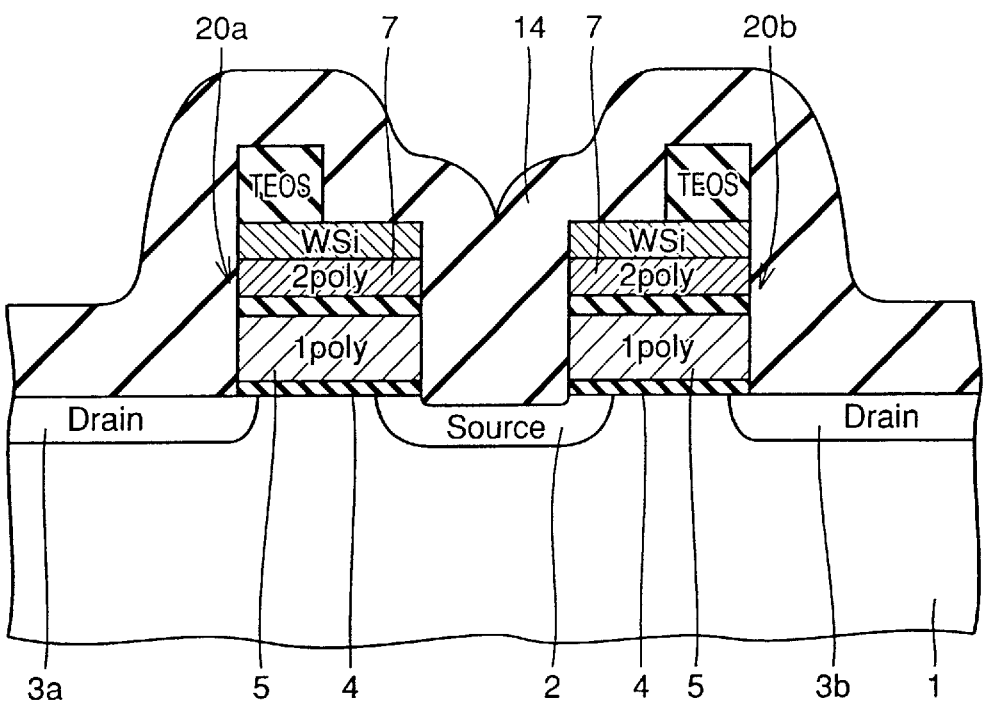
Figure 72:
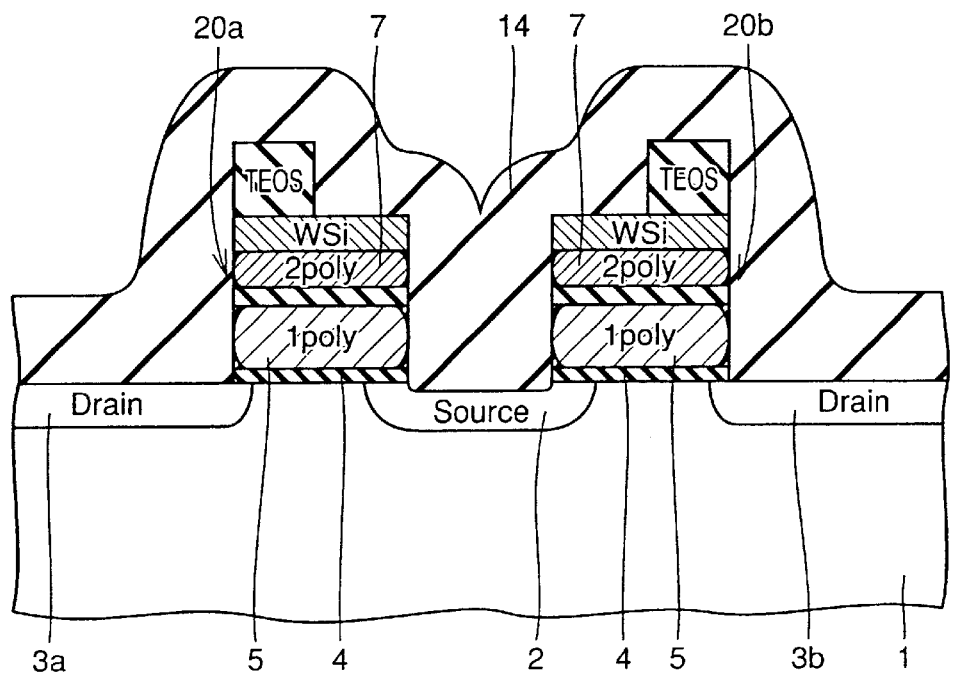
Figure 73:
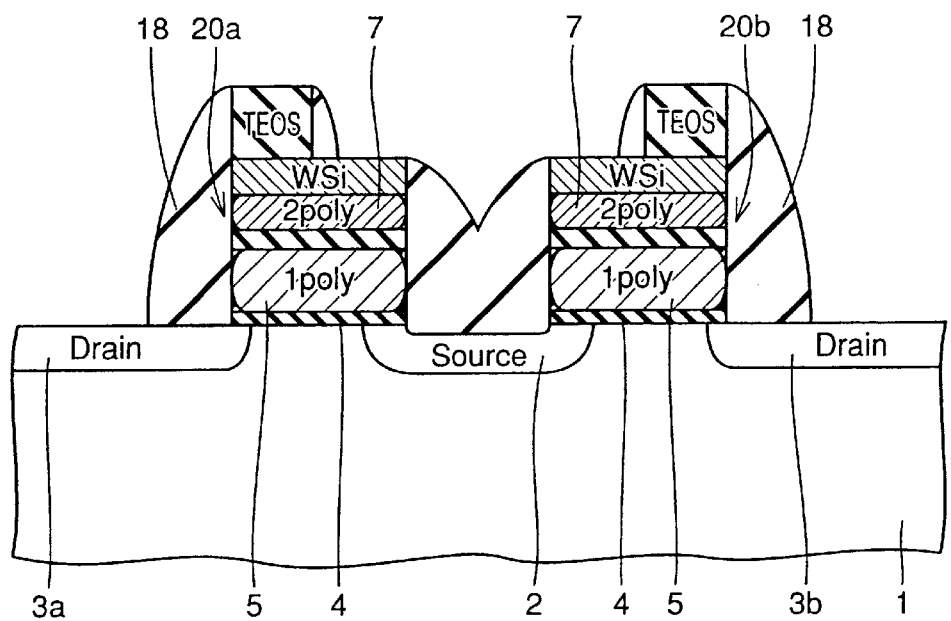
Figure 74:
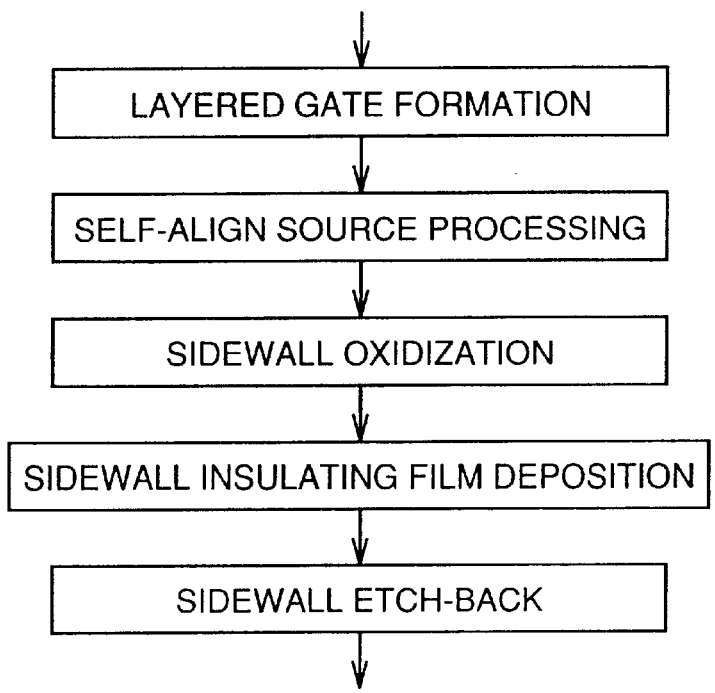
FIG. 74 shows a process flow in another method of manufacturing the NOR-type flash memory in the prior art.
Figure 75:
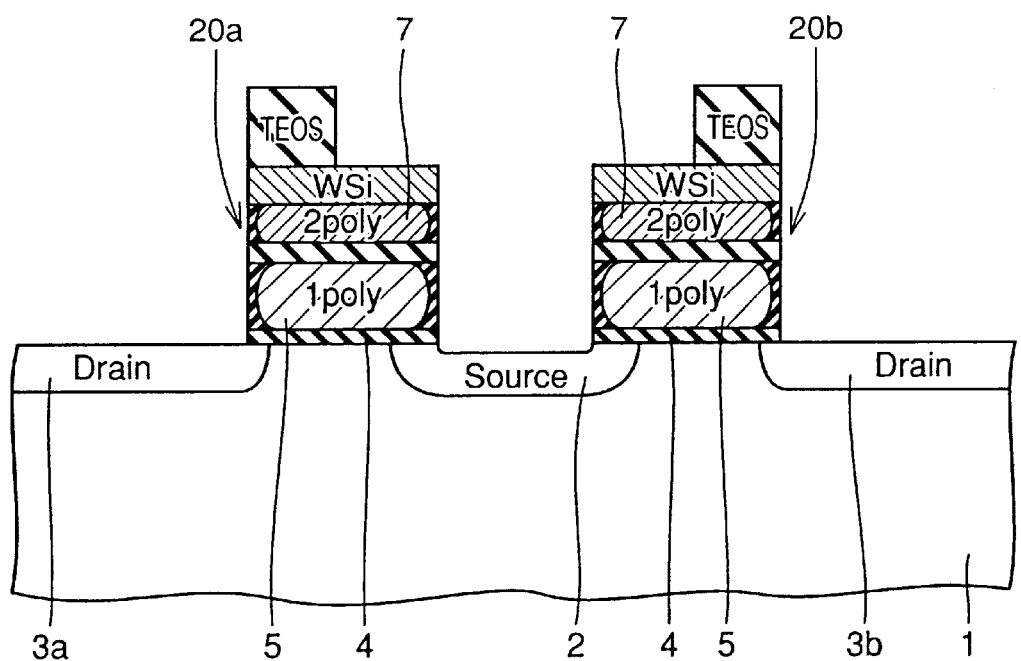
FIGS. 75 and 76 are cross sections of a semiconductor device in 1st and 2nd steps in the method of manufacturing the NOR-type flash memory in the prior art shown in FIG. 74, respectively.
Figure 76:
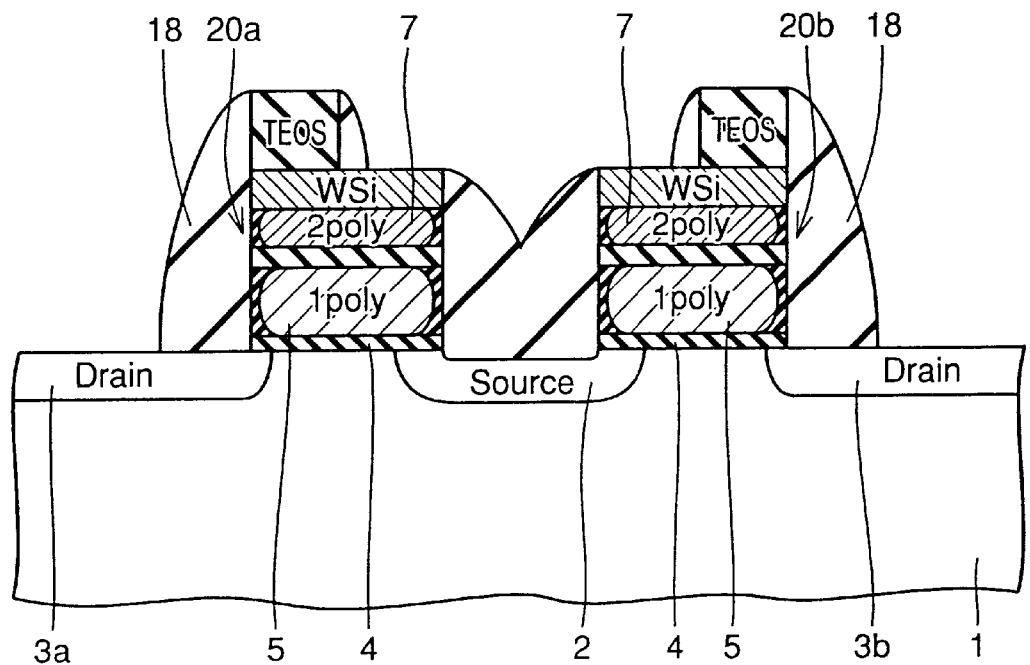
Figure 77:
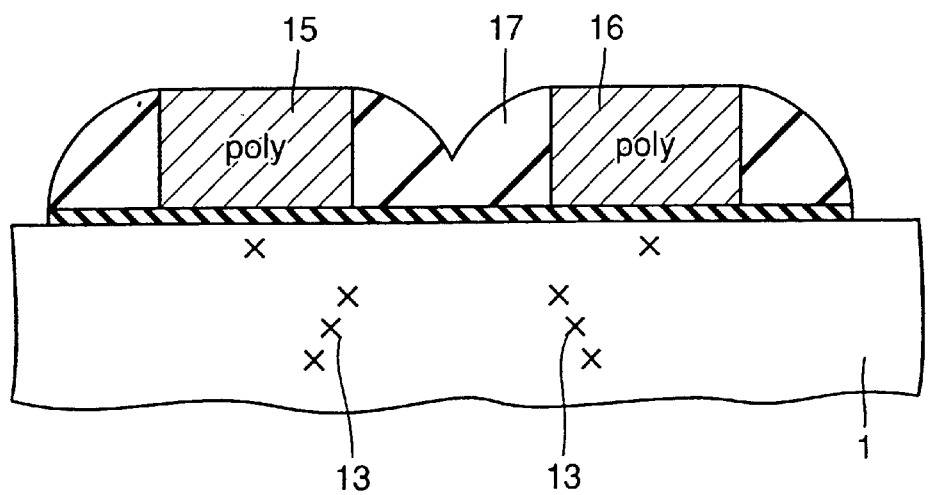
FIG. 77 shows a problem of an MOS transistor in the prior art.

Steps similar to the conventional steps for forming the structure in FIG. 71 are performed.

Figure 16:
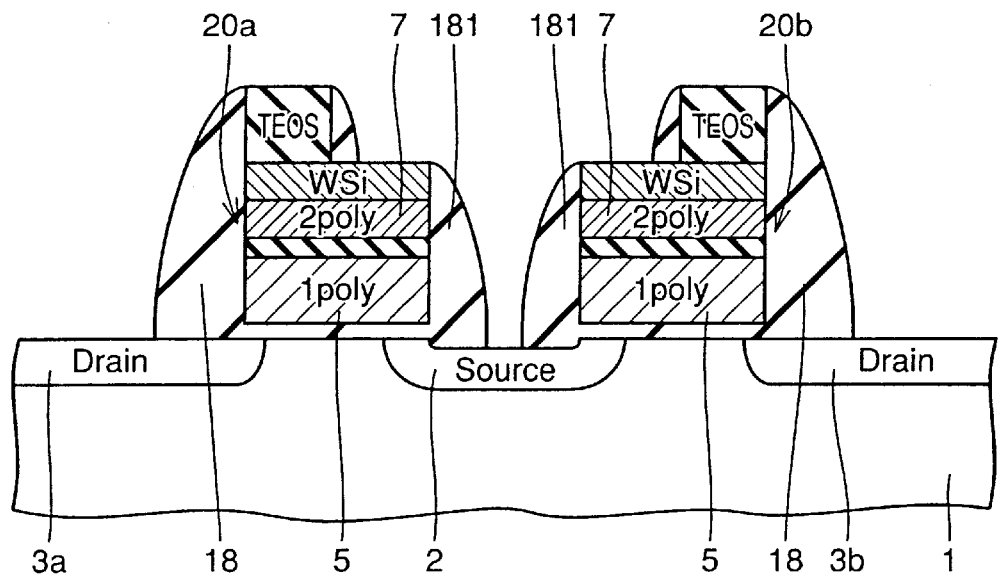
FIGS. 16 and 17 are cross sections of a semiconductor device in 1st and 2nd steps in the method of manufacturing the flash memory according to the third embodiment, respectively.

Referring to FIGS. 71 and 16, etch-back is effected on sidewall insulating film 14, and sidewall spacers 18 and 181 are formed on the sidewalls of first and second layered gates 20a and 20b neighboring to source region 2 and drain regions 3a and 3b. In this processing, a width of sidewall spacer 18 is different from that of sidewall spacer 181 because a distance between first and second layered gates 20a and 20b is small.

Figure 17:
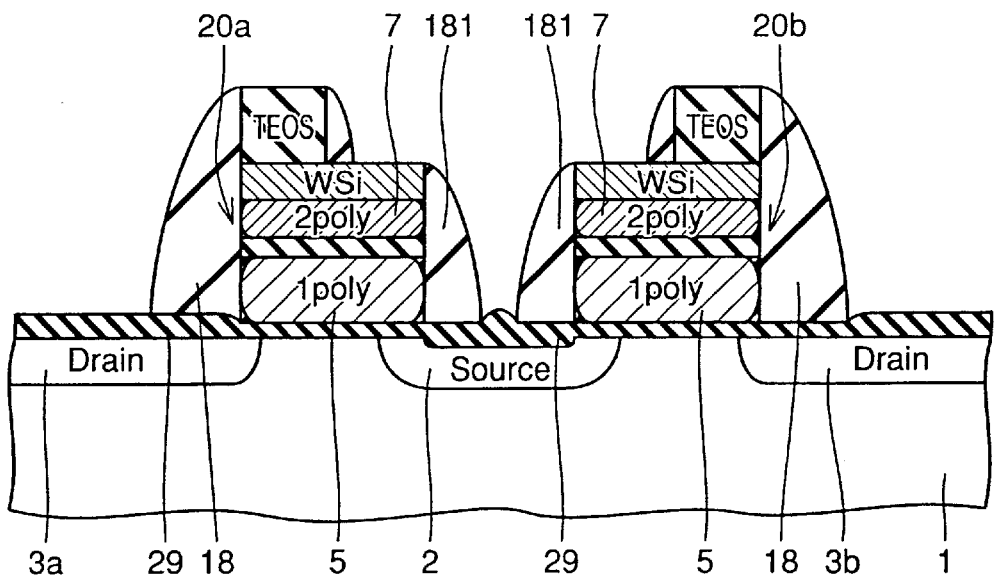

Referring to FIG. 17, the sidewalls of floating gate electrode 5 and control gate electrode 7 are oxidized. In this processing, thermal oxide film 29 is formed under sidewall spacers 18, and is also formed at the surface of source region 2. Thermal oxide film 29 formed immediately under sidewall spacers 18 extends over the surfaces of drain regions 3a and 3b. Thereafter, predetermined steps are performed to complete the device shown in FIG. 14.

Fourth Embodiment

Figure 18:
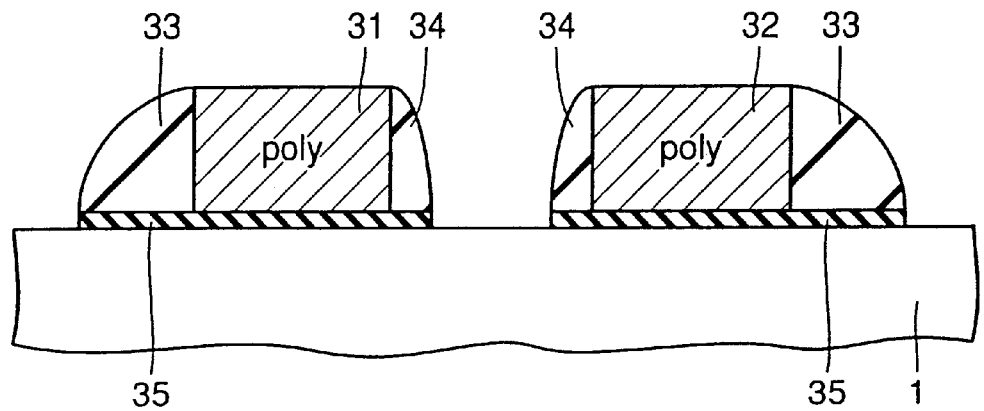
FIG. 18 is a cross section of an MOS transistor according to a fourth embodiment.

FIG. 18 is a cross section of an MOS transistor according to a fourth embodiment.

Referring to FIG. 18, a first gate electrode 31 and a second gate electrode 32 are formed on semiconductor substrate 1. A third gate electrode (not shown) is arranged close and parallel to second gate electrode 32. A distance between first and second gate electrodes 31 and 32 is shorter than a distance between second gate electrode 32 and the third gate electrode (not shown). A sidewall spacer 33 is arranged on the sidewall of second gate electrode 32 neighboring to the third gate electrode. A distance between first and second gate electrodes 31 and 32 is smaller than double the thickness of sidewall spacer 33.

Sidewall spacers 34 each having a smaller width than sidewall spacer 33 are arranged on the sidewalls, which are opposed to each other, of first and second gate electrodes 31 and 32. By employing sidewall spacers 33 and 34 having the configurations described above, it is possible to prevent application of a stress to semiconductor substrate 1. Thereby, occurrence of a crystal defect in substrate 1 can be prevented.

Sidewall spacers 33 and 34 are made of CVD-SiO$_2$ (TEOS).

Description will now be given on a method of manufacturing the MOS transistor shown in FIG. 18.

Figure 19:
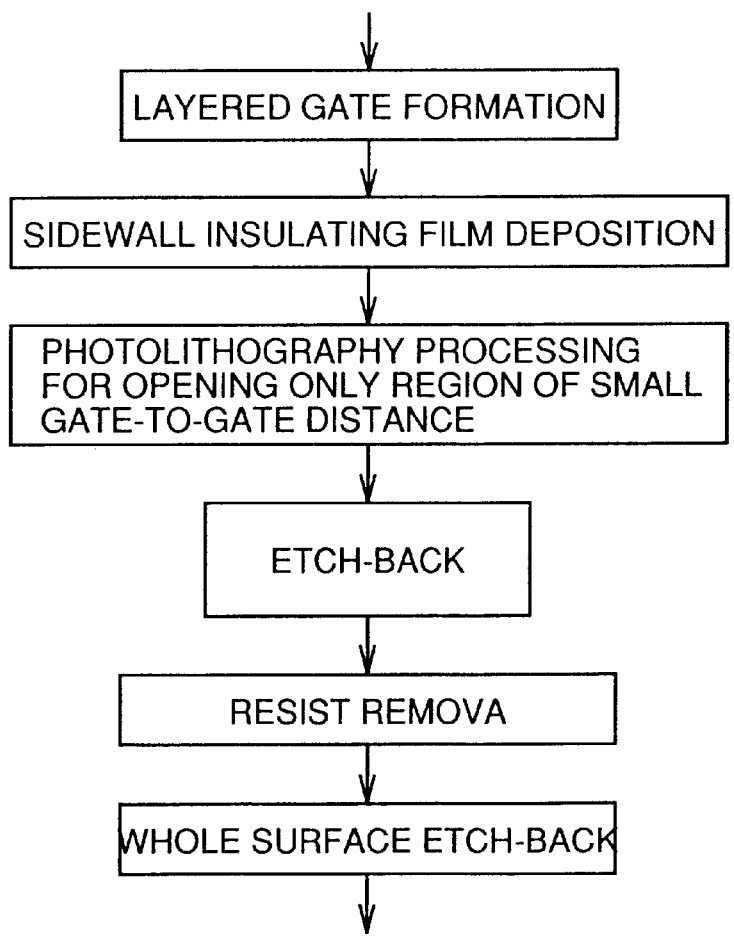
FIG. 19 shows a process flow in a method of manufacturing the MOS transistor according to the fourth embodiment.
Figure 20:
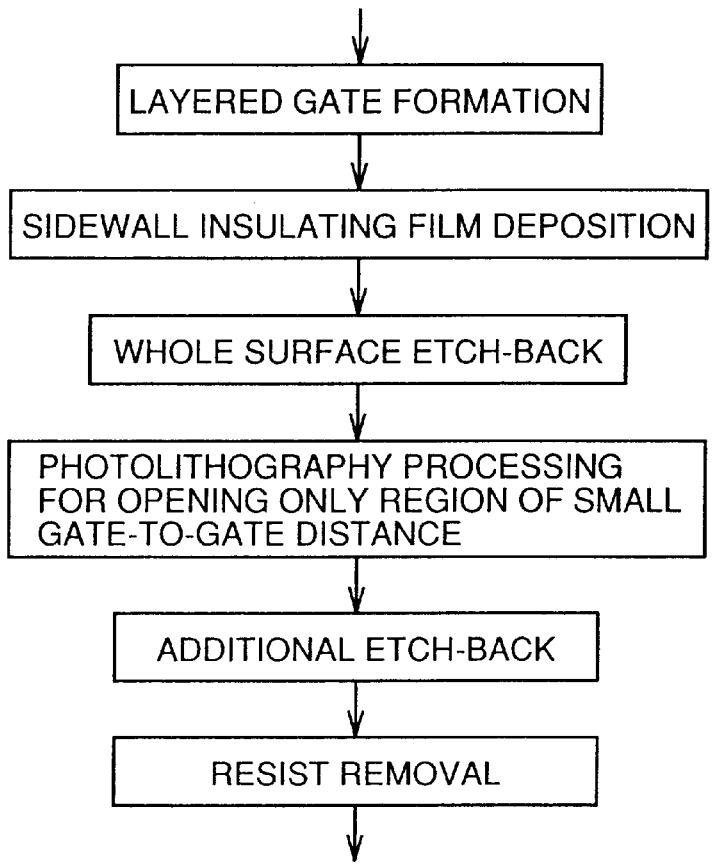
FIG. 20 shows a process flow in another method of manufacturing the MOS transistor according to the fourth embodiment.

FIGS. 19 and 20 show a process flow for manufacturing the MOS transistor shown in FIG. 18.

Figure 21:
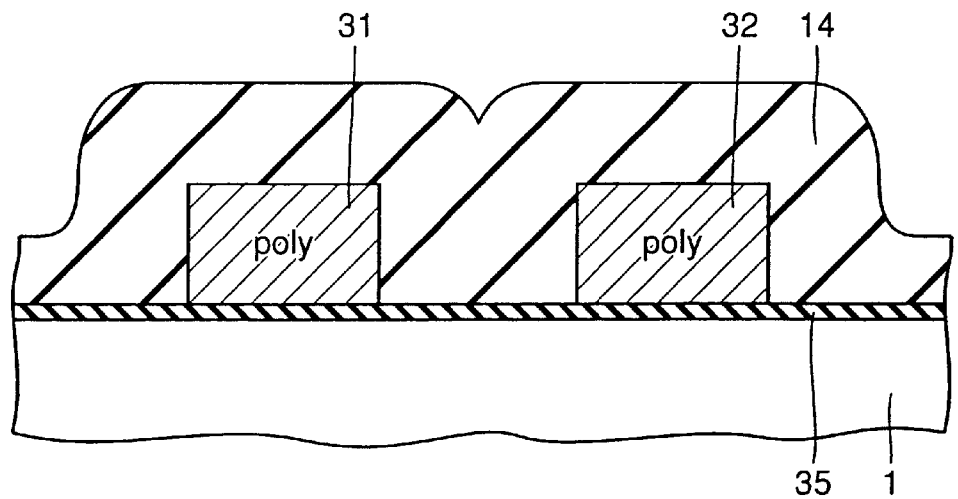
FIGS. 21–26 are cross sections of a semiconductor device in 1st–6th steps in the method of manufacturing the MOS transistor according to the fourth embodiment, respectively.

Referring to FIG. 21, first and second gate electrodes 31 and 32 as well as third gate electrode (not shown), which are close and parallel to each other, are formed on semiconductor substrate 1 with a gate insulating film 35 therebetween. Sidewall insulating film 14 covering first, second and third gate electrodes 31 and 32 is formed on semiconductor substrate 1. A photoresist pattern 37 which exposes a portion located between first and second gate electrodes 31 and 32, and covers the other portion is formed on semiconductor substrate 1. Etch-back is effected on sidewall insulating film 14 masked with photoresist pattern 37 so that first sidewall spacers 34 are formed on sidewalls, which are opposed to each other, of first and second gate electrodes 31 and 32.

Figure 23:
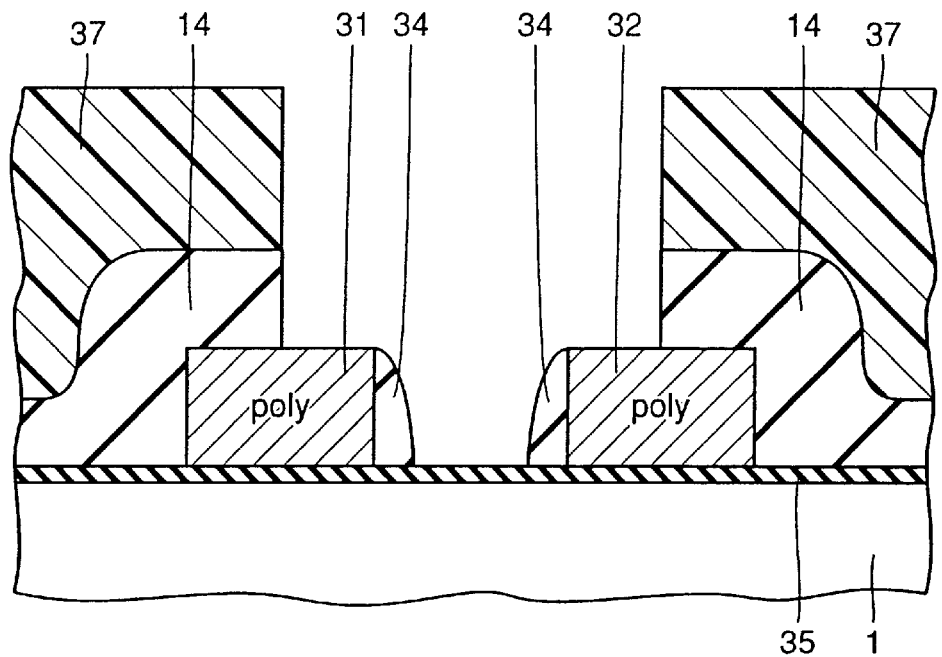
Figure 24:
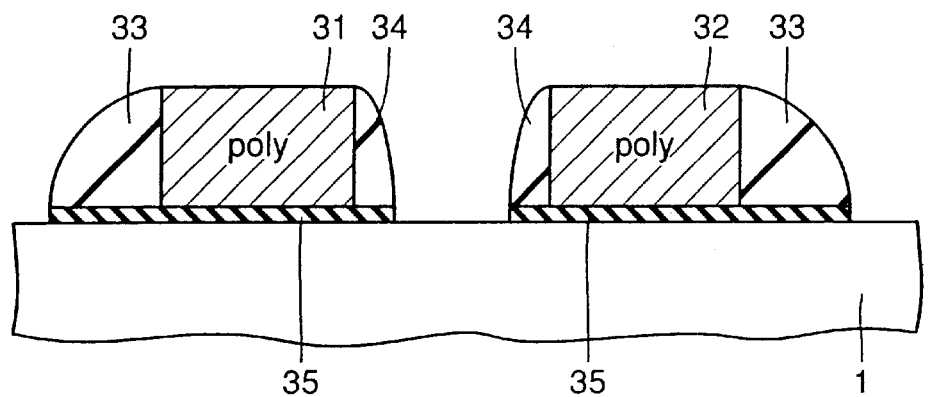

Referring to FIGS. 23 and 24, photoresist pattern 37 is removed, and etch-back is effected on remaining sidewall insulating film 14 so that second sidewall spacers 33 are formed on the sidewalls, which are remote from each other, of first and second gate electrodes 31 and 32. According to a feature of this embodiment, a distance between first and second gate electrodes 31 and 32 is smaller than double the thickness of second sidewall spacer 33.

FIGS. 25–28 show steps in another method of manufacturing the MOS transistor according to this embodiment. First, steps similar to the conventional steps shown in FIGS. 21 and 22 are performed.

Figure 25:
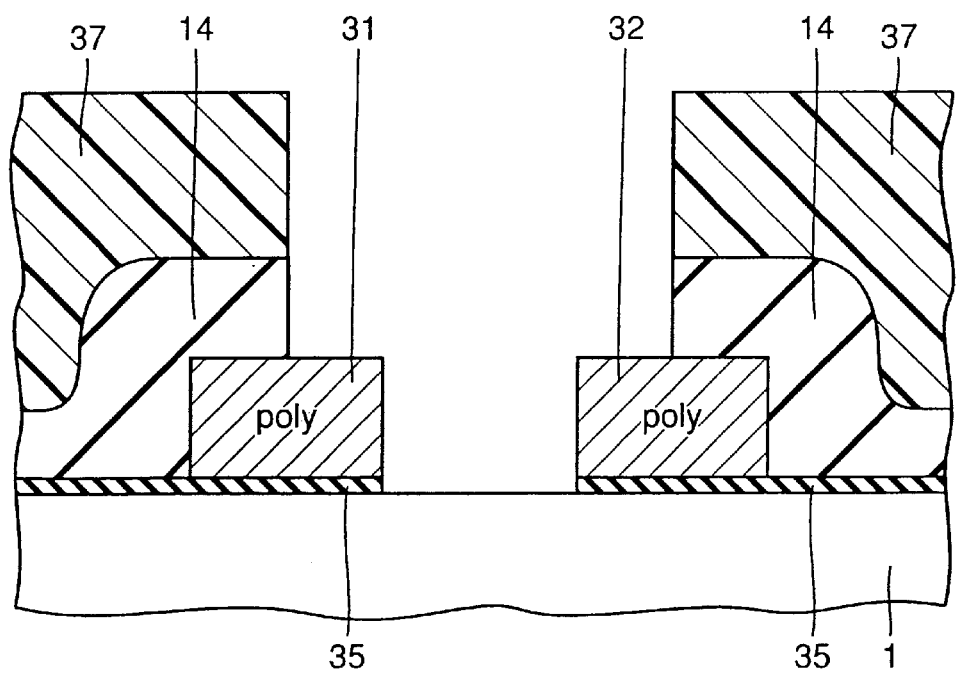

Referring to FIG. 25, anisotropic dry etching may be effected on sidewall insulating film 14 instead of etch-back shown in FIG. 23 so that the sidewall spacer may not be formed on the sidewalls of first and second gate electrodes 31 and 32 opposed to each other.

Figure 26:
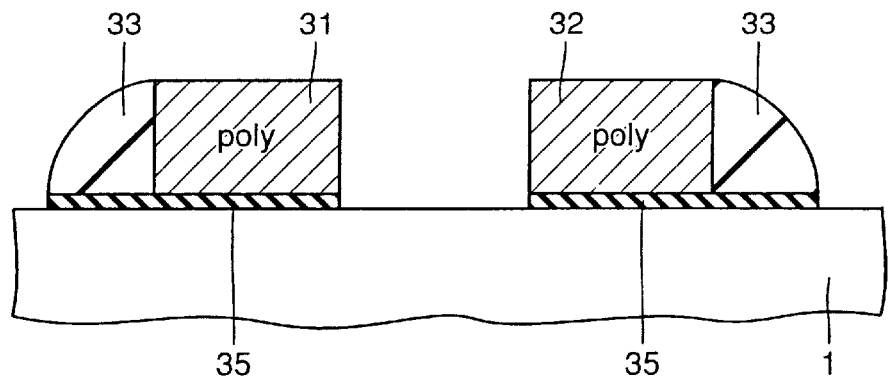

Referring to FIG. 26, photoresist pattern 37 is removed, and etch-back is effected on remaining sidewall insulating film 14 so that sidewall spacers 33 are formed on the sidewalls of the first and second gate electrodes 31 and 32, which are remote from each other.

Figure 22:
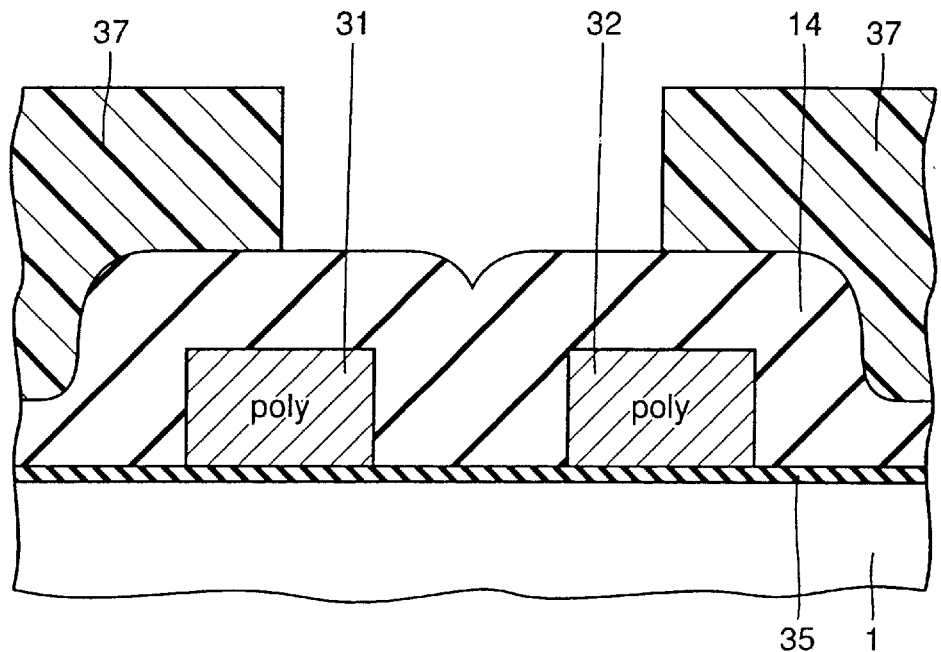
Figure 27:
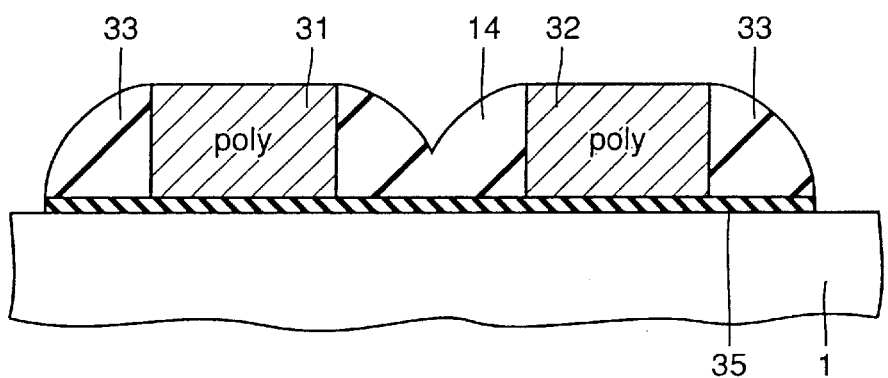
FIGS. 27 and 28 are cross sections of a semiconductor device in 1st and 2nd steps in a modification of the method of manufacturing the MOS transistor according to the fourth embodiment, respectively.
Figure 28:
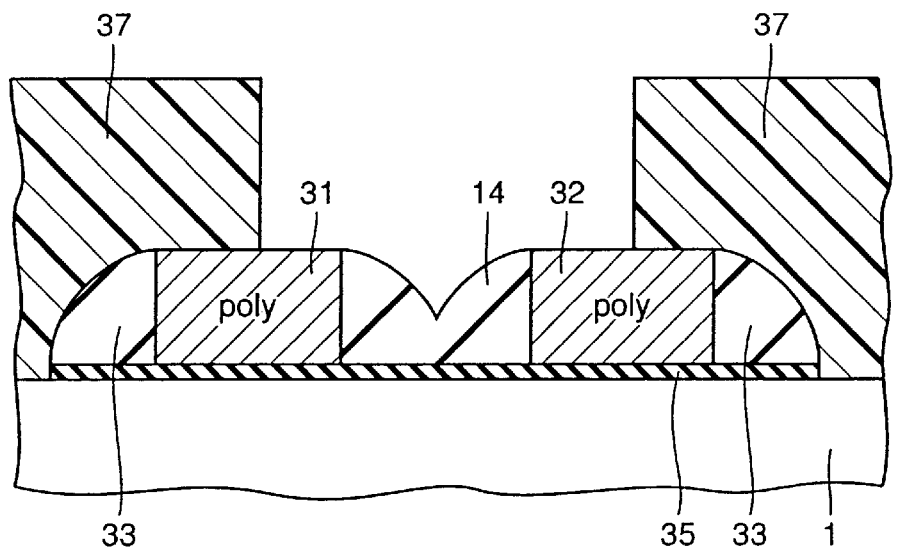

In a modification, etch-back is effected on sidewall insulating film 14 as can be seen from FIGS. 21 and 27 before the step of photolithography processing shown in FIG. 22. Thereafter, photolithography processing is performed to form photoresist pattern 37, which exposes the portion located between first and second gate electrodes 31 and 32, and covers the other portion, on semiconductor substrate 1 as shown in FIG. 28. Thereafter, second etch-back is effected to remove photoresist pattern 37. Thereby, the structure similar to that shown in FIG. 24 is obtained.

Fifth Embodiment

Figure 29:
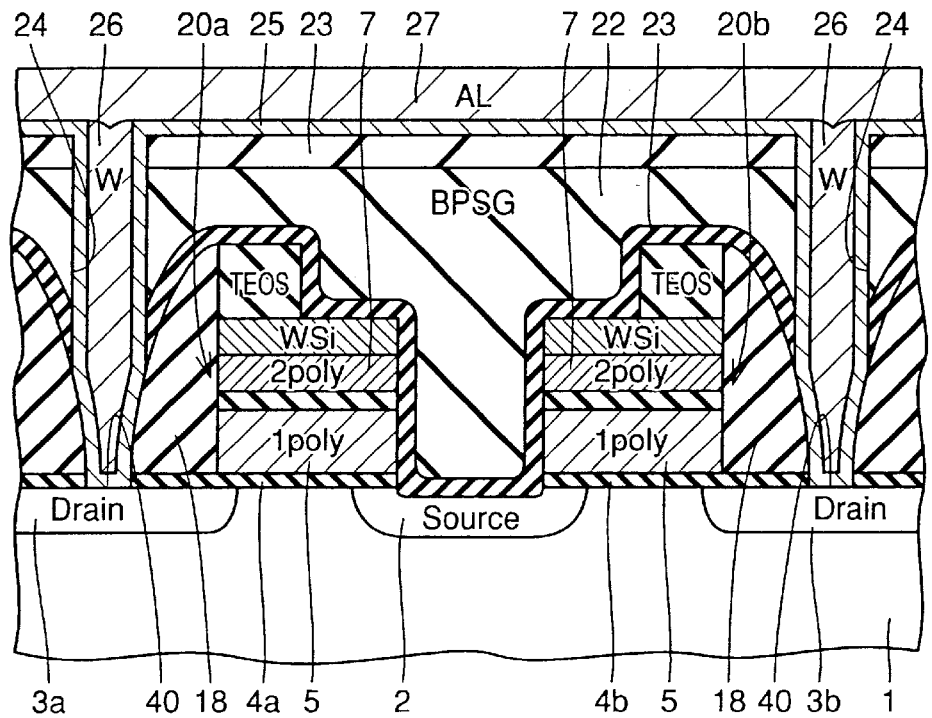
FIG. 29 is a cross section of a flash memory according to a fifth embodiment.

FIG. 29 is a cross section of an NOR-type flash memory according to a fifth embodiment.

An NOR-type flash memory shown in FIG. 29 is the same as that shown in FIG. 1 except for the following points. Therefore, the same or corresponding portions bear the same reference numbers, and description thereof is not repeated.

The structure in FIG. 29 differs from that in FIG. 1 in that sidewall spacers 18 which are formed on the drain sides of first and second layered gates 20a and 20b are formed of nitride films, respectively, and contacts 40 are formed in the self-aligned fashion. Owing to this structure, it is possible to suppress crystal defects, which may occur on the source side in a later oxidizing step and a later high-temperature thermal processing step. Further, the self-aligned contact can be achieved on the drain side. Therefore, a distance between the gates on the drain side, and therefore the cell size of the flash memory can be further reduced.

Description will now be given on a method of manufacturing the NOR-type flash memory shown in FIG. 29.

Figure 30:
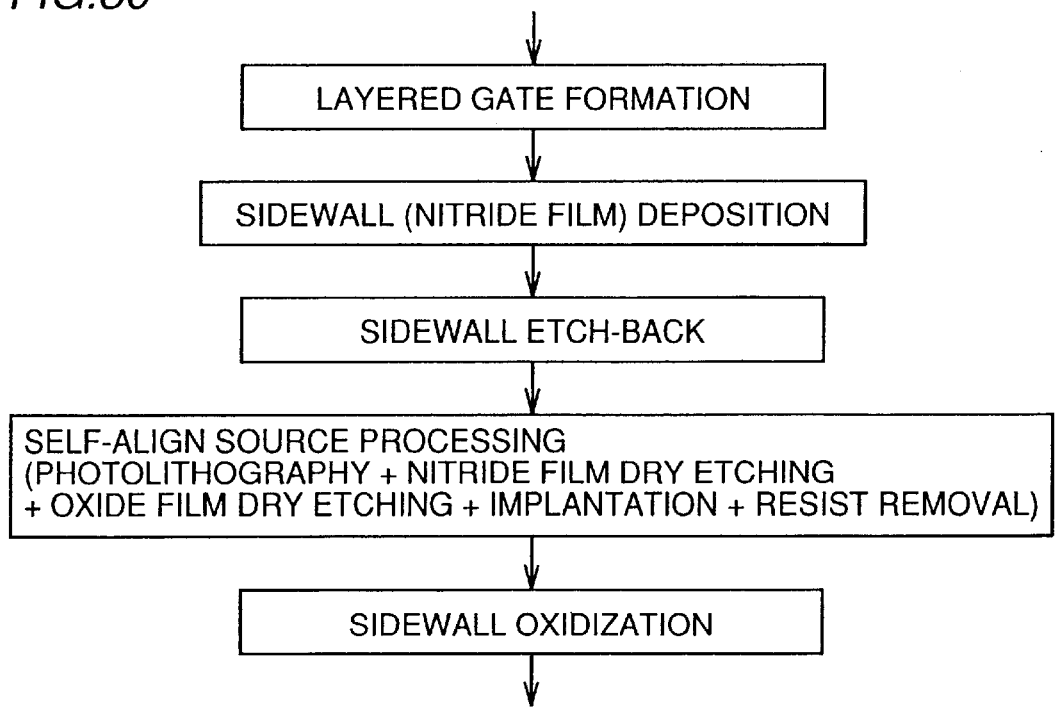
FIG. 30 shows a process flow in a method of manufacturing the flash memory according to the fifth embodiment.

FIG. 30 shows a process flow for manufacturing the flash memory shown in FIG. 29.

First, steps similar to the conventional steps for forming the structure in FIG. 68 are performed.

Figure 31:
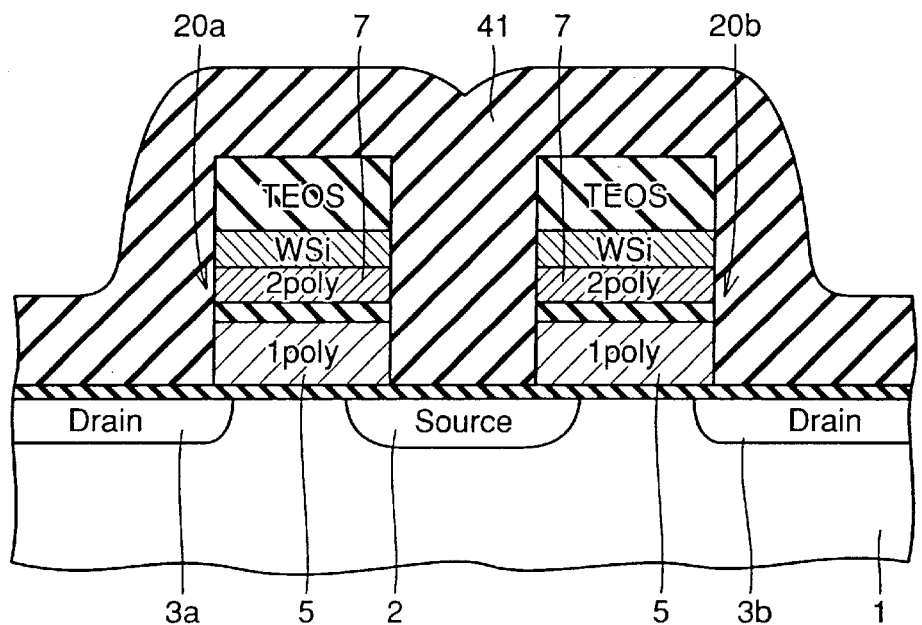
FIGS. 31–35 are cross sections of a semiconductor device in 1st to 5th steps in the method of manufacturing the flash memory according to the fifth embodiment, respectively.

Referring to FIG. 31, a nitride film (SiN) 41 covering first and second layered gates 20a and 20b is deposited.

Figure 32:
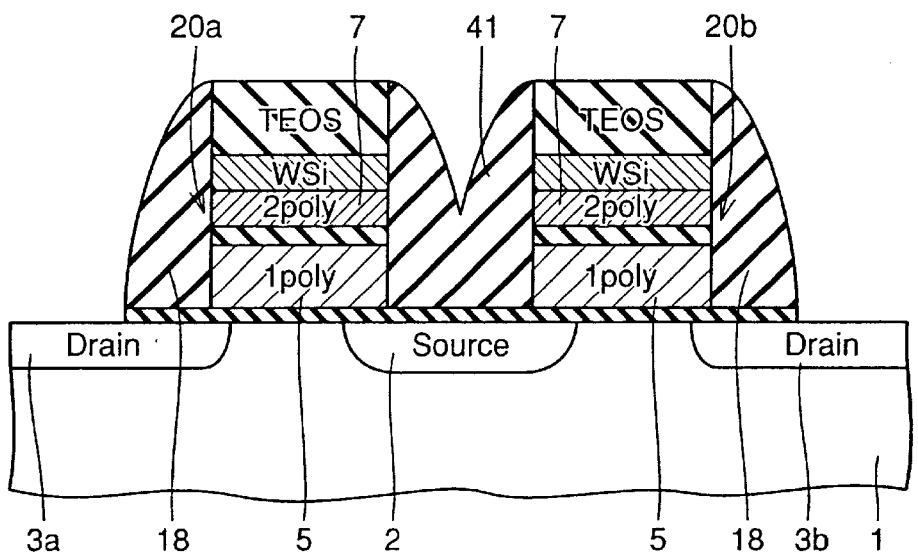

Referring to FIGS. 31 and 32, etch-back is effected on nitride film 41 to form sidewall spacers 18, which are made of the nitride film, on the sidewalls of first and second layered gates 20a and 20b neighboring to drain regions 3a and 3b, respectively.

Figure 33:
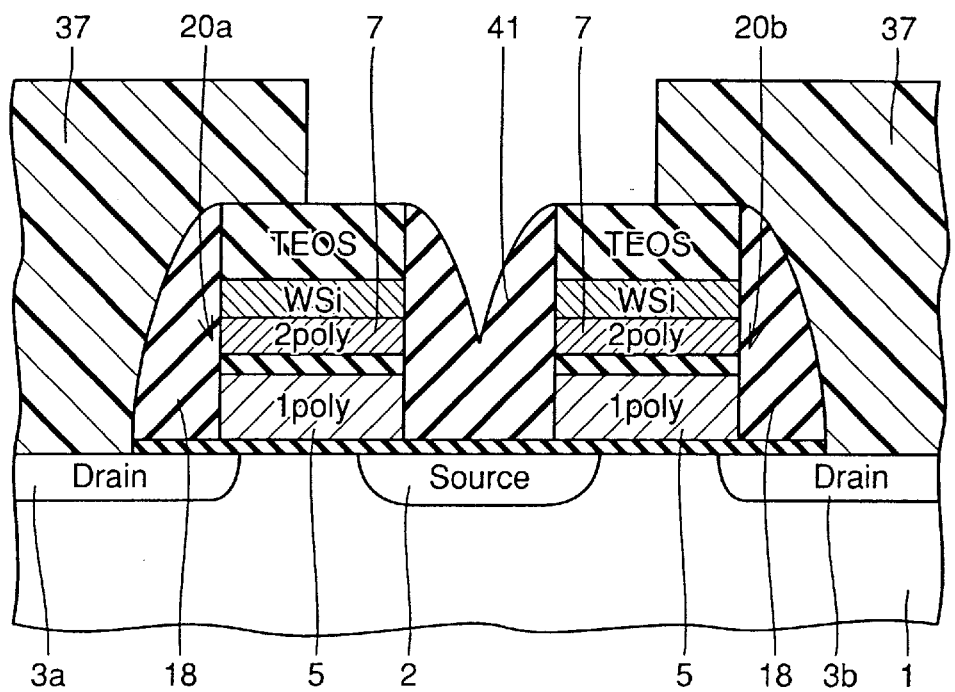
Figure 34:
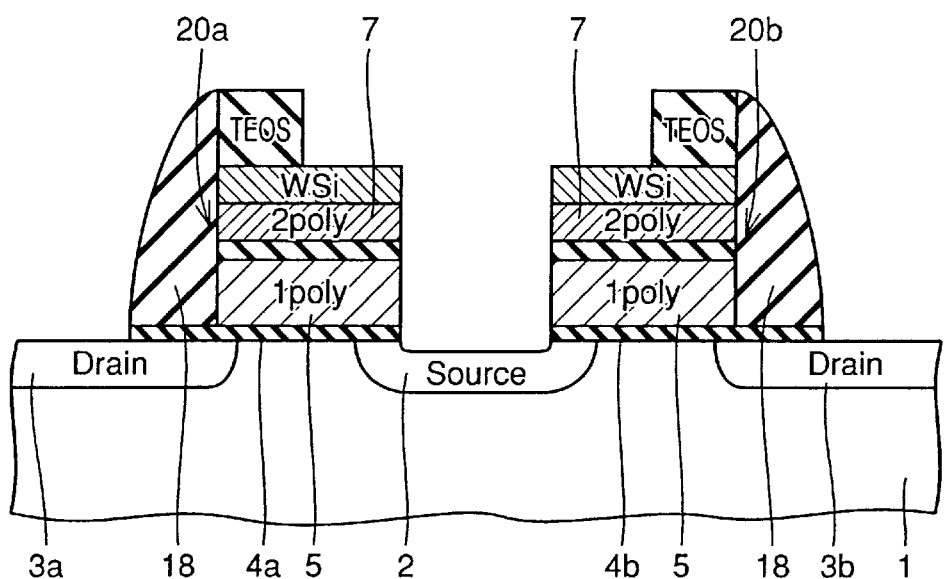

Referring to FIG. 33, processing is performed to form photoresist pattern 37, which exposes the portion between first and second layered gates 20a and 20b, and covers the other portion, on semiconductor substrate 1. Referring to FIGS. 33 and 34, etching is effected on the structure masked with photoresist pattern 37 to remove nitride film 41 and the isolating oxide film (not shown) on the source side, which are located between first and second layered gates 20a and 20b. Then, the self-align source step is completed. Thereafter, photoresist pattern 37 is removed.

Figure 35:
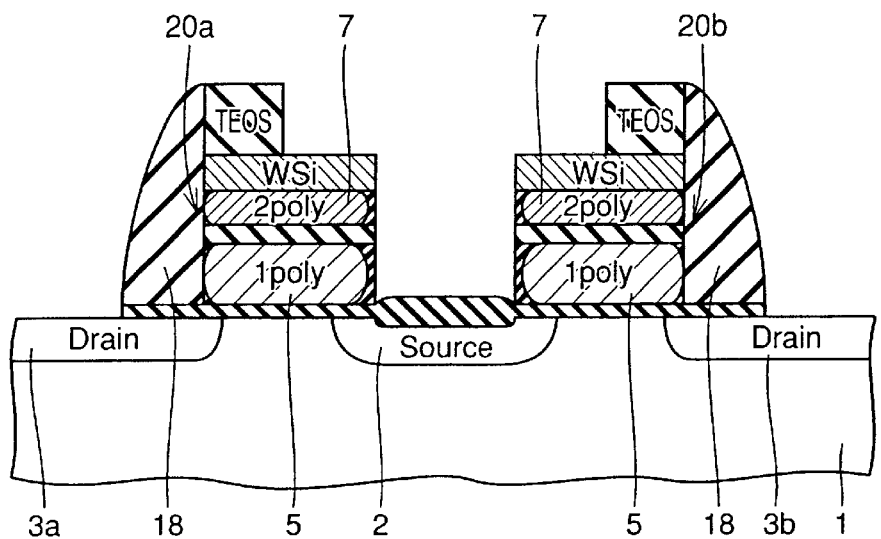

Referring to FIGS. 34 and 35, processing is performed to oxidize the sidewalls of floating gate electrode 5 and control gate electrode 7 to round the edges thereof. On the source side, this oxidization is effected on floating gate electrode 5 and control gate electrode 7 which are exposed. On the drain side, the oxidization is effected through sidewall spacer 18 made of the nitride film. Therefore, the sidewalls neighboring to source region 2 are oxidized to a larger extent than the sidewalls neighboring to drain regions 3a and 3b, and thus are rounded to a larger extent. Thereafter, the device shown in FIG. 29 is completed through predetermined steps.

Sixth Embodiment

This embodiment relates to still another method of manufacturing the NOR-type flash memory shown in FIG. 29.

Figure 36:
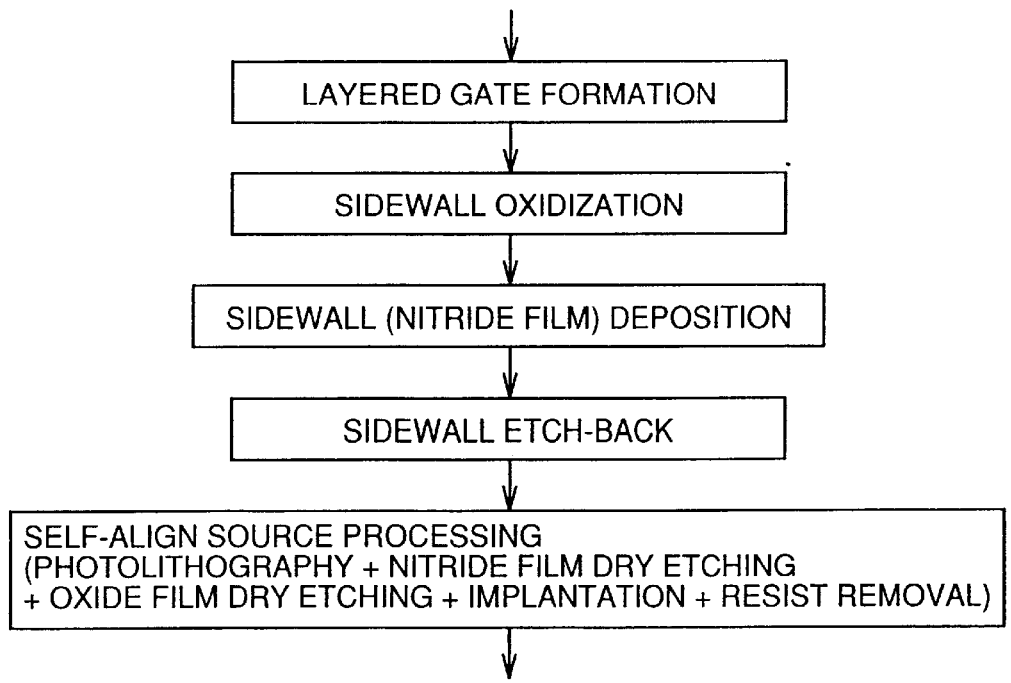
FIG. 36 shows a process flow in a method of manufacturing the flash memory according to a sixth embodiment.

FIG. 36 shows a process flow in the manufacturing method according to the sixth embodiment.

First, steps similar to the conventional steps for forming the structure in FIG. 68 are performed. Thereafter, the sidewalls of floating gate electrode 5 and control gate electrode 7 are oxidized.

Figure 37:
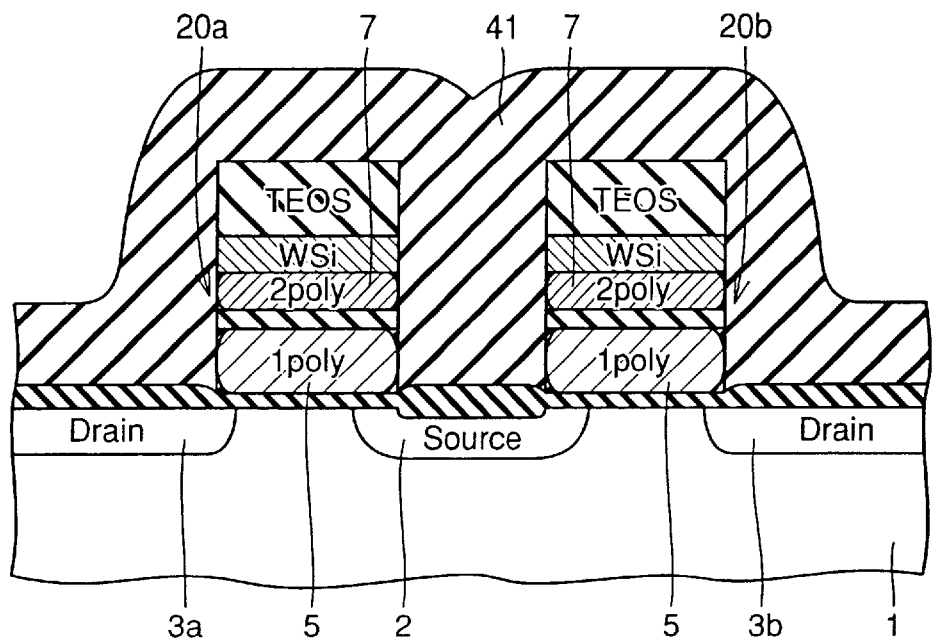
FIGS. 37–39 are cross sections of a semiconductor device in 1st to 3rd steps in the method of manufacturing the flash memory according to the sixth embodiment, respectively.

Referring to FIG. 37, a nitride film (SiN) 41 covering first and second layered gates 20a and 20b is deposited on semiconductor substrate 1.

Figure 38:
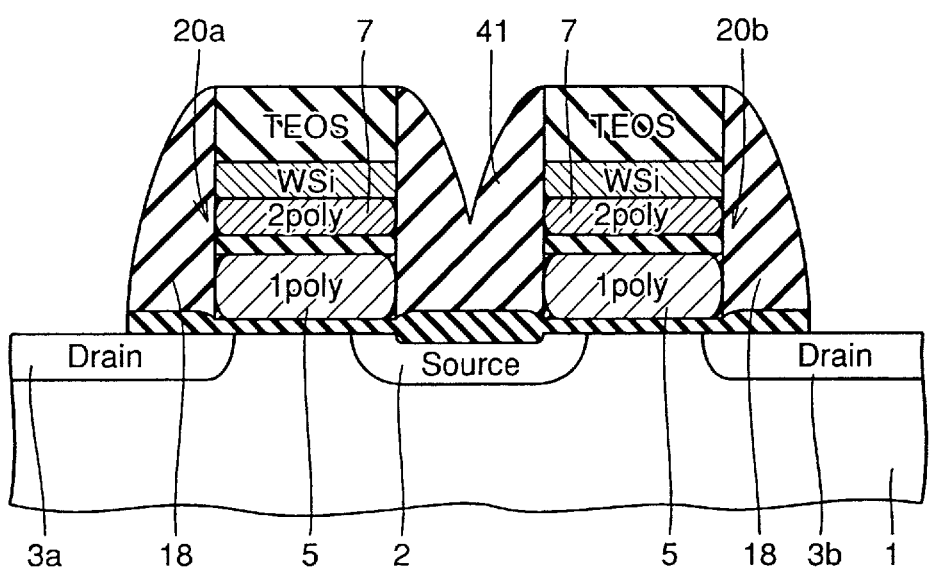

Referring to FIGS. 37 and 38, etch-back is effected on nitride film 41 to form sidewall spacers 18 on the sidewalls, which are remote from each other, of the first and second gate electrodes 20a and 20b.

Figure 39:
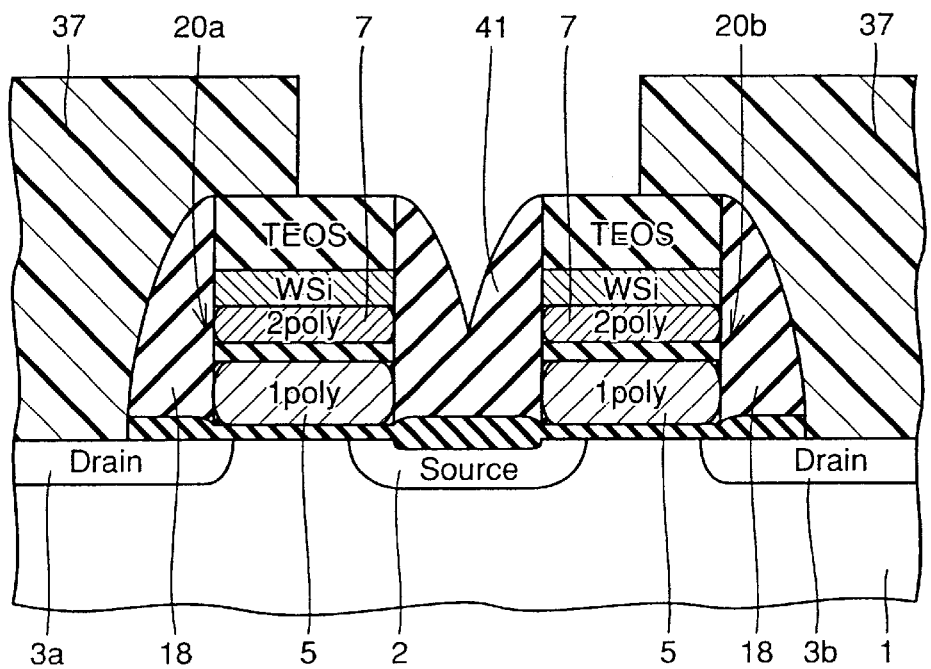

Referring to FIG. 39, processing is performed to form photoresist pattern 37, which exposes the portion between first and second layered gates 20a and 20b, and covers the other portion, on semiconductor substrate 1. Etching is effected on the structure masked with photoresist pattern 37 to remove nitride film 41 and the isolating oxide film (not shown) on the source side, which are located between first and second layered gates 20a and 20b. Then, the self-align source step is completed.

According to this embodiment, the oxidization is effected on the sidewalls of floating gate electrode 5 and control gate electrode 7 which are in the exposed state. Therefore, the sidewalls on the source side and the drain side are rounded to the same extent.

Seventh Embodiment

Figure 40:
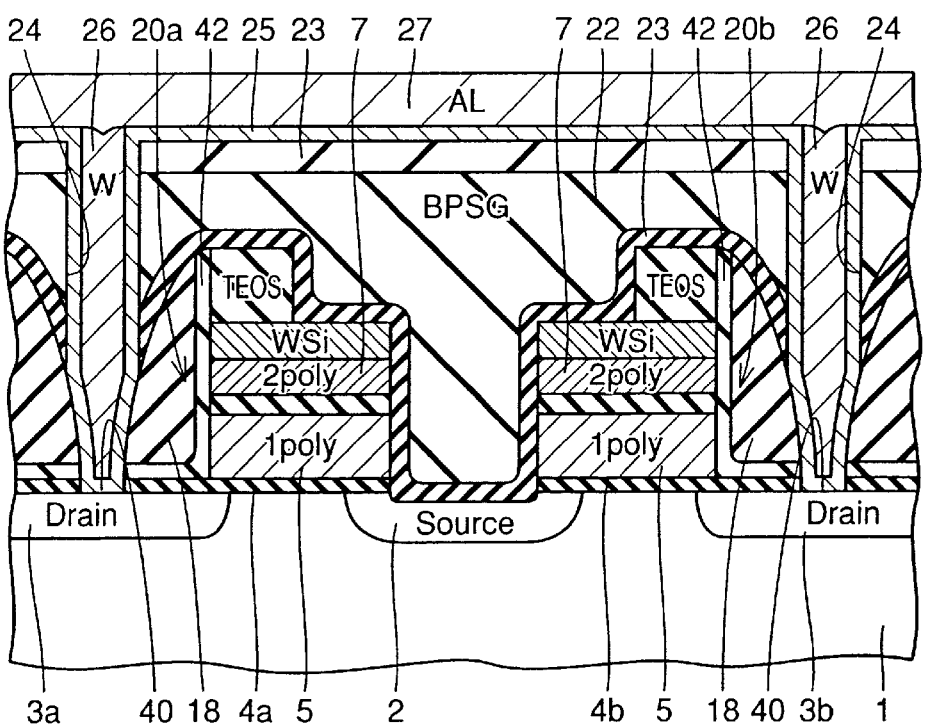
FIG. 40 is a cross section of a flash memory according to a seventh embodiment.

FIG. 40 is a cross section of an NOR-type flash memory according to a seventh embodiment. In the structure shown in FIG. 40, the same or corresponding portions as those in FIG. 1 bear the same reference numbers, and description thereof is not repeated.

In the NOR-type flash memory according to this embodiment, the sidewall spacer is not present on the sidewalls of first and second layered gates 20a and 20b on the source side. Sidewall spacers 18 made of the nitride film are present on the sidewalls of first and second layered gates 20a and 20b on the drain side. Buffer layer 42 formed of a plasma oxide film or a CVD oxide film is located between sidewall spacer 18 made of the nitride film and the sidewall of each of first and second gate electrode 20a and 20b. Buffer layer 42 is also located between each sidewall spacer 18 and semiconductor substrate 1. Contact 40 is formed in a self-aligned fashion.

According to this embodiment, it is possible to suppress occurrence of a crystal defect, which may occur on the source region side in the later oxidizing step or high-temperature processing step. Further, it is possible to suppress occurrence of a stress between sidewall spacer 18 and semiconductor substrate 1 and thus occurrence of the interface level. Further, the self-aligned contacts can be achieved on the drain sides (i.e., in the portions neighboring to drain regions 3a and 3b), respectively. Therefore, the distance between the neighboring gates on the drain region side can be reduced, and consequently the cell size of the flash memory can be further reduced. By employing buffer layer 42 made of the plasma oxide film, oxygen appearing through the nitride film can be terminated by the dangling bonds of the plasma oxide film. Therefore, the flash memory can have improved reliability.

Description will now be given on a method of manufacturing the NOR-type flash memory shown in FIG. 40.

Figure 41:
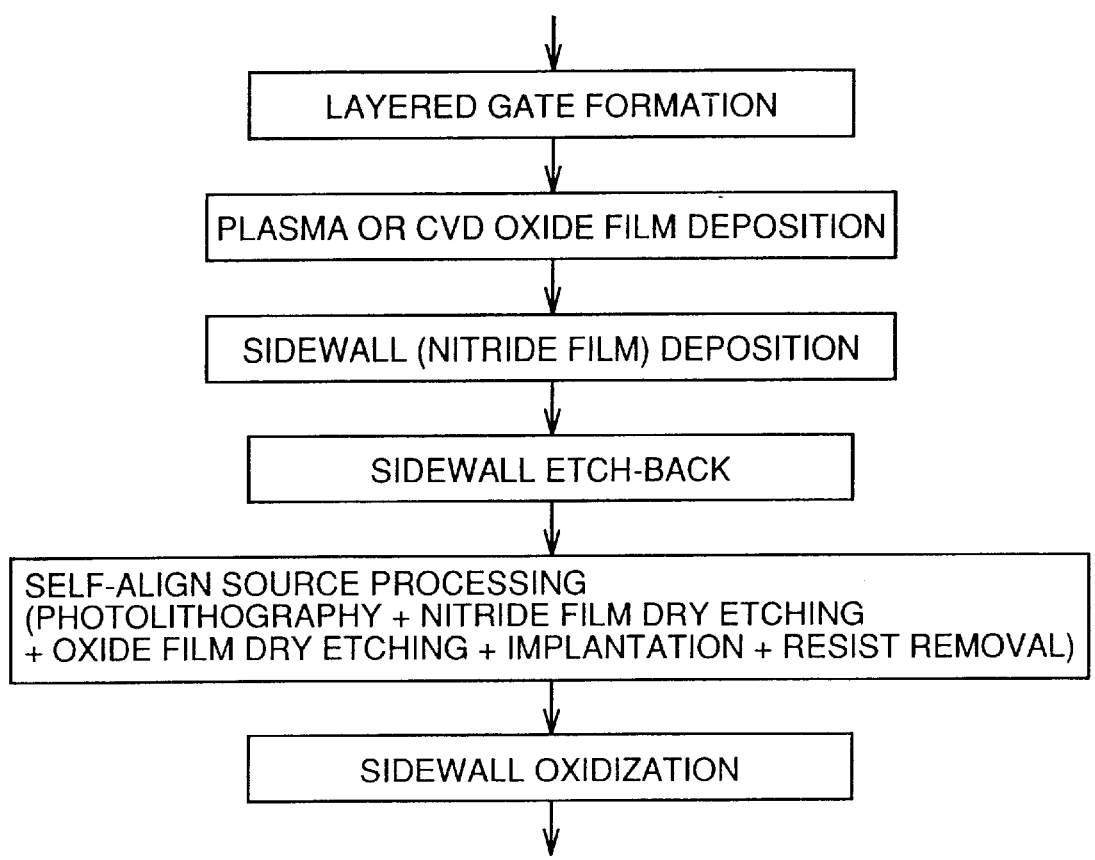
FIG. 41 shows a process flow in a method of manufacturing the flash memory according to the seventh embodiment.

FIG. 41 shows a process flow in the method of manufacturing the NOR-type flash memory shown in FIG. 40.

First, steps similar to the conventional steps for forming the structure in FIG. 68 are performed.

Figure 42:
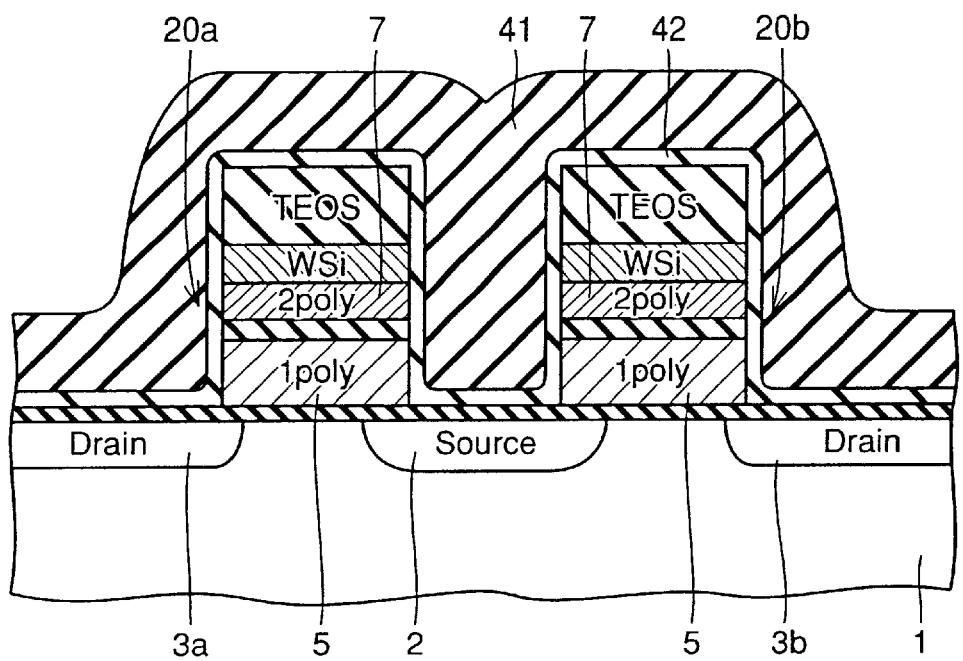
FIGS. 42–46 are cross sections of a semiconductor device in 1st to 5th steps in the method of manufacturing the flash memory according to the seventh embodiment, respectively.

Referring to FIGS. 68 and 42, buffer layer 42, which is made of the plasma oxide film or CVD oxide film, and covers first and second layered gates 20a and 20b, is formed on semiconductor substrate 1. Nitride film (SiN) 41 covering first and second layered gates 20a and 20b is formed on semiconductor substrate 1.

Figure 43:
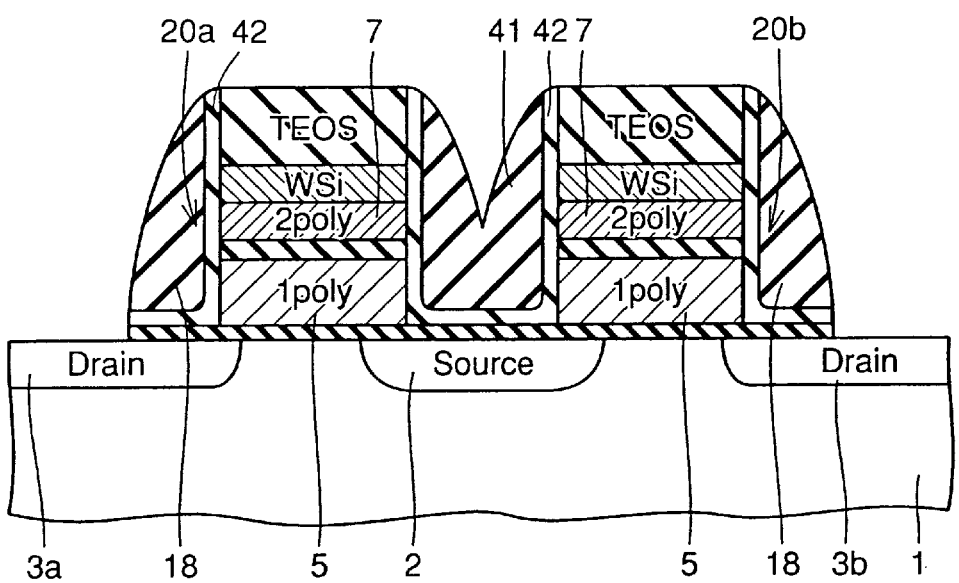

Referring to FIGS. 42 and 43, etch-back is effected on nitride film 41 to form sidewall spacers 18 made of the nitride film on the sidewalls, which are remote from each other, of first and second layered gates 20a and 20b, respectively.

Figure 44:
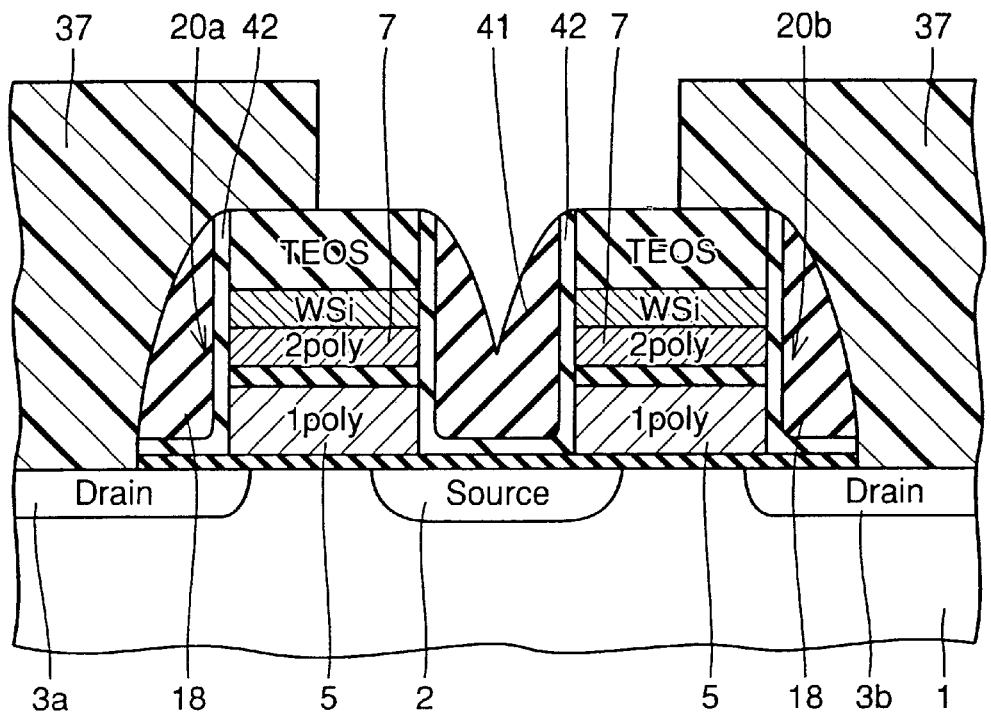

Referring to FIG. 44, photoresist pattern 37, which exposes the portion located between first and second layered gates 20a and 20b, and covers the other portion, is formed on semiconductor substrate 1 by photolithography for the self-align source step.

Figure 45:
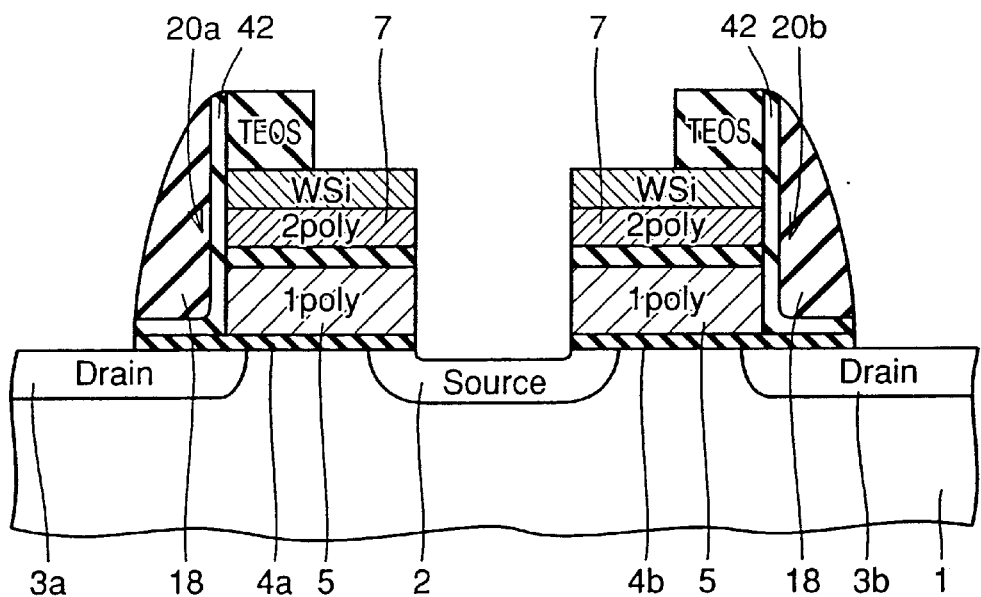

Referring to FIGS. 44 and 45, etching is effected on the structure masked with photoresist pattern 37 to remove nitride film 41 and the isolating oxide film (not shown), which are located on the source side and between first and second layered gates 20a and 20b. Then, the self-align source step is completed.

Figure 46:
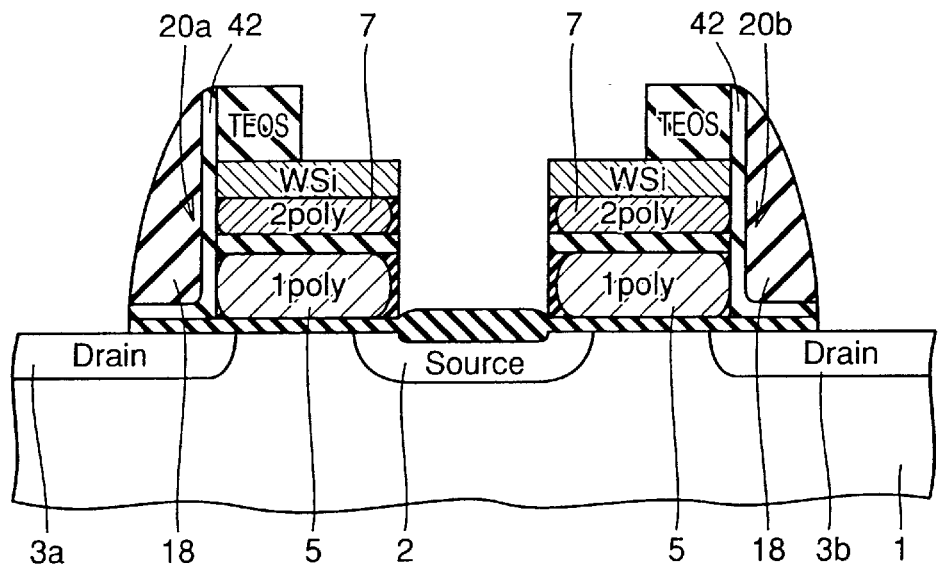

Referring to FIG. 46, processing is performed to oxidize the sidewalls of floating gate electrode 5 and control gate electrode 7 to round the sidewalls thereof.

Figure 47:
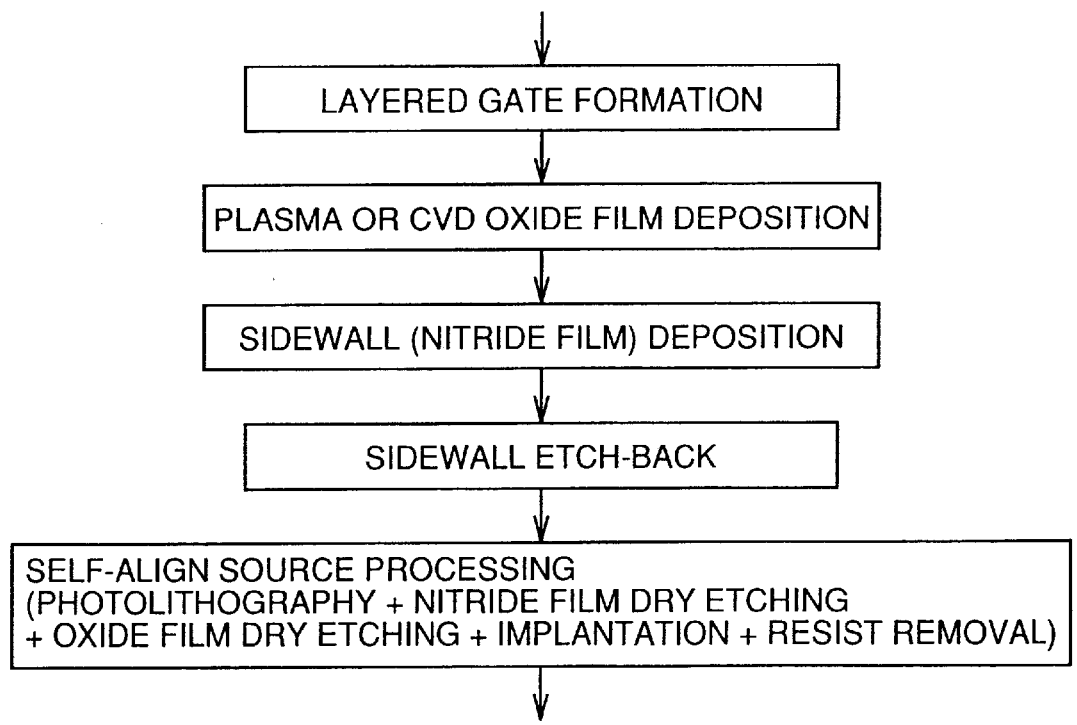
FIG. 47 shows a process flow in a method of manufacturing a flash memory according to an eighth embodiment.

On the source side, this oxidization is effected on floating gate electrode 5 and control gate electrode 7 which are exposed. On the drain side, the oxidization is effected on the sidewalls through sidewall spacers 18. Therefore, the sidewalls on the source side are oxidized to a larger extent than the sidewalls on the drain sides, and thus are rounded to a larger extent, Eighth Embodiment FIG. 47 shows a process flow in the manufacturing method according to an eighth embodiment.

First, steps similar to the conventional steps for forming the structure in FIG. 68 are performed. Thereafter, sidewalls of floating gate 5 and control gate 7 are oxidized.

Figure 48:
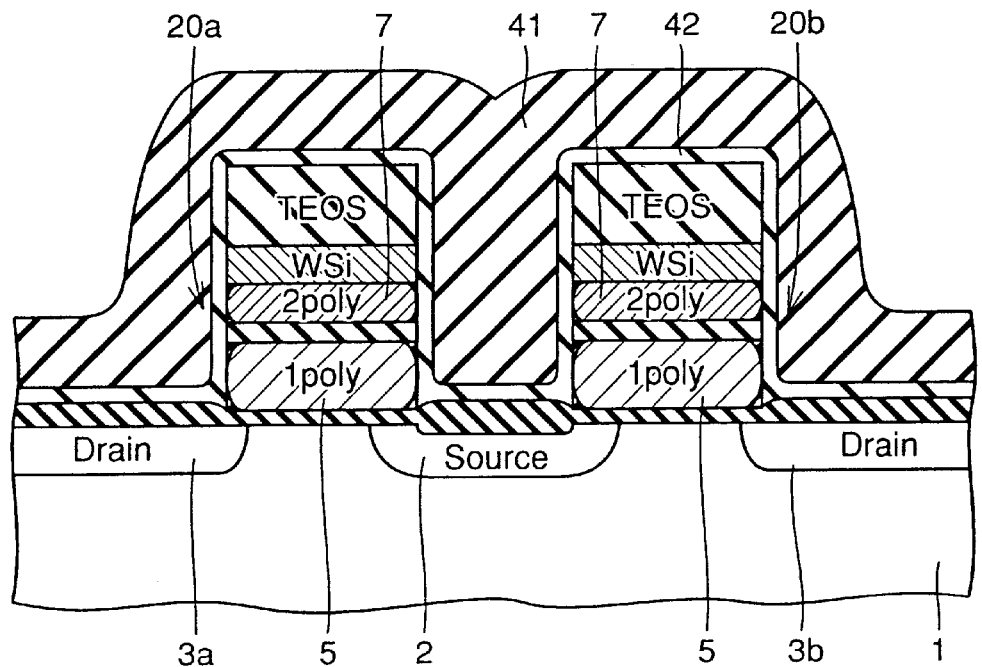
FIGS. 48–50 are cross sections of a semiconductor device in 1st to 3rd steps in the method of manufacturing the flash memory according to the eighth embodiment, respectively.

Referring to FIG. 48, processing is performed to form buffer layer 42, which is made of the plasma oxide film or CVD oxide film, and covers the sidewalls of first and second layered gates 20a and 20b. Nitride film 41 covering first and second layered gates 20a and 20b is formed on semiconductor substrate 1.

Figure 49:
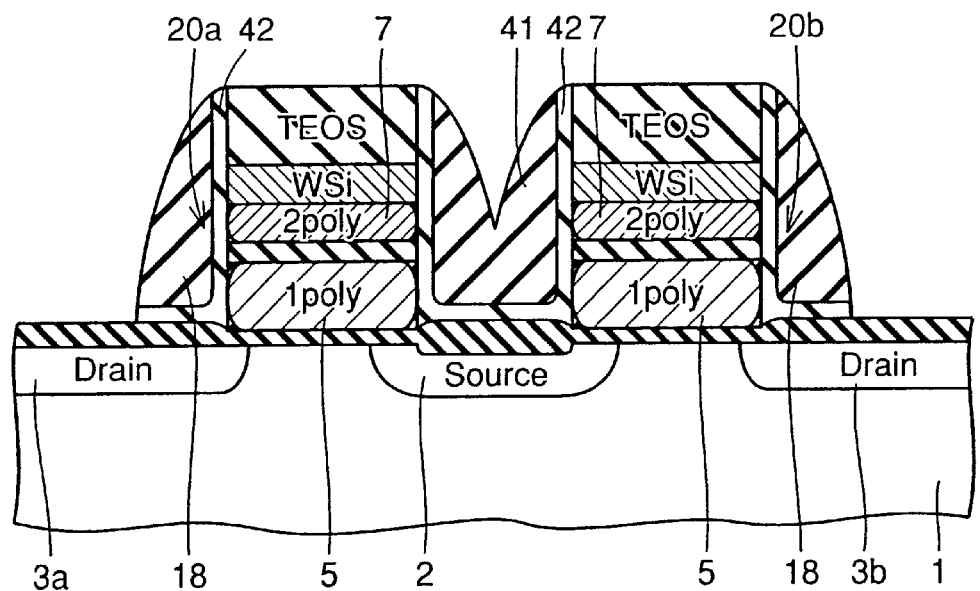

Referring to FIGS. 48 and 49, etch-back is effected on nitride film 41 to form sidewall spacers 18 made of the nitride film on the sidewalls, which are remote from each other, of first and second layered gates 20a and 20b, respectively.

Figure 50:
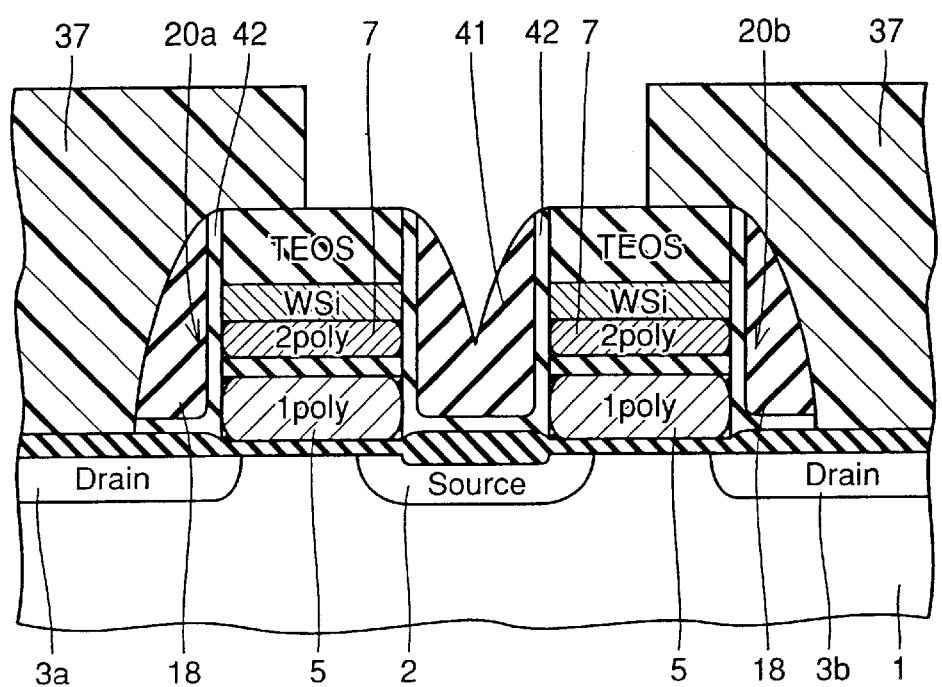

Referring to FIG. 50, photoresist pattern 37, which exposes the portion located between first and second layered gates 20a and 20b, and covers the other portion, is formed on semiconductor substrate 1 by photolithography for the self-align source step.

Etching is effected on the structure masked with photoresist pattern 37 to remove nitride film 41 and the isolating oxide film (not shown), which are located on the source side and between first and second layered gates 20a and 20b. Then, the self-align source step is completed. Then, the NOR-type flash memory shown in FIG. 40 is completed through predetermined steps.

According to an eighth embodiment, the oxidization is effected on the sidewalls of floating gate electrode 5 and control gate electrode 7 which are in the exposed state. Therefore, the sidewalls on the source side and the drain side are rounded to the same extent.

Ninth Embodiment

Figure 51:
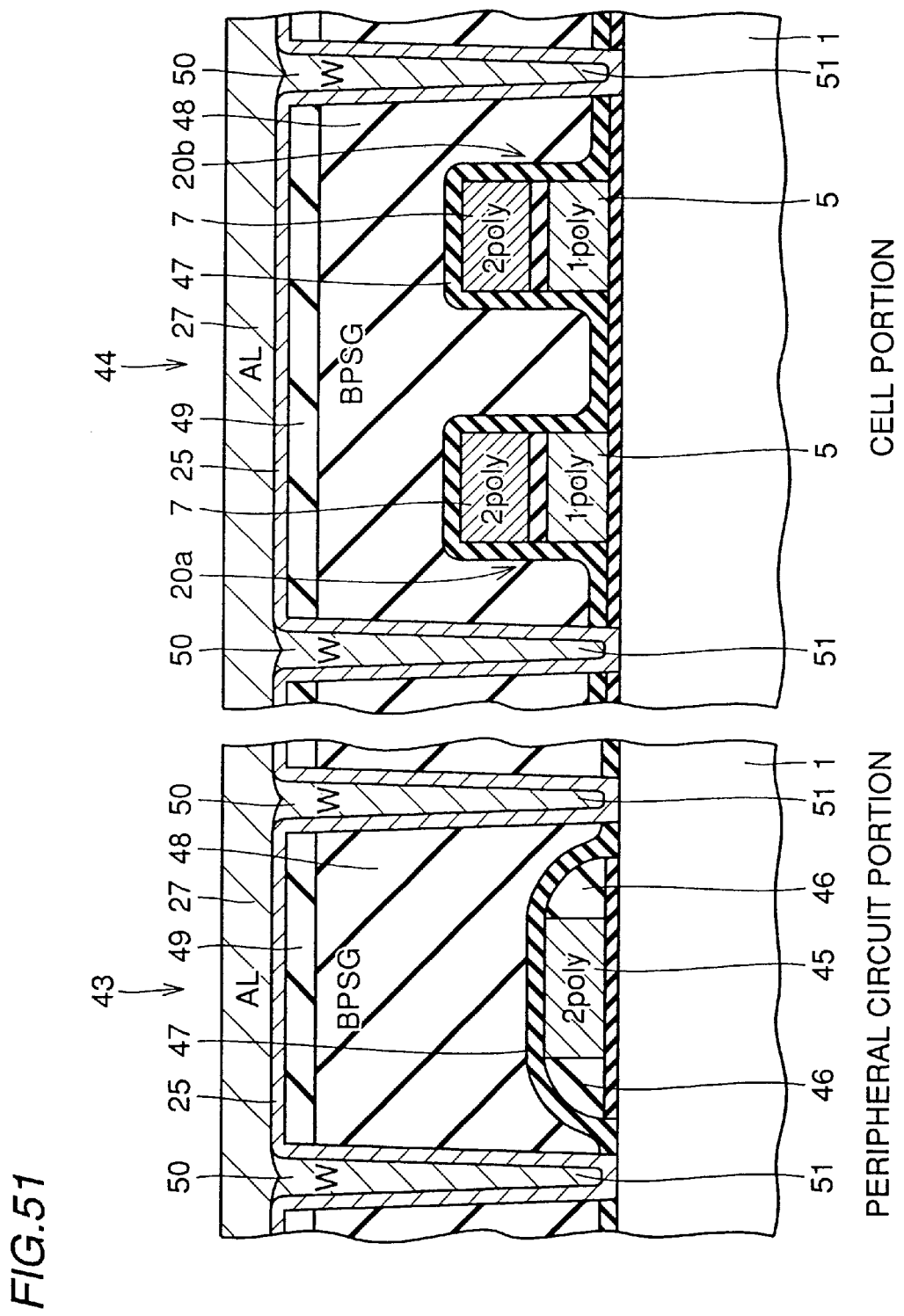
FIG. 51 is a cross section of a flash memory according to a ninth embodiment.

FIG. 51 is a cross section of a flash memory according to a ninth embodiment.

Referring to FIG. 51, a flash memory according to the ninth embodiment includes a peripheral circuit portion 43 and a cell portion 44. Peripheral circuit portion 43 has a gate electrode 45. Cell portion 44 includes first and second layered gates 20a and 20, which are spaced from each other, and each are formed of floating gate 5 and control gate 7 layered together. A thick sidewall spacer 46 is arranged on the sidewall of gate electrode 45. Sidewall spacer 46 must have a large thickness because the peripheral circuit portion must have a high breakdown voltage.

A distance between first and second layered gates 20a and 20b is smaller than double the width of sidewall spacer 46 in the peripheral circuit portion. The sidewall spacer is not formed on any one of the sidewalls of first and second layered gates 20a and 20b. A CVD-SiO$_2$ film 47 which covers gate electrode 45, first layered gate 20a and second layered gate 20b is formed on semiconductor substrate 1. An interlayer insulating film 48 made of BPSG and covering the above structure is arranged on semiconductor substrate 1. A CVD-SiO$_2$ film 49 is formed on interlayer insulating film 48. Contact holes 50 extend through CVD-SiO$_2$ film 49 and interlayer insulating film 48. A sidewall of each contact hole 50 is coated with TiN film 25. Contact hole 50 is filled with a tungsten plug 51. Aluminum interconnection 27 in contact with tungsten plug 51 is formed above semiconductor substrate 1.

According to the semiconductor device of the ninth embodiment, it is possible to suppress occurrence of the crystal defect in cell portion 44. Thereby, the cell can have good performance and reliability. Since sidewall spacer 46 having a large width is formed in peripheral circuit portion 43, the transistor can have a high breakdown voltage.

In the prior art, the gates in the cell and peripheral circuit portion are formed in the following manner. The control gate in the memory cell and the gate in the peripheral circuit portion are etched simultaneously, and then openings are formed only in the cell portion by the photolithography. Subsequently, etching for the floating gates is effected on the structure masked with the control gates and the resist so that the layered gates are formed. Thereafter, the sidewall spacers in the cell portion and the peripheral circuit portion are simultaneously formed. Alternatively, the etching for the peripheral circuit portion and the etching for the cell portion may be performed in different steps. In this case, the photolithography is used, and such a mask is used that covers completely the cell portion and allows patterning of the gates only in the peripheral circuit portion.

Using the above mask, etching is effected to form the gates in the peripheral circuit portion. Then, peripheral circuit portion is completely covered, and the photolithography is executed with a mask, which completely covers the peripheral circuit portion, and allows patterning of only the control gates in the cell portion. Thereby, the control gates and the floating gates are successively etched to complete the layered gates. According to this manner, crystal defects occur in the cell portion so that the semiconductor device cannot have sufficient performance and reliability.

The ninth embodiment has been developed for overcoming the above problems.

Figure 52:
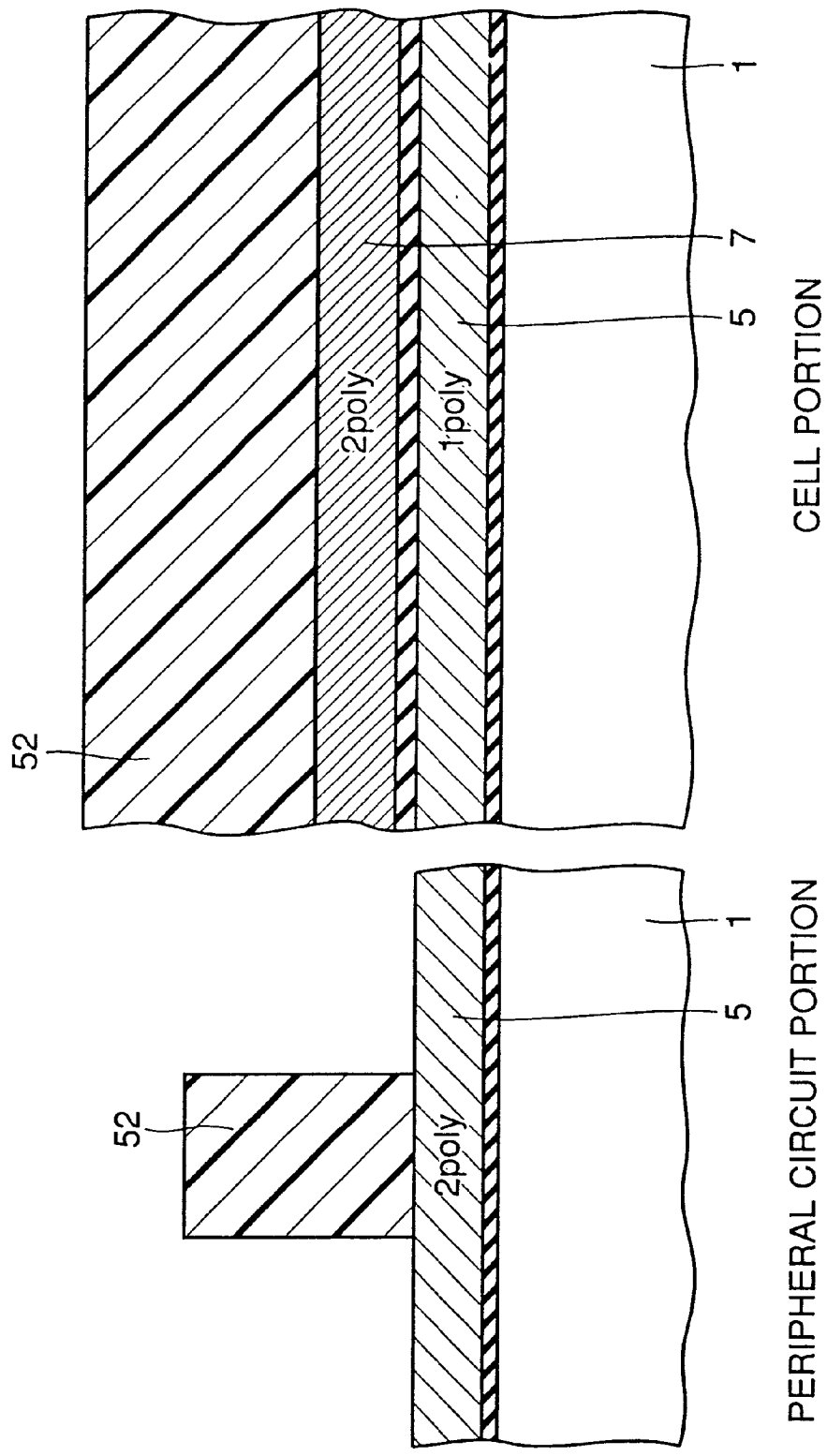
FIGS. 52–55 are cross sections of a semiconductor device in 1st to 4th steps in the method of manufacturing the flash memory according to the ninth embodiment, respectively.

Referring to FIG. 52, processing is performed to deposit polycrystalline silicon, which will form the control gates in the cell portion and the gates in the peripheral circuit portion. Thereafter, processing is performed to form a photoresist 52 on semiconductor substrate 1 by photolithography. Photoresist 52 completely covers the cell portion, and allows patterning for forming the intended gates in only the peripheral circuit portion.

Figure 53:
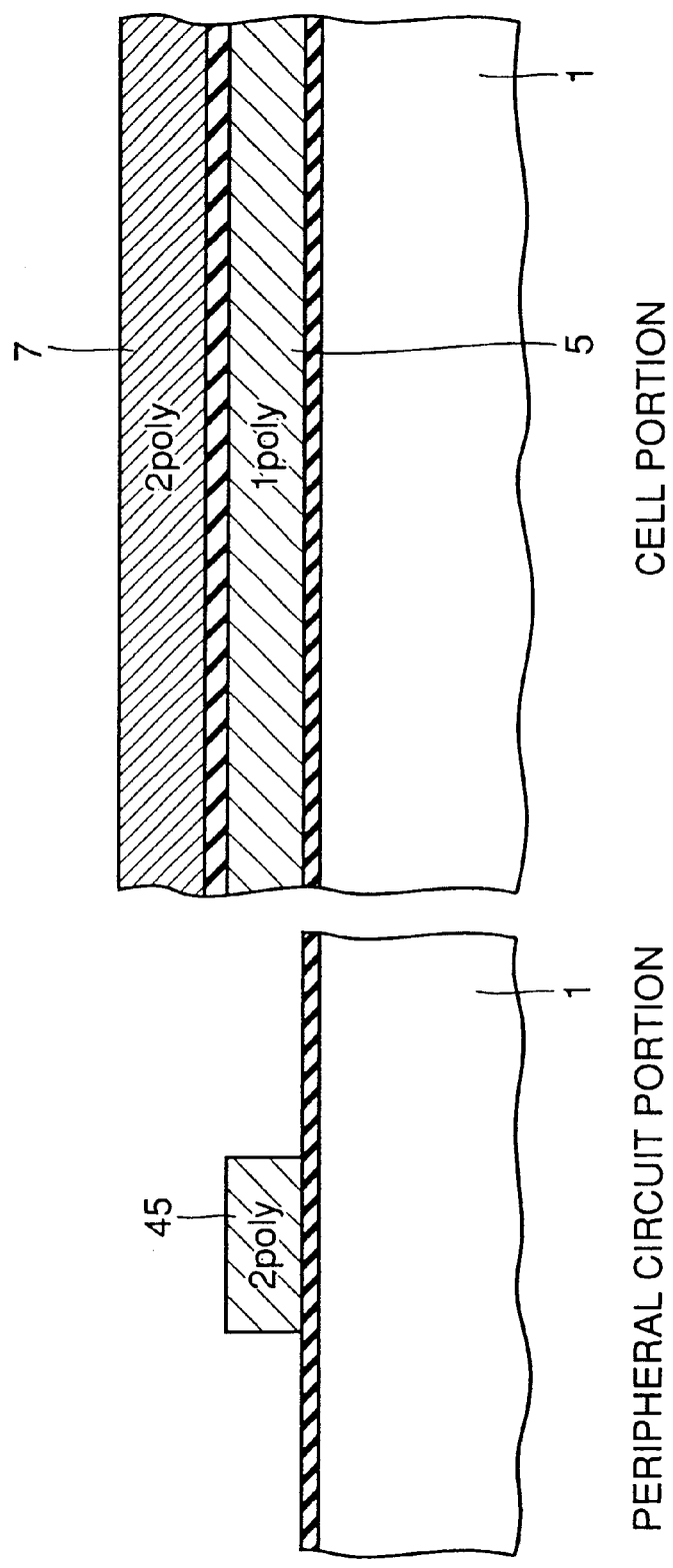

Referring to FIGS. 52 and 53, etching is performed to form gate 45 in the peripheral circuit portion using photoresist 52 as a mask.

Figure 54:
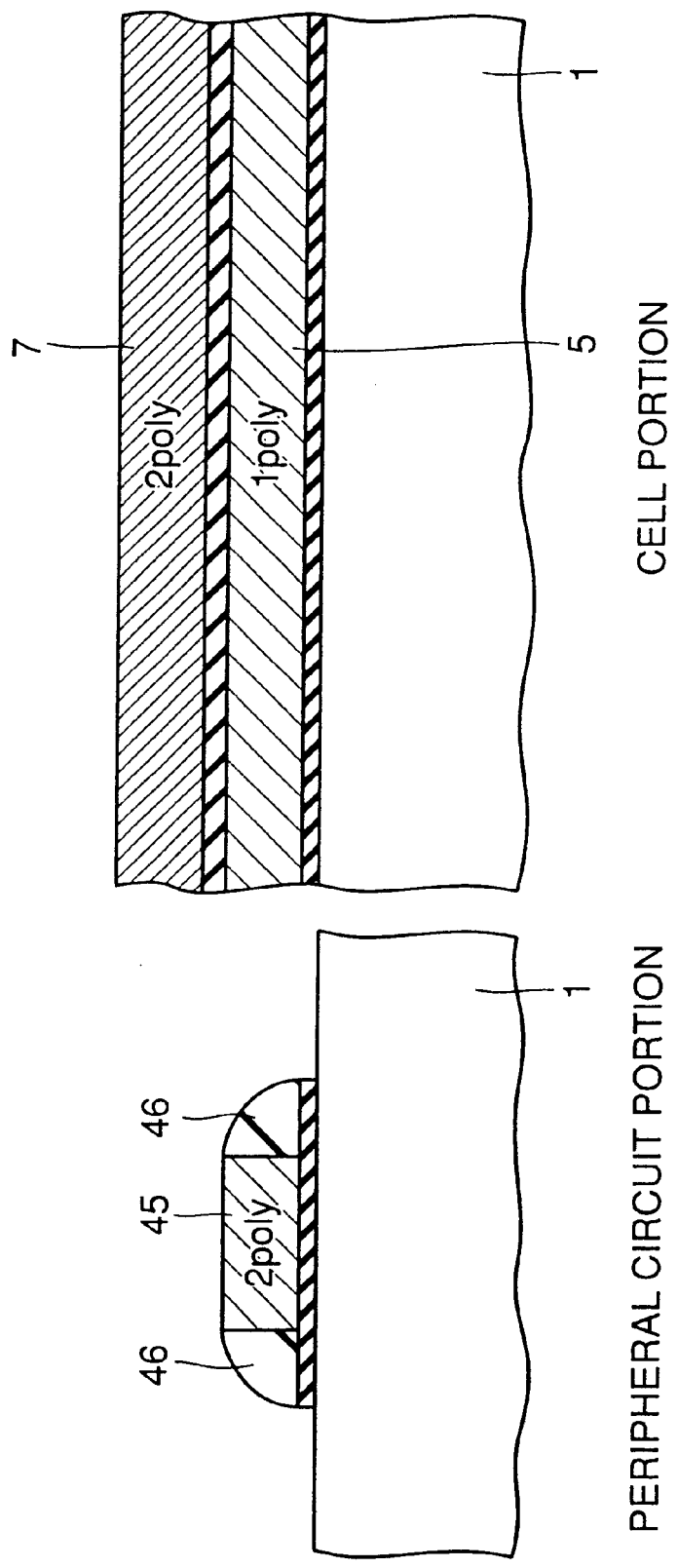

Referring to FIG. 54, a sidewall insulating film (not shown) is deposited, and etch-back is effected thereon to form sidewall spacer 46 in only the peripheral circuit portion.

Figure 55:
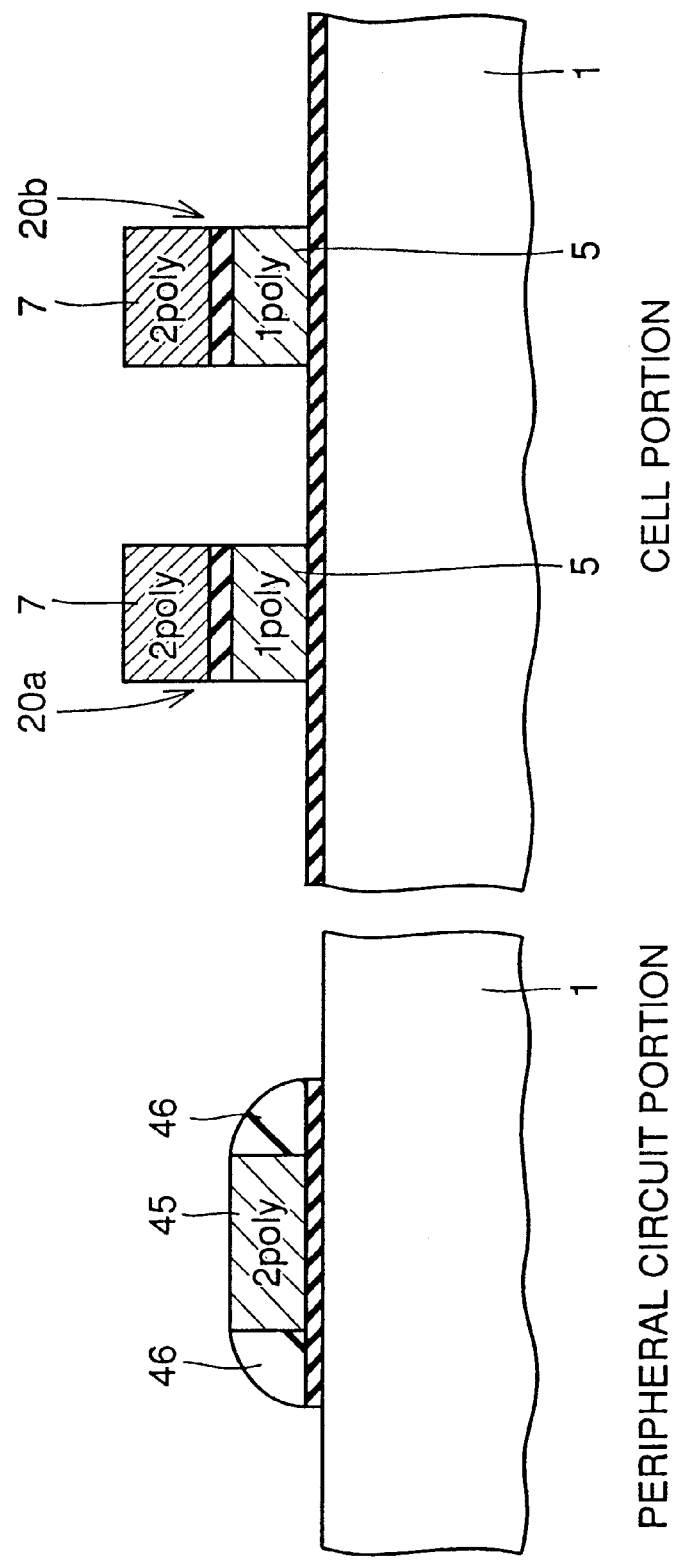

Thereafter, as shown in FIG. 55, photolithography is effected with a mask (not shown), which completely covers the peripheral circuit portion, and allows patterning for forming the intended gates only in the cell portion. Thereby, etching for control gate 7 and the etching for floating gate 5 are successively performed. Thereafter, the semiconductor device shown in FIG. 51 is completed through the predetermined steps.

Tenth Embodiment

Figure 56:
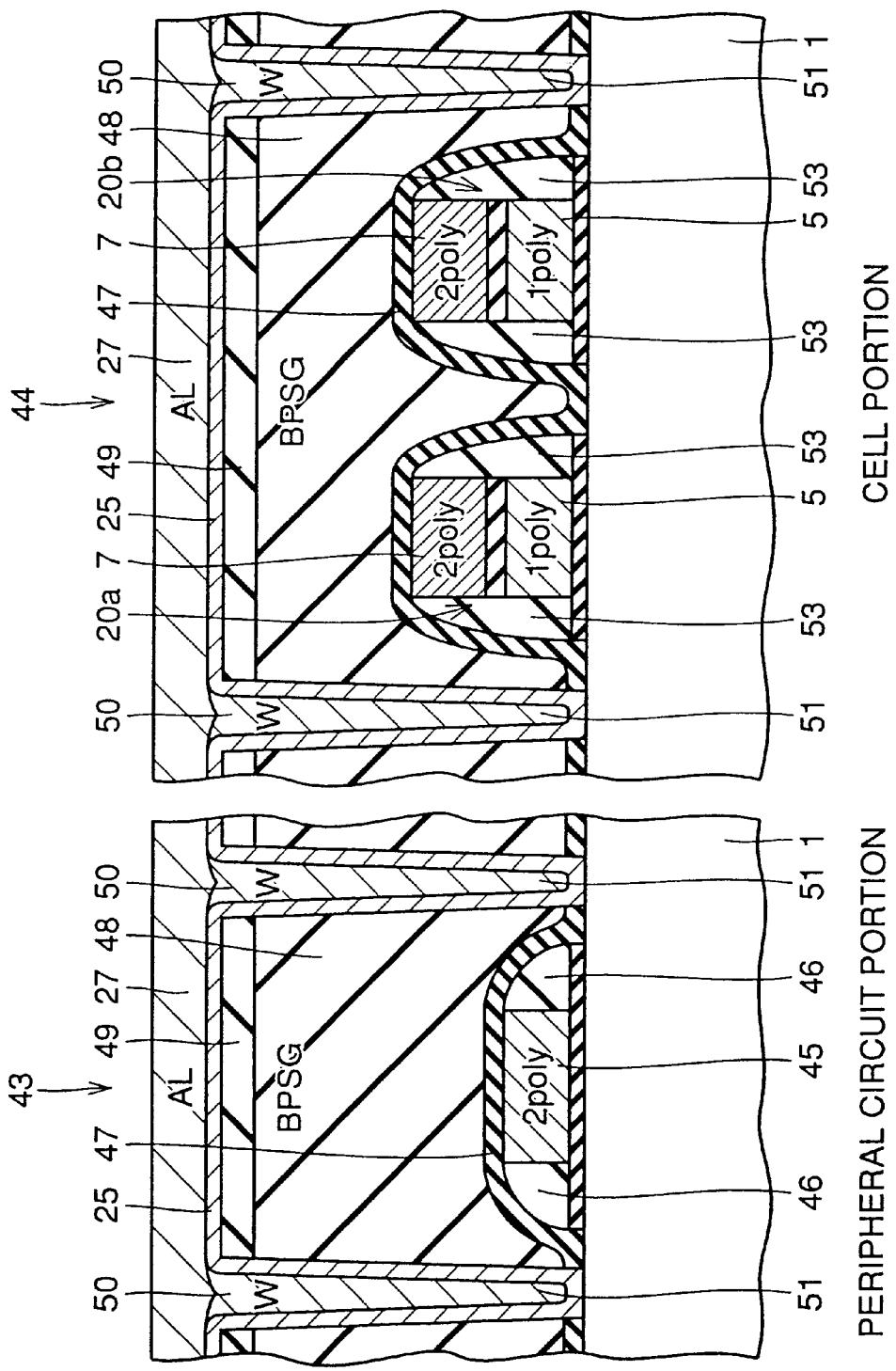
FIG. 56 is a cross section of a flash memory according to a tenth embodiment.

FIG. 56 is a cross section of a flash memory according to a tenth embodiment. The flash memory shown in FIG. 56 is the same as that shown in FIG. 51 except for the following points. The same or corresponding portions as those in FIG. 51 bear the same reference numbers, and description thereof is not repeated.

Referring to FIG. 56, the distance between first and second layered gates 20a and 20b is smaller than double the width of first sidewall spacer 46. A sidewall spacer 53 having a thickness, which is smaller than half the distance between first and second layered gates 20a and 20b, is formed on each of the sidewalls of first and second layered gates 20a and 20b.

According to the flash memory of the tenth embodiment, the crystal defect in the cell portion can be suppressed, and the cell can have good performance and reliability. Since the peripheral circuit portion is provided with sidewall spacers 46 each having a large width, the transistor can have a high breakdown voltage. Further, ion implantation in the cell portion is performed through sidewall spacer 53. Therefore, the cell can have a higher breakdown voltage and a lower parasitic resistance than the structure shown in FIG. 51.

Description will now be given on a method of manufacturing the flash memory shown in FIG. 56.

Steps similar to those shown in FIGS. 52–56 are performed.

Figure 57:
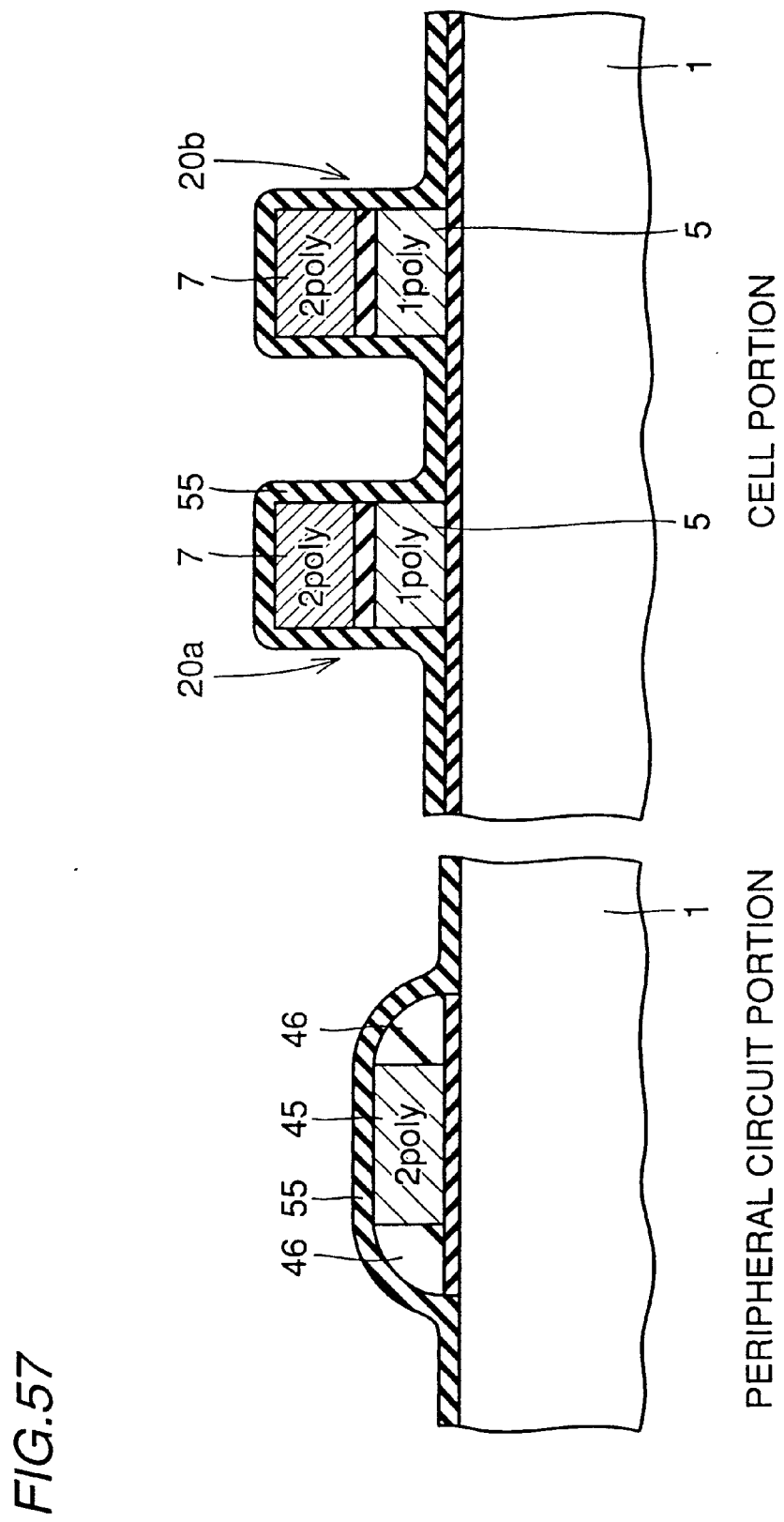
FIGS. 57 and 58 are cross sections of a semiconductor device in 1st and 2nd steps in the method of manufacturing the flash memory according to the tenth embodiment, respectively.

Referring to FIG. 57, second deposition is performed to form a sidewall insulating film 55, which is thinner than a sidewall insulating film already formed by the first deposition for forming sidewall spacer 46, and has a thickness not exceeding ½ of the minimum distance between the gates in the cell portion.

Figure 58:
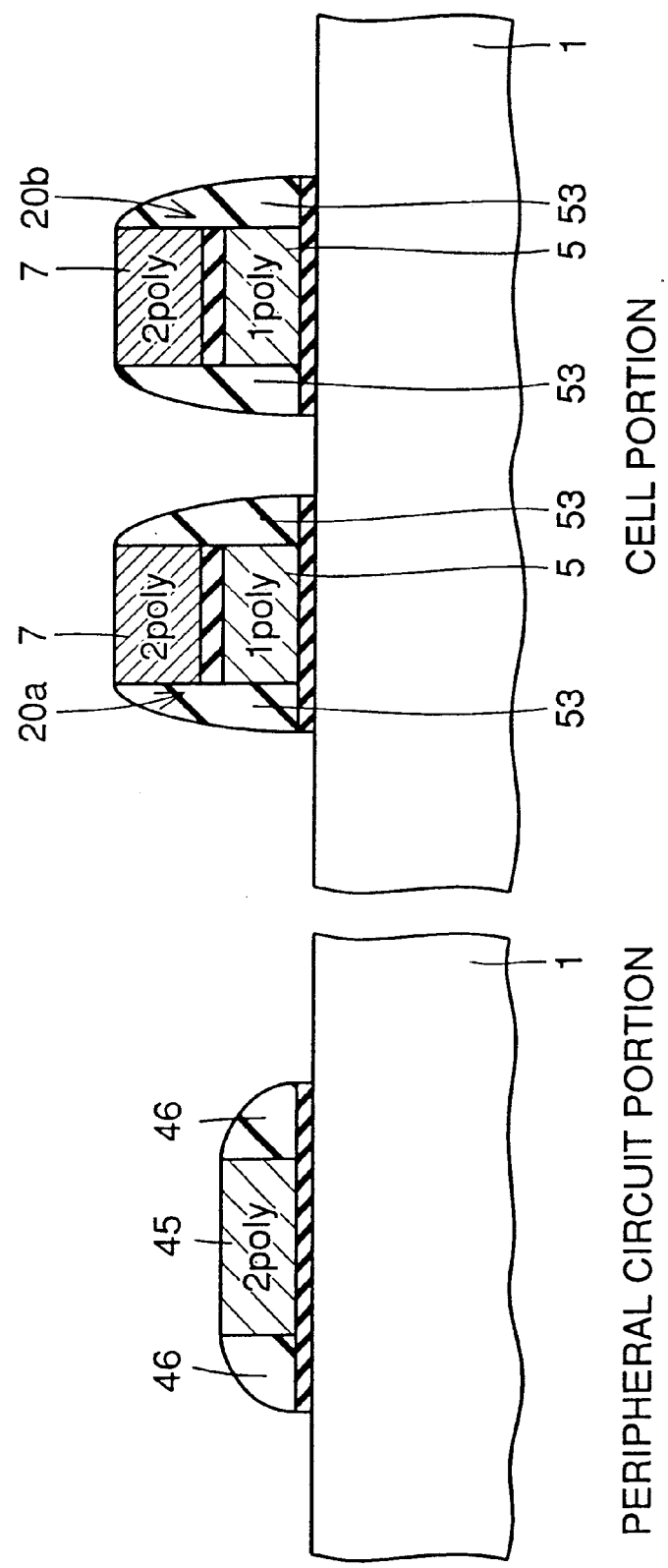
Figure 59:
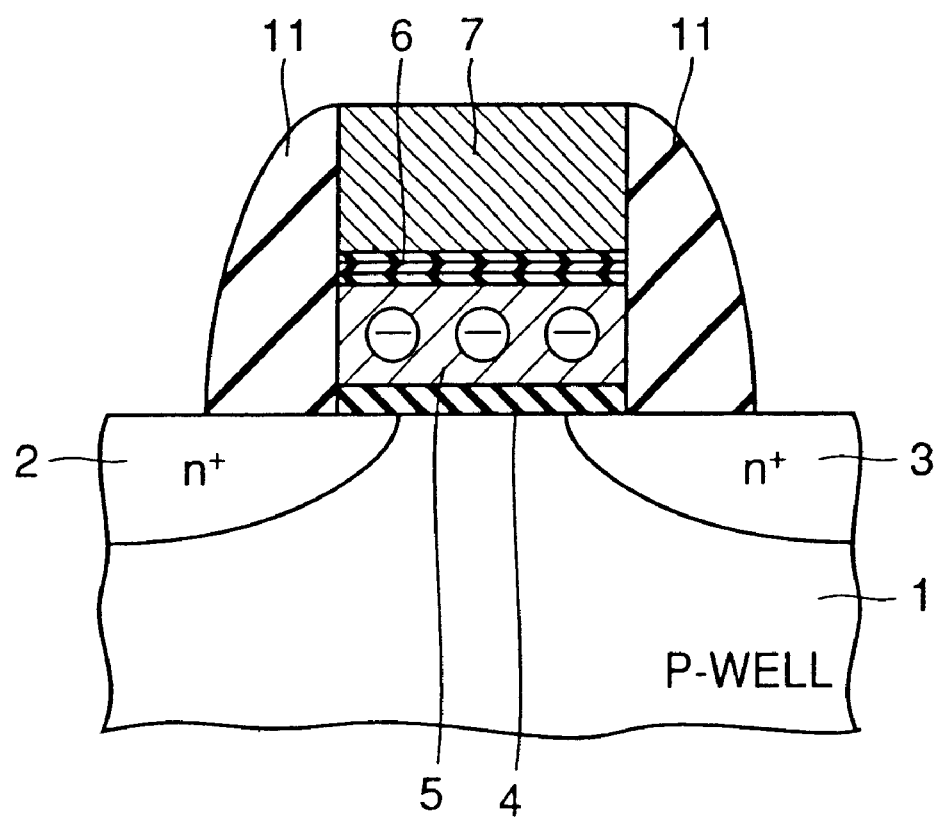
FIG. 59 is a cross section of a flash memory in the prior art.
Figure 60:
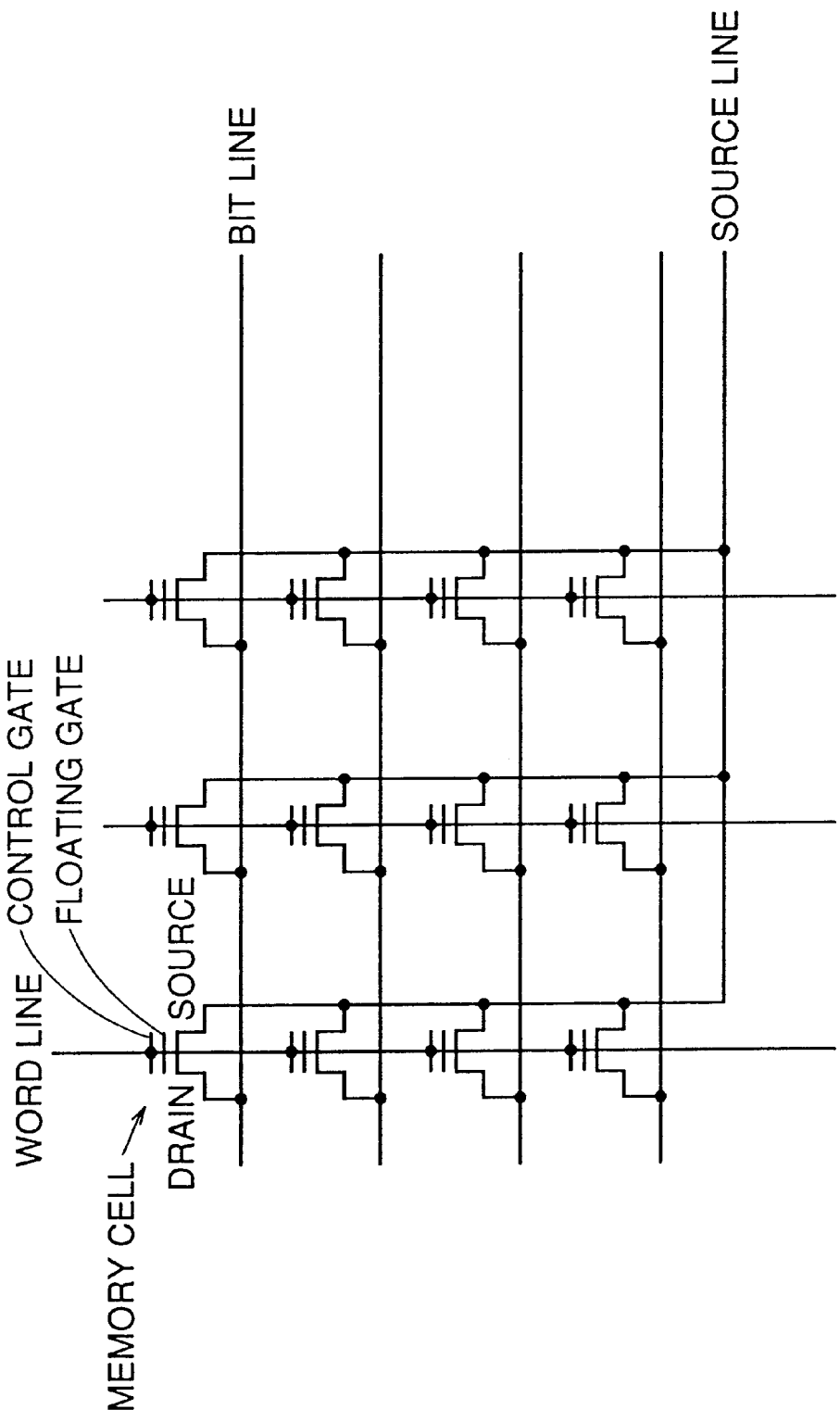
FIG. 60 shows an array structure of an NOR-type flash memory in the prior art.
Figure 61:
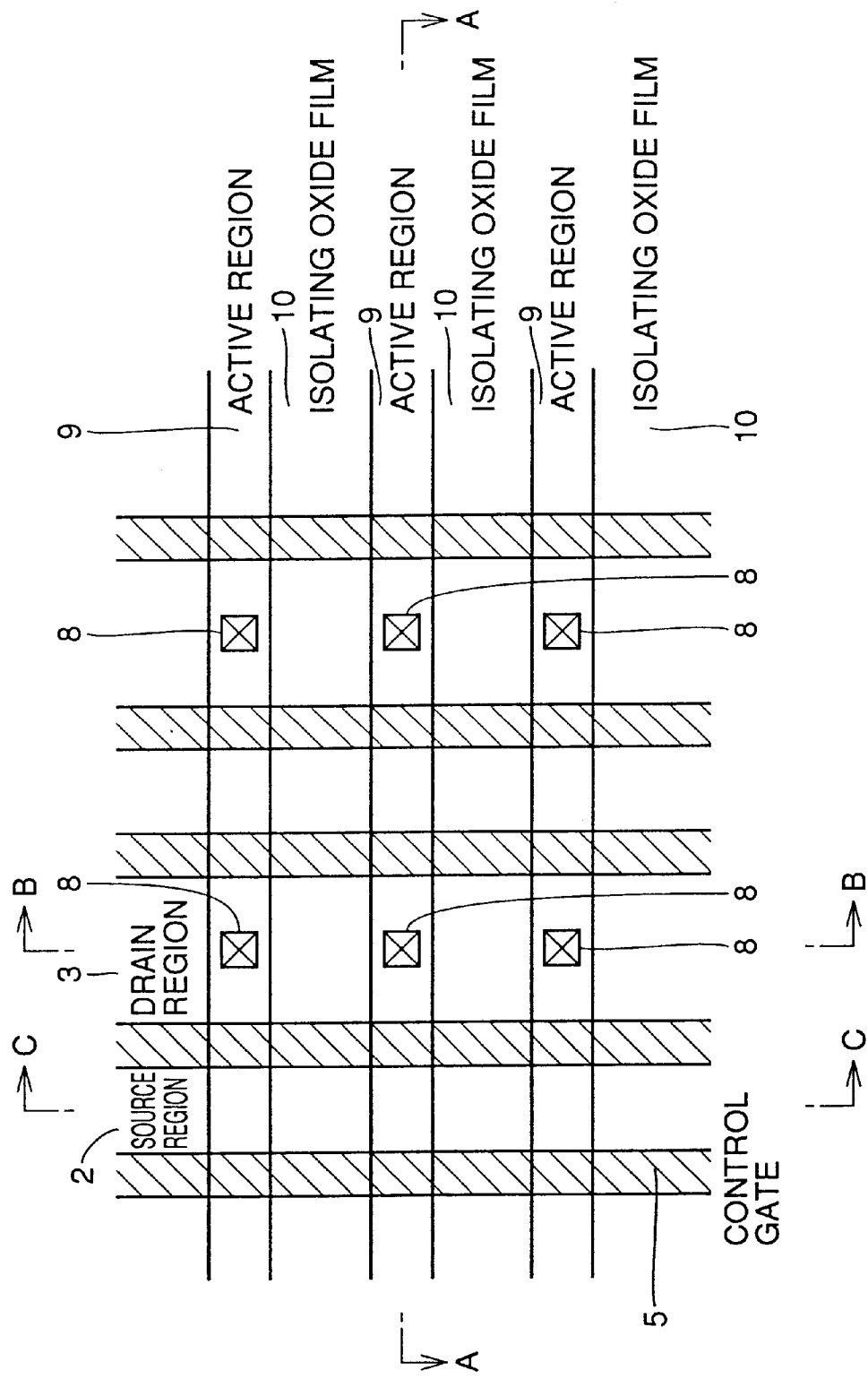
FIG. 61 shows an array layout of the NOR-type flash memory in the prior art.
Figure 62:
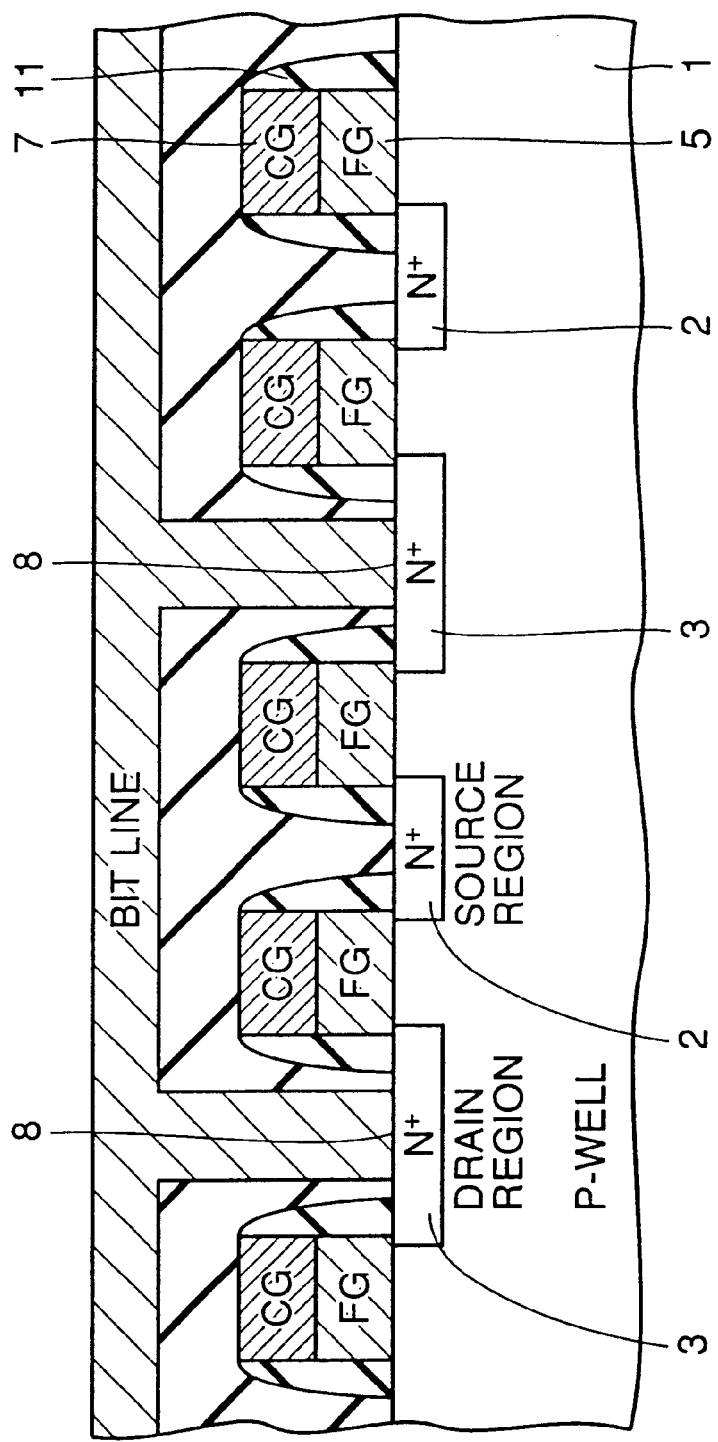
FIGS. 62–64 are cross sections taken along lines A—A, B—B and C—C in FIG. 61, respectively.
Figure 63:
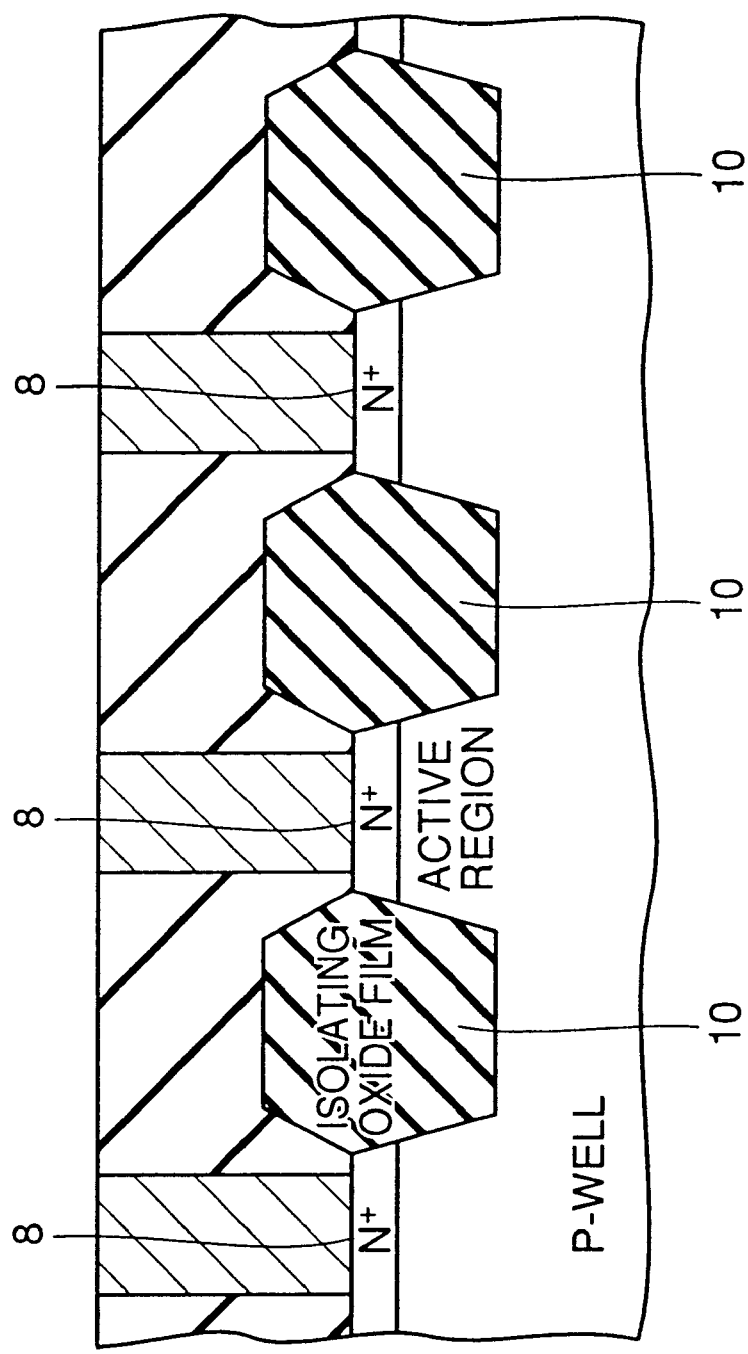

Referring to FIGS. 57 and 58, etch-back is effected on sidewall insulating film 55 so that thick sidewall spacers 46 are formed in the peripheral circuit portion, and sidewall spacers 53 having such a width that does not fill the space between the gates is formed in the cell portion. Thereafter, the flash memory shown in FIG. 56 is completed through the predetermined steps.

According to the invention, as already described, the sidewall spacers have configurations which can prevent application of a stress to the substrate. Therefore, crystal defects in the substrate can be prevented, and thus the semiconductor device can have good device characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate;
   first, second and third active regions aligned on a main surface of said semiconductor substrate; and
   first and second transistors provided on said semiconductor substrate,
   said first transistor including a first gate electrode containing polysilicon and provided between said first and second active regions, a first gate insulation film disposed between said semiconductor substrate and said first gate electrode and larger in thickness at an end thereof closer to said second active region than that closer to said first active region, and a first sidewall spacer provided on said first active region in contact with a sidewall of said first gate electrode,
   said second transistor including a second gate electrode containing polysilicon and provided between said second and third active regions parallel to said first gate electrode, a second gate insulation film disposed between said semiconductor substrate and said second gate electrode and larger in thickness at an end thereof closer to said second active regions than that closer to said third active region, and a second sidewall spacer provided on said third active region in contact with a sidewall of said second gate electrode,
   said second active region existing between said first and second gate electrodes.

2. The semiconductor device of claim 1, wherein a gate electrode of a different layer is stacked on each of said first and second gate electrodes.

3. The semiconductor device of claim 1, wherein said sidewall spacer is formed of nitride film.

4. The semiconductor device according to claim 3, wherein
   said sidewall spacer made of the nitride film is formed on a sidewall of each of said first and second gate electrodes with a buffer layer therebetween, and
   said sidewall spacer made of the nitride film is arranged on said semiconductor substrate with a buffer layer therebetween.

5. A semiconductor device comprising:
   a semiconductor substrate;
   first, second and third active regions aligned on a main surface of said semiconductor substrate; and
   first and second transistors provided on said semiconductor substrate,
   said first transistor including a first gate electrode containing polysilicon and provided between said first and second active regions, a first gate insulation film disposed between said semiconductor substrate and said first gate electrode, a first sidewall spacer provided on said first active region in contact with a sidewall of said first gate electrode, and an insulation film disposed between said semiconductor substrate and said first sidewall spacer and larger in thickness than said first gate insulation film, said second transistor including a second gate electrode containing polysilicon and provided between said second and third active regions parallel to said first gate electrode, a second gate insulation film disposed between said semiconductor substrate and said second gate electrode, a second sidewall spacer provided on said third active region in contact with a sidewall of said second gate electrode, and an insulation film disposed between said semiconductor substrate and said second sidewall spacer and larger in thickness than said second gate insulation film, said second active region existing between said first and second gate electrodes.

6. The semiconductor device of claim 5, wherein a gate electrode of a different layer is stacked on each of said first and second gate electrodes.

7. The semiconductor device according to claim 1, further comprising:

a peripheral circuit portion having a gate electrode;

a cell portion having first and second layered gates spaced from each other, and each formed of a floating gate and a control gate layered together; and a first sidewall spacer arranged on a sidewall of said gate electrode, wherein
- a distance between said first and second layered gates is smaller than double the width of the first sidewall spacer, and
- a second sidewall spacer having a thickness smaller than half the distance between said first and second layered gates is formed on sidewalls of said first and second layered gates.

8. A semiconductor device comprising:

a semiconductor substrate;

first, second and third active regions aligned on a main surface of said semiconductor substrate;

first and second transistors provided on said semiconductor substrate, said first transistor including a first gate electrode containing polysilicon and provided between said first and second active regions, a first gate insulation film disposed between said semiconductor substrate and said first gate electrode, a first sidewall spacer provided on said first active region in contact with a sidewall of said first gate electrode, and a second sidewall spacer provided on said second active region in contact with a sidewall of said first gate electrode, said second transistor including a second gate electrode containing polysilicon and provided between said second and third active regions parallel to said first gate electrode, a second gate insulation film disposed between said semiconductor substrate and said second gate electrode, a third sidewall spacer provided on said third active region in contact with a sidewall of said second gate electrode, and a fourth sidewall spacer provided on said second active region in contact with a sidewall of said second gate electrode;

an insulation film provided on said second active region between said second and fourth sidewall spacers, said second active region existing between said first and second gate electrodes; and a thermal oxide layer extending between the main surface of the substrate and the insulating film provided on said second active region and between the main surface of the substrate and the second and fourth sidewall spacers.

* * * * *